(12) United States Patent
Ni Chleirigh et al.

(10) Patent No.: US 9,134,552 B2
(45) Date of Patent: Sep. 15, 2015

(54) DISPLAY APPARATUS WITH NARROW GAP ELECTROSTATIC ACTUATORS

(71) Applicant: Pixtronix, Inc., San Diego, CA (US)

(72) Inventors: Cait Ni Chleirigh, Arlington, MA (US); Mark B. Andersson, Northborough, MA (US); Tyler Dunn, North Reading, MA (US); Joyce H. Wu, Somerville, MA (US)

(73) Assignee: Pixtronix, Inc., San Diego, CA (US)

( * ) Notice: Subject to any disclaimer, the term of this patent is extended or adjusted under 35 U.S.C. 154(b) by 152 days.

(21) Appl. No.: 13/800,151

(22) Filed: Mar. 13, 2013

(65) Prior Publication Data
US 2014/0268293 A1 Sep. 18, 2014

(51) Int. Cl.
*G02B 26/00* (2006.01)
*G02F 1/29* (2006.01)
(Continued)

(52) U.S. Cl.
CPC ............ *G02F 1/0128* (2013.01); *B81B 3/0056* (2013.01); *B81B 3/0072* (2013.01); *G02B 26/023* (2013.01); *G09G 3/3433* (2013.01); *H02N 1/006* (2013.01); *B81B 2203/051* (2013.01); *G02B 26/00* (2013.01); *G02B 26/001* (2013.01); *G02B 26/007* (2013.01); *G02B 26/02* (2013.01); *G02B 26/0833* (2013.01); *G02B 26/0841* (2013.01); *G02B 27/0068* (2013.01);
(Continued)

(58) Field of Classification Search
CPC .. G02B 26/0833; G02B 26/02; G02B 26/023; G02B 26/001; G02B 26/00; G02B 26/007; G02B 26/0841; G02B 27/0068; G09G 3/3466; G09G 2300/0473; G09G 2300/0426; G09G 3/3433; G09G 2300/0469
USPC ........... 359/223.1–224.2, 230, 290–295, 298, 359/233.1; 345/85, 108
See application file for complete search history.

(56) References Cited

U.S. PATENT DOCUMENTS 3,864,582 A 2/1975 Keeler
4,067,043 A 1/1978 Perry
(Continued)

FOREIGN PATENT DOCUMENTS

CA 2241823 A1 8/1997
CA 2334403 A1 12/1999
(Continued)

OTHER PUBLICATIONS

Boer W.D., "AMLCD Electronics", Active Matrix Liquid Crystal Displays: Fundamentals and Applications, 2005 pp. 87-111, XP055089329, U.S.A, ISBN: 978-0-75-067813-1.
(Continued)

*Primary Examiner* — Evelyn A Lester
(74) *Attorney, Agent, or Firm* — Edward A. Gordon; Foley & Lardner LLP

(57) ABSTRACT

This disclosure provides systems, methods and apparatus for incorporating tip-gap adjustment features (TGAF) in actuators of shutter assemblies. The TGAF are incorporated into a drive beam of the actuator during the formation of the shutter assembly over a mold. The TGAF are configured such that they develop a mechanical stress or stress gradient. When the shutter assembly is released from the mold, the stress or stress gradient in the TGAF bend the drive beam such that a tip-gap between the drive beam and a load beam of the actuator is reduced. The reduced tip-gap, in turn, reduces an actuation voltage needed to actuate the shutter assembly.

14 Claims, 28 Drawing Sheets

(51) Int. Cl.
  *G09G 3/34* (2006.01)
  *G02F 1/01* (2006.01)
  *H02N 1/00* (2006.01)
  *B81B 3/00* (2006.01)
  *G02B 26/08* (2006.01)
  *G02B 27/00* (2006.01)
  *G02B 26/02* (2006.01)

(52) U.S. Cl.
  CPC ...... *G09G 3/3466* (2013.01); *G09G 2300/0469* (2013.01); *G09G 2300/0473* (2013.01); *G09G 2300/08* (2013.01)

(56) References Cited

U.S. PATENT DOCUMENTS

| | | |
|---|---|---|
| 4,074,253 A | 2/1978 | Nadir |
| 4,421,381 A | 12/1983 | Ueda et al. |
| 4,559,535 A | 12/1985 | Watkins et al. |
| 4,563,836 A | 1/1986 | Woodruff et al. |
| 4,564,836 A | 1/1986 | Vuilleumier et al. |
| 4,582,396 A | 4/1986 | Bos et al. |
| 4,673,253 A | 6/1987 | Tanabe et al. |
| 4,728,936 A | 3/1988 | Guscott et al. |
| 4,744,640 A | 5/1988 | Phillips |
| 4,889,603 A | 12/1989 | DiSanto et al. |
| 4,958,911 A | 9/1990 | Beiswenger et al. |
| 4,991,941 A | 2/1991 | Kalmanash |
| 5,005,108 A | 4/1991 | Pristash et al. |
| 5,025,346 A | 6/1991 | Tang et al. |
| 5,025,356 A | 6/1991 | Gawad |
| 5,042,900 A | 8/1991 | Parker |
| 5,044,734 A | 9/1991 | Sperl et al. |
| 5,050,946 A | 9/1991 | Hathaway et al. |
| 5,061,049 A | 10/1991 | Hornbeck |
| 5,062,689 A | 11/1991 | Koehler |
| 5,078,479 A | 1/1992 | Vuilleumier |
| 5,093,652 A | 3/1992 | Bull et al. |
| 5,096,279 A | 3/1992 | Hornbeck et al. |
| 5,128,787 A | 7/1992 | Blonder |
| 5,136,480 A | 8/1992 | Pristash et al. |
| 5,136,751 A | 8/1992 | Coyne et al. |
| 5,142,405 A | 8/1992 | Hornbeck |
| 5,184,248 A | 2/1993 | De Vaan et al. |
| 5,184,428 A | 2/1993 | Feldt et al. |
| 5,198,730 A | 3/1993 | Vancil |
| 5,202,950 A | 4/1993 | Arego et al. |
| 5,233,385 A | 8/1993 | Sampsell |
| 5,233,459 A | 8/1993 | Bozler et al. |
| 5,245,454 A | 9/1993 | Blonder |
| 5,266,612 A | 11/1993 | Kim et al. |
| 5,278,652 A | 1/1994 | Urbanus et al. |
| 5,280,277 A | 1/1994 | Hornbeck |
| 5,319,061 A | 6/1994 | Ramaswamy |
| 5,319,491 A | 6/1994 | Selbrede |
| 5,339,116 A | 8/1994 | Urbanus et al. |
| 5,339,179 A | 8/1994 | Rudisill et al. |
| 5,359,345 A | 10/1994 | Hunter |
| 5,379,135 A | 1/1995 | Nakagaki et al. |
| 5,393,710 A | 2/1995 | Park et al. |
| 5,396,350 A | 3/1995 | Beeson et al. |
| 5,405,490 A | 4/1995 | Park et al. |
| 5,416,631 A | 5/1995 | Yagi |
| 5,440,197 A | 8/1995 | Gleckman |
| 5,452,024 A | 9/1995 | Sampsell |
| 5,461,411 A | 10/1995 | Florence et al. |
| 5,465,175 A | 11/1995 | Woodgate et al. |
| 5,467,104 A | 11/1995 | Furness, III et al. |
| 5,477,086 A | 12/1995 | Rostoker et al. |
| 5,479,279 A | 12/1995 | Barbier et al. |
| 5,491,347 A | 2/1996 | Allen et al. |
| 5,493,439 A | 2/1996 | Engle |
| 5,497,172 A | 3/1996 | Doherty et al. |
| 5,497,258 A | 3/1996 | Ju et al. |
| 5,499,127 A | 3/1996 | Tsubota et al. |
| 5,504,389 A | 4/1996 | Dickey |
| 5,504,614 A | 4/1996 | Webb et al. |
| 5,510,824 A | 4/1996 | Nelson |
| 5,517,341 A | 5/1996 | Kim et al. |
| 5,517,347 A | 5/1996 | Sampsell |
| 5,519,240 A | 5/1996 | Suzuki |
| 5,519,565 A | 5/1996 | Kalt et al. |
| 5,523,803 A | 6/1996 | Urbanus et al. |
| 5,526,051 A | 6/1996 | Gove et al. |
| 5,528,262 A | 6/1996 | McDowall et al. |
| 5,548,301 A | 8/1996 | Kornher et al. |
| 5,548,670 A | 8/1996 | Koike |
| 5,552,925 A | 9/1996 | Worley |
| 5,559,389 A | 9/1996 | Spindt et al. |
| 5,568,964 A | 10/1996 | Parker et al. |
| 5,578,185 A | 11/1996 | Bergeron et al. |
| 5,579,035 A | 11/1996 | Beiswenger |
| 5,579,240 A | 11/1996 | Buus |
| 5,591,049 A | 1/1997 | Dohnishi |
| 5,596,339 A | 1/1997 | Furness, III et al. |
| 5,596,369 A | 1/1997 | Chau |
| 5,613,751 A | 3/1997 | Parker et al. |
| 5,618,096 A | 4/1997 | Parker et al. |
| 5,619,266 A | 4/1997 | Tomita et al. |
| 5,622,612 A | 4/1997 | Mihara et al. |
| 5,629,784 A | 5/1997 | Abileah et al. |
| 5,629,787 A | 5/1997 | Tsubota et al. |
| 5,655,832 A | 8/1997 | Pelka et al. |
| 5,655,838 A | 8/1997 | Ridley et al. |
| 5,659,327 A | 8/1997 | Furness, III |
| 5,663,917 A | 9/1997 | Oka et al. |
| 5,666,226 A | 9/1997 | Ezra et al. |
| 5,677,749 A | 10/1997 | Tsubota et al. |
| 5,684,354 A | 11/1997 | Gleckman |
| 5,687,465 A | 11/1997 | Hinata et al. |
| 5,691,695 A | 11/1997 | Lahiff |
| 5,694,227 A | 12/1997 | Starkweather |
| 5,724,062 A | 3/1998 | Hunter |
| 5,731,802 A | 3/1998 | Aras et al. |
| 5,745,193 A | 4/1998 | Urbanus et al. |
| 5,745,203 A | 4/1998 | Valliath et al. |
| 5,745,281 A | 4/1998 | Yi et al. |
| 5,745,284 A | 4/1998 | Goldberg et al. |
| 5,771,321 A | 6/1998 | Stern |
| 5,781,331 A | 7/1998 | Carr et al. |
| 5,781,333 A | 7/1998 | Lanzillotta et al. |
| 5,784,189 A | 7/1998 | Bozler et al. |
| 5,794,761 A | 8/1998 | Renaud et al. |
| 5,798,746 A | 8/1998 | Koyama |
| 5,801,792 A | 9/1998 | Smith et al. |
| 5,808,800 A | 9/1998 | Handschy et al. |
| 5,810,469 A | 9/1998 | Weinreich |
| 5,815,134 A | 9/1998 | Nishi |
| 5,835,255 A | 11/1998 | Miles |
| 5,835,256 A | 11/1998 | Huibers |
| 5,854,872 A | 12/1998 | Tai |
| 5,867,302 A | 2/1999 | Fleming |
| 5,876,107 A | 3/1999 | Parker et al. |
| 5,884,872 A | 3/1999 | Greenhalgh |
| 5,889,625 A | 3/1999 | Chen et al. |
| 5,894,686 A | 4/1999 | Parker et al. |
| 5,895,115 A | 4/1999 | Parker et al. |
| 5,917,692 A | 6/1999 | Schmitz et al. |
| 5,921,652 A | 7/1999 | Parker et al. |
| 5,923,480 A | 7/1999 | Labeye |
| 5,926,591 A | 7/1999 | Labeye et al. |
| 5,936,596 A | 8/1999 | Yoshida et al. |
| 5,943,223 A | 8/1999 | Pond |
| 5,953,469 A | 9/1999 | Zhou |
| 5,959,763 A | 9/1999 | Bozler et al. |
| 5,963,367 A | 10/1999 | Aksyuk et al. |
| 5,973,727 A | 10/1999 | McGrew et al. |
| 5,975,711 A | 11/1999 | Parker et al. |
| 5,986,628 A | 11/1999 | Tuenge et al. |
| 5,986,796 A | 11/1999 | Miles |
| 5,986,828 A | 11/1999 | Wood et al. |
| 5,990,990 A | 11/1999 | Crabtree |
| 5,994,204 A | 11/1999 | Young et al. |
| 5,995,688 A | 11/1999 | Aksyuk et al. |

(56) References Cited

U.S. PATENT DOCUMENTS

| | | |
|---|---|---|
| 6,008,781 A | 12/1999 | Furness, III |
| 6,008,929 A | 12/1999 | Akimoto et al. |
| 6,028,656 A | 2/2000 | Buhrer et al. |
| 6,030,089 A | 2/2000 | Parker et al. |
| 6,034,807 A | 3/2000 | Little et al. |
| 6,040,796 A | 3/2000 | Matsugatani et al. |
| 6,040,937 A | 3/2000 | Miles |
| 6,046,836 A | 4/2000 | Tuchman |
| 6,046,840 A | 4/2000 | Huibers |
| 6,049,317 A | 4/2000 | Thompson et al. |
| 6,055,090 A | 4/2000 | Miles |
| 6,069,676 A | 5/2000 | Yuyama |
| 6,079,838 A | 6/2000 | Parker et al. |
| 6,111,560 A | 8/2000 | May |
| 6,130,527 A | 10/2000 | Bontempo et al. |
| 6,130,735 A | 10/2000 | Hatanaka et al. |
| 6,137,313 A | 10/2000 | Wong et al. |
| 6,154,586 A | 11/2000 | MacDonald et al. |
| 6,158,867 A | 12/2000 | Parker et al. |
| 6,162,657 A | 12/2000 | Schiele et al. |
| 6,168,395 B1 | 1/2001 | Quenzer et al. |
| 6,172,657 B1 | 1/2001 | Kamakura et al. |
| 6,172,797 B1 | 1/2001 | Huibers |
| 6,174,064 B1 | 1/2001 | Kalantar et al. |
| 6,195,196 B1 | 2/2001 | Kimura et al. |
| 6,201,633 B1 | 3/2001 | Peeters et al. |
| 6,201,664 B1 | 3/2001 | Le et al. |
| 6,206,550 B1 | 3/2001 | Fukushima et al. |
| 6,215,536 B1 | 4/2001 | Ebihara et al. |
| 6,219,119 B1 | 4/2001 | Nakai |
| 6,225,991 B1 | 5/2001 | McKnight |
| 6,227,677 B1 | 5/2001 | Willis |
| 6,239,777 B1 | 5/2001 | Sugahara et al. |
| 6,249,169 B1 | 6/2001 | Okada |
| 6,249,269 B1 | 6/2001 | Blalock et al. |
| 6,249,370 B1 | 6/2001 | Takeuchi et al. |
| 6,266,240 B1 | 7/2001 | Urban et al. |
| 6,275,320 B1 | 8/2001 | Dhuler et al. |
| 6,282,951 B1 | 9/2001 | Loga et al. |
| 6,285,270 B1 | 9/2001 | Lane et al. |
| 6,288,824 B1 | 9/2001 | Kastalsky |
| 6,288,829 B1 | 9/2001 | Kimura |
| 6,295,054 B1 | 9/2001 | McKnight |
| 6,296,383 B1 | 10/2001 | Henningsen |
| 6,296,838 B1 | 10/2001 | Bindra et al. |
| 6,300,154 B2 | 10/2001 | Clark et al. |
| 6,300,294 B1 | 10/2001 | Robbins et al. |
| 6,317,103 B1 | 11/2001 | Furness, III et al. |
| 6,323,834 B1 | 11/2001 | Colgan et al. |
| 6,329,967 B1 | 12/2001 | Little et al. |
| 6,329,971 B2 | 12/2001 | McKnight |
| 6,329,974 B1 | 12/2001 | Walker et al. |
| 6,360,033 B1 | 3/2002 | Lee et al. |
| 6,367,940 B1 | 4/2002 | Parker et al. |
| 6,388,661 B1 | 5/2002 | Richards |
| 6,392,736 B1 | 5/2002 | Furukawa et al. |
| 6,402,335 B1 | 6/2002 | Kalantar et al. |
| 6,402,355 B1 | 6/2002 | Kinouchi |
| 6,404,942 B1 | 6/2002 | Edwards et al. |
| 6,407,851 B1 | 6/2002 | Islam et al. |
| 6,411,423 B2 | 6/2002 | Ham |
| 6,424,329 B1 | 7/2002 | Okita |
| 6,424,388 B1 | 7/2002 | Colgan et al. |
| 6,428,173 B1 | 8/2002 | Dhuler et al. |
| 6,429,625 B1 | 8/2002 | LeFevre et al. |
| 6,429,628 B2 | 8/2002 | Nakagawa |
| 6,459,467 B1 | 10/2002 | Hashimoto et al. |
| 6,471,879 B2 | 10/2002 | Hanson et al. |
| 6,473,220 B1 | 10/2002 | Clikeman et al. |
| 6,476,886 B2 | 11/2002 | Krusius et al. |
| 6,483,613 B1 | 11/2002 | Woodgate et al. |
| 6,486,997 B1 | 11/2002 | Bruzzone et al. |
| 6,498,685 B1 | 12/2002 | Johnson |
| 6,504,985 B2 | 1/2003 | Parker et al. |
| 6,507,138 B1 | 1/2003 | Rodgers et al. |
| 6,508,563 B2 | 1/2003 | Parker et al. |
| 6,514,111 B2 | 2/2003 | Ebihara et al. |
| 6,523,961 B2 | 2/2003 | Ilkov et al. |
| 6,529,250 B1 | 3/2003 | Murakami et al. |
| 6,529,265 B1 | 3/2003 | Henningsen |
| 6,531,329 B2 | 3/2003 | Asakura et al. |
| 6,531,947 B1 | 3/2003 | Weaver et al. |
| 6,532,044 B1 | 3/2003 | Conner et al. |
| 6,535,256 B1 | 3/2003 | Ishihara et al. |
| 6,535,311 B1 | 3/2003 | Lindquist |
| 6,556,258 B1 | 4/2003 | Yoshida et al. |
| 6,556,261 B1 | 4/2003 | Krusius et al. |
| RE38,108 E | 5/2003 | Chee et al. |
| 6,559,827 B1 | 5/2003 | Mangerson |
| 6,567,063 B1 | 5/2003 | Okita |
| 6,567,138 B1 | 5/2003 | Krusius et al. |
| 6,574,033 B1 | 6/2003 | Chui et al. |
| 6,576,887 B2 | 6/2003 | Whitney et al. |
| 6,582,095 B1 | 6/2003 | Toyoda |
| 6,583,915 B1 | 6/2003 | Hong et al. |
| 6,589,625 B1 | 7/2003 | Kothari et al. |
| 6,591,049 B2 | 7/2003 | Williams et al. |
| 6,593,677 B2 | 7/2003 | Behin et al. |
| 6,600,474 B1 | 7/2003 | Heines et al. |
| 6,621,488 B1 | 9/2003 | Takeuchi et al. |
| 6,626,540 B2 | 9/2003 | Ouchi et al. |
| 6,633,301 B1 | 10/2003 | Dallas et al. |
| 6,639,570 B2 | 10/2003 | Furness, III et al. |
| 6,639,572 B1 | 10/2003 | Little et al. |
| 6,650,455 B2 | 11/2003 | Miles |
| 6,650,822 B1 | 11/2003 | Zhou |
| 6,664,779 B2 | 12/2003 | Lopes et al. |
| 6,666,561 B1 | 12/2003 | Blakley |
| 6,671,078 B2 | 12/2003 | Flanders et al. |
| 6,674,562 B1 | 1/2004 | Miles |
| 6,677,709 B1 | 1/2004 | Ma et al. |
| 6,677,936 B2 | 1/2004 | Jacobsen et al. |
| 6,678,029 B2 | 1/2004 | Suzuki |
| 6,680,792 B2 | 1/2004 | Miles |
| 6,687,040 B2 | 2/2004 | Kimura |
| 6,687,896 B1 | 2/2004 | Royce et al. |
| 6,690,422 B1 | 2/2004 | Daly et al. |
| 6,697,035 B2 | 2/2004 | Sugahara et al. |
| 6,698,348 B1 | 3/2004 | Bloss |
| 6,698,349 B2 | 3/2004 | Komata |
| 6,700,554 B2 | 3/2004 | Ham et al. |
| 6,701,039 B2 | 3/2004 | Bourgeois et al. |
| 6,707,176 B1 | 3/2004 | Rodgers |
| 6,710,008 B2 | 3/2004 | Chang et al. |
| 6,710,538 B1 | 3/2004 | Ahn et al. |
| 6,710,908 B2 | 3/2004 | Miles et al. |
| 6,710,920 B1 | 3/2004 | Mashitani et al. |
| 6,712,071 B1 | 3/2004 | Parker |
| 6,712,481 B2 | 3/2004 | Parker et al. |
| 6,731,355 B2 | 5/2004 | Miyashita |
| 6,731,492 B2 | 5/2004 | Goodwin-Johansson |
| 6,733,354 B1 | 5/2004 | Cathey et al. |
| 6,738,177 B1 | 5/2004 | Gutierrez et al. |
| 6,741,377 B2 | 5/2004 | Miles |
| 6,746,886 B2 | 6/2004 | Duncan et al. |
| 6,749,312 B2 | 6/2004 | Parker et al. |
| 6,750,930 B2 | 6/2004 | Yoshii et al. |
| 6,752,505 B2 | 6/2004 | Parker et al. |
| 6,755,534 B2 | 6/2004 | Veligdan et al. |
| 6,755,547 B2 | 6/2004 | Parker |
| 6,760,081 B2 | 7/2004 | Takagi |
| 6,760,505 B1 | 7/2004 | Street et al. |
| 6,762,743 B2 | 7/2004 | Yoshihara et al. |
| 6,762,868 B2 | 7/2004 | Liu et al. |
| 6,764,796 B2 | 7/2004 | Fries |
| 6,774,964 B2 | 8/2004 | Funamoto et al. |
| 6,775,048 B1 | 8/2004 | Starkweather et al. |
| 6,778,162 B2 | 8/2004 | Kimura et al. |
| 6,778,228 B2 | 8/2004 | Murakami et al. |
| 6,778,248 B1 | 8/2004 | Ootaguro et al. |
| 6,785,454 B2 | 8/2004 | Abe |
| 6,787,969 B2 | 9/2004 | Grade et al. |
| 6,788,371 B2 | 9/2004 | Tanada et al. |
| 6,794,119 B2 | 9/2004 | Miles |

(56) References Cited

U.S. PATENT DOCUMENTS

| | | |
|---|---|---|
| 6,795,064 B2 | 9/2004 | Walker et al. |
| 6,796,668 B2 | 9/2004 | Parker et al. |
| 6,798,935 B2 | 9/2004 | Bourgeois et al. |
| 6,800,996 B2 | 10/2004 | Nagai et al. |
| 6,809,851 B1 | 10/2004 | Gurcan |
| 6,819,386 B2 | 11/2004 | Roosendaal et al. |
| 6,819,465 B2 | 11/2004 | Clikeman et al. |
| 6,822,734 B1 | 11/2004 | Eidelman et al. |
| 6,825,470 B1 | 11/2004 | Bawolek et al. |
| 6,825,499 B2 | 11/2004 | Nakajima et al. |
| 6,827,456 B2 | 12/2004 | Parker et al. |
| 6,831,678 B1 | 12/2004 | Travis |
| 6,832,511 B2 | 12/2004 | Samoto et al. |
| 6,835,111 B2 | 12/2004 | Ahn et al. |
| 6,844,959 B2 | 1/2005 | Huibers et al. |
| 6,846,082 B2 | 1/2005 | Glent-Madsen et al. |
| 6,846,089 B2 | 1/2005 | Stevenson et al. |
| 6,847,425 B2 | 1/2005 | Tanada et al. |
| 6,847,428 B1 | 1/2005 | Sekiguchi et al. |
| 6,852,095 B1 | 2/2005 | Ray |
| 6,857,751 B2 | 2/2005 | Penn et al. |
| 6,859,625 B2 | 2/2005 | Sawada |
| 6,862,072 B2 | 3/2005 | Liu et al. |
| 6,863,219 B1 | 3/2005 | Jacobsen et al. |
| 6,864,618 B2 | 3/2005 | Miller et al. |
| 6,867,192 B1 | 3/2005 | Armour et al. |
| 6,867,896 B2 | 3/2005 | Miles |
| 6,873,311 B2 | 3/2005 | Yoshihara et al. |
| 6,879,307 B1 | 4/2005 | Stern |
| 6,886,956 B2 | 5/2005 | Parker et al. |
| 6,887,202 B2 | 5/2005 | Currie et al. |
| 6,888,678 B2 | 5/2005 | Nishiyama et al. |
| 6,889,565 B2 | 5/2005 | DeConde et al. |
| 6,893,677 B2 | 5/2005 | Yamada et al. |
| 6,897,164 B2 | 5/2005 | Baude et al. |
| 6,897,843 B2 | 5/2005 | Ayres et al. |
| 6,900,072 B2 | 5/2005 | Patel et al. |
| 6,906,847 B2 | 6/2005 | Huibers et al. |
| 6,911,891 B2 | 6/2005 | Qiu et al. |
| 6,911,964 B2 | 6/2005 | Lee et al. |
| 6,912,082 B1 | 6/2005 | Lu et al. |
| 6,919,981 B2 | 7/2005 | Clikeman et al. |
| 6,934,080 B2 | 8/2005 | Saccomanno et al. |
| 6,936,013 B2 | 8/2005 | Pevoto |
| 6,936,968 B2 | 8/2005 | Cross et al. |
| 6,939,013 B2 | 9/2005 | Asao |
| 6,940,631 B2 | 9/2005 | Ishikawa |
| 6,943,495 B2 | 9/2005 | Ma et al. |
| 6,947,107 B2 | 9/2005 | Yoshii et al. |
| 6,947,195 B2 | 9/2005 | Ohtaka et al. |
| 6,950,240 B2 | 9/2005 | Matsuo |
| 6,952,301 B2 | 10/2005 | Huibers |
| 6,953,375 B2 | 10/2005 | Ahn et al. |
| 6,961,167 B2 | 11/2005 | Prins et al. |
| 6,962,418 B2 | 11/2005 | Utsumi et al. |
| 6,962,419 B2 | 11/2005 | Huibers |
| 6,963,330 B2 | 11/2005 | Sugahara et al. |
| 6,965,375 B1 | 11/2005 | Gettemy et al. |
| 6,967,698 B2 | 11/2005 | Tanoue et al. |
| 6,967,763 B2 | 11/2005 | Fujii et al. |
| 6,969,635 B2 | 11/2005 | Patel et al. |
| 6,970,227 B2 | 11/2005 | Kida et al. |
| 6,977,710 B2 | 12/2005 | Akiyama et al. |
| 6,980,349 B1 | 12/2005 | Huibers et al. |
| 6,985,205 B2 | 1/2006 | Chol et al. |
| 6,992,375 B2 | 1/2006 | Robbins et al. |
| 6,996,306 B2 | 2/2006 | Chen et al. |
| 7,004,610 B2 | 2/2006 | Yamashita et al. |
| 7,004,611 B2 | 2/2006 | Parker et al. |
| 7,012,726 B1 | 3/2006 | Miles |
| 7,012,732 B2 | 3/2006 | Miles |
| 7,014,349 B2 | 3/2006 | Shinohara et al. |
| 7,019,809 B2 | 3/2006 | Sekiguchi |
| 7,026,821 B2 | 4/2006 | Martin et al. |
| 7,038,758 B2 | 5/2006 | Suzuki |
| 7,042,618 B2 | 5/2006 | Selbrede et al. |
| 7,042,643 B2 | 5/2006 | Miles |
| 7,046,221 B1 | 5/2006 | Malzbender |
| 7,046,905 B1 | 5/2006 | Gardiner et al. |
| 7,048,905 B2 | 5/2006 | Paparatto et al. |
| 7,050,035 B2 | 5/2006 | Iisaka |
| 7,050,141 B2 | 5/2006 | Yokoue |
| 7,050,219 B2 | 5/2006 | Kimura |
| 7,050,790 B2 | 5/2006 | Yamaga |
| 7,057,790 B2 | 6/2006 | Selbrede |
| 7,060,895 B2 | 6/2006 | Kothari et al. |
| 7,071,611 B2 | 7/2006 | Yonekubo et al. |
| 7,072,096 B2 | 7/2006 | Holman et al. |
| 7,075,702 B2 | 7/2006 | Huibers et al. |
| 7,092,142 B2 | 8/2006 | Selebrede et al. |
| 7,110,158 B2 | 9/2006 | Miles |
| 7,116,464 B2 | 10/2006 | Osawa |
| 7,119,944 B2 | 10/2006 | Patel et al. |
| 7,123,216 B1 | 10/2006 | Miles |
| 7,123,796 B2 | 10/2006 | Steckl et al. |
| 7,126,738 B2 | 10/2006 | Miles |
| 7,140,751 B2 | 11/2006 | Lin |
| 7,156,548 B2 | 1/2007 | Teng et al. |
| 7,161,094 B2 | 1/2007 | Kothari et al. |
| 7,164,250 B2 | 1/2007 | Boscolo et al. |
| 7,164,520 B2 | 1/2007 | Palmateer et al. |
| 7,180,677 B2 | 2/2007 | Fujii et al. |
| 7,184,202 B2 | 2/2007 | Miles et al. |
| 7,196,837 B2 | 3/2007 | Sampsell et al. |
| 7,198,982 B2 | 4/2007 | Patel et al. |
| 7,199,916 B2 | 4/2007 | Faase et al. |
| 7,215,459 B2 | 5/2007 | Huibers et al. |
| 7,217,588 B2 | 5/2007 | Hartzell et al. |
| 7,218,437 B2 | 5/2007 | Selbrede |
| 7,227,677 B2 | 6/2007 | Ravnkilde et al. |
| 7,233,304 B1 | 6/2007 | Aratani et al. |
| 7,271,945 B2 | 9/2007 | Hagood et al. |
| 7,274,416 B2 | 9/2007 | Feenstra et al. |
| 7,291,363 B2 | 11/2007 | Miller |
| 7,292,235 B2 | 11/2007 | Nose |
| 7,298,448 B2 | 11/2007 | Wu |
| 7,304,785 B2 | 12/2007 | Hagood et al. |
| 7,304,786 B2 | 12/2007 | Hagood et al. |
| 7,315,294 B2 | 1/2008 | Richards |
| 7,345,805 B2 | 3/2008 | Chui |
| 7,359,108 B2 | 4/2008 | Hayes et al. |
| 7,365,897 B2 | 4/2008 | Hagood et al. |
| 7,374,328 B2 | 5/2008 | Kuroda et al. |
| 7,391,493 B2 | 6/2008 | Kim |
| 7,391,552 B2 | 6/2008 | Barton et al. |
| 7,405,852 B2 | 7/2008 | Brosnihan et al. |
| 7,417,735 B2 | 8/2008 | Cummings et al. |
| 7,417,782 B2 | 8/2008 | Hagood et al. |
| 7,420,725 B2 | 9/2008 | Kothari |
| 7,460,290 B2 | 12/2008 | Hagood, IV et al. |
| 7,463,227 B2 | 12/2008 | Van Gorkom |
| 7,463,398 B2 | 12/2008 | Feenstra et al. |
| 7,502,159 B2 | 3/2009 | Hagood, IV et al. |
| 7,529,012 B2 | 5/2009 | Hayes et al. |
| 7,551,344 B2 | 6/2009 | Hagood et al. |
| 7,573,547 B2 | 8/2009 | Palmateer et al. |
| 7,601,942 B2 | 10/2009 | Underwood et al. |
| 7,616,368 B2 | 11/2009 | Hagood, IV |
| 7,619,806 B2 | 11/2009 | Hagood, IV et al. |
| 7,636,189 B2 | 12/2009 | Hagood, IV et al. |
| 7,666,049 B2 | 2/2010 | Saito et al. |
| 7,675,665 B2 | 3/2010 | Hagood et al. |
| 7,715,080 B2 | 5/2010 | Natarajan et al. |
| 7,729,037 B2 | 6/2010 | Hagood, IV et al. |
| 7,742,016 B2 | 6/2010 | Hagood et al. |
| 7,742,215 B2 | 6/2010 | Hagood, IV |
| 7,746,529 B2 | 6/2010 | Hagood et al. |
| 7,755,582 B2 | 7/2010 | Hagood et al. |
| 7,826,127 B2 | 11/2010 | Khonsari et al. |
| 7,839,356 B2 | 11/2010 | Hagood et al. |
| 7,852,546 B2 | 12/2010 | Fijol et al. |
| 7,876,489 B2 | 1/2011 | Gandhi et al. |
| 7,898,714 B2 | 3/2011 | Hagood, IV et al. |
| 7,920,317 B2 | 4/2011 | Lee et al. |

(56) References Cited

U.S. PATENT DOCUMENTS

| | | |
|---|---|---|
| 7,927,654 B2 | 4/2011 | Hagood et al. |
| 7,975,665 B2 | 7/2011 | Mori |
| 7,999,994 B2 | 8/2011 | Hagood, IV et al. |
| 8,159,428 B2 | 4/2012 | Hagood et al. |
| 8,169,679 B2 | 5/2012 | Wu et al. |
| 8,310,442 B2 | 11/2012 | Hagood et al. |
| 8,482,496 B2 | 7/2013 | Lewis |
| 8,519,923 B2 | 8/2013 | Hagood et al. |
| 8,519,945 B2 | 8/2013 | Hagood et al. |
| 8,526,096 B2 | 9/2013 | Steyn et al. |
| 8,599,463 B2 | 12/2013 | Wu et al. |
| 8,698,980 B2 | 4/2014 | Chao et al. |
| 2001/0028422 A1 | 10/2001 | Tsujimura et al. |
| 2001/0028993 A1 | 10/2001 | Sanford |
| 2001/0030488 A1 | 10/2001 | Jerman et al. |
| 2001/0040538 A1 | 11/2001 | Quanrud |
| 2001/0043177 A1 | 11/2001 | Huston et al. |
| 2001/0048265 A1 | 12/2001 | Miller et al. |
| 2001/0048431 A1 | 12/2001 | Laffargue et al. |
| 2001/0050661 A1 | 12/2001 | Noda et al. |
| 2002/0000959 A1 | 1/2002 | Colgan et al. |
| 2002/0012159 A1 | 1/2002 | Tew |
| 2002/0030566 A1 | 3/2002 | Bozler et al. |
| 2002/0047172 A1 | 4/2002 | Reid |
| 2002/0051096 A1 | 5/2002 | Yamazaki et al. |
| 2002/0063218 A1 | 5/2002 | Maydanich et al. |
| 2002/0063661 A1 | 5/2002 | Comiskey et al. |
| 2002/0075555 A1 | 6/2002 | Miles |
| 2002/0093722 A1 | 7/2002 | Chan et al. |
| 2002/0109903 A1 | 8/2002 | Kaeriyama |
| 2002/0113281 A1 | 8/2002 | Cunningham et al. |
| 2002/0126387 A1 | 9/2002 | Ishikawa et al. |
| 2002/0135553 A1 | 9/2002 | Nagai et al. |
| 2002/0150698 A1 | 10/2002 | Kawabata |
| 2002/0163482 A1 | 11/2002 | Sullivan |
| 2002/0163484 A1 | 11/2002 | Furness, III |
| 2002/0163709 A1 | 11/2002 | Mirza |
| 2002/0171327 A1 | 11/2002 | Miller et al. |
| 2002/0181597 A1 | 12/2002 | Okada |
| 2002/0185699 A1 | 12/2002 | Reid |
| 2002/0195423 A1 | 12/2002 | Patel et al. |
| 2002/0196522 A1 | 12/2002 | Little et al. |
| 2003/0001815 A1 | 1/2003 | Cui |
| 2003/0009898 A1 | 1/2003 | Slocum et al. |
| 2003/0021004 A1 | 1/2003 | Cunningham et al. |
| 2003/0023110 A1 | 1/2003 | Tam et al. |
| 2003/0036215 A1 | 2/2003 | Reid |
| 2003/0042157 A1 | 3/2003 | Mays |
| 2003/0043337 A1 | 3/2003 | Takabayashi |
| 2003/0048036 A1 | 3/2003 | Lemkin |
| 2003/0048370 A1 | 3/2003 | Koyama |
| 2003/0058543 A1 | 3/2003 | Sheedy et al. |
| 2003/0063234 A1 | 4/2003 | Oda et al. |
| 2003/0067565 A1 | 4/2003 | Yamamura |
| 2003/0071686 A1 | 4/2003 | Lemkin |
| 2003/0076649 A1 | 4/2003 | Speakman |
| 2003/0081315 A1 | 5/2003 | Kobayashi |
| 2003/0081402 A1 | 5/2003 | Jeon et al. |
| 2003/0085650 A1 | 5/2003 | Cathey et al. |
| 2003/0085867 A1 | 5/2003 | Grabert |
| 2003/0095081 A1 | 5/2003 | Furness, III et al. |
| 2003/0123245 A1 | 7/2003 | Parker et al. |
| 2003/0123246 A1 | 7/2003 | Parker |
| 2003/0128218 A1 | 7/2003 | Struyk |
| 2003/0128416 A1 | 7/2003 | Caracci et al. |
| 2003/0133284 A1 | 7/2003 | Chipchase et al. |
| 2003/0156422 A1 | 8/2003 | Tatewaki et al. |
| 2003/0164814 A1 | 9/2003 | Starkweather et al. |
| 2003/0174422 A1 | 9/2003 | Miller et al. |
| 2003/0174931 A1 | 9/2003 | Rodgers et al. |
| 2003/0183008 A1 | 10/2003 | Bang et al. |
| 2003/0184189 A1 | 10/2003 | Sinclair |
| 2003/0190536 A1 | 10/2003 | Fries |
| 2003/0196590 A1 | 10/2003 | Hartzell |
| 2003/0202338 A1 | 10/2003 | Parker |
| 2003/0210811 A1 | 11/2003 | Dubowsky et al. |
| 2003/0218793 A1 | 11/2003 | Soneda et al. |
| 2003/0231160 A1 | 12/2003 | Yoshihara et al. |
| 2004/0001033 A1 | 1/2004 | Goodwin-Johansson et al. |
| 2004/0012946 A1 | 1/2004 | Parker et al. |
| 2004/0036668 A1 | 2/2004 | Nakanishi |
| 2004/0051929 A1 | 3/2004 | Sampsell et al. |
| 2004/0058532 A1 | 3/2004 | Miles et al. |
| 2004/0076008 A1 | 4/2004 | Ikeda |
| 2004/0080484 A1 | 4/2004 | Heines et al. |
| 2004/0085608 A1 | 5/2004 | Theil et al. |
| 2004/0085749 A1 | 5/2004 | Parker et al. |
| 2004/0088629 A1 | 5/2004 | Ott |
| 2004/0090144 A1 | 5/2004 | Miller et al. |
| 2004/0090599 A1 | 5/2004 | Kowarz et al. |
| 2004/0113903 A1 | 6/2004 | Mikami et al. |
| 2004/0114346 A1 | 6/2004 | Parker et al. |
| 2004/0122328 A1 | 6/2004 | Wang et al. |
| 2004/0125062 A1 | 7/2004 | Yamamoto et al. |
| 2004/0135273 A1 | 7/2004 | Parker et al. |
| 2004/0135951 A1 | 7/2004 | Stumbo et al. |
| 2004/0136680 A1 | 7/2004 | Medina et al. |
| 2004/0141700 A1 | 7/2004 | Yang |
| 2004/0145580 A1 | 7/2004 | Perlman |
| 2004/0145793 A1 | 7/2004 | Barbour et al. |
| 2004/0145854 A1 | 7/2004 | Tamura |
| 2004/0156246 A1 | 8/2004 | Nakamura |
| 2004/0157664 A1 | 8/2004 | Link |
| 2004/0165372 A1 | 8/2004 | Parker |
| 2004/0171206 A1 | 9/2004 | Rodgers |
| 2004/0173872 A1 | 9/2004 | Park et al. |
| 2004/0179146 A1 | 9/2004 | Nilsson |
| 2004/0184710 A1 | 9/2004 | Kubby et al. |
| 2004/0196215 A1 | 10/2004 | Duthaler et al. |
| 2004/0207768 A1 | 10/2004 | Liu |
| 2004/0207815 A1 | 10/2004 | Allen et al. |
| 2004/0212759 A1 | 10/2004 | Hayashi |
| 2004/0212907 A1 | 10/2004 | Mala et al. |
| 2004/0217919 A1 | 11/2004 | Piehl et al. |
| 2004/0218149 A1 | 11/2004 | Huibers |
| 2004/0218154 A1 | 11/2004 | Huibers |
| 2004/0218292 A1 | 11/2004 | Huibers |
| 2004/0218293 A1 | 11/2004 | Huibers |
| 2004/0223088 A1 | 11/2004 | Huibers |
| 2004/0223240 A1 | 11/2004 | Huibers |
| 2004/0227428 A1 | 11/2004 | Sinclair |
| 2004/0233354 A1 | 11/2004 | Uehara et al. |
| 2004/0233392 A1 | 11/2004 | Huibers |
| 2004/0233498 A1 | 11/2004 | Starkweather et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0246275 A1 | 12/2004 | Yoshihara et al. |
| 2004/0263076 A1 | 12/2004 | De Zwart et al. |
| 2004/0263502 A1 | 12/2004 | Dallas et al. |
| 2004/0263944 A1 | 12/2004 | Miles et al. |
| 2005/0002082 A1 | 1/2005 | Miles |
| 2005/0002086 A1 | 1/2005 | Starkweather et al. |
| 2005/0007671 A1 | 1/2005 | Onvlee |
| 2005/0007759 A1 | 1/2005 | Parker |
| 2005/0012197 A1 | 1/2005 | Smith et al. |
| 2005/0018322 A1 | 1/2005 | Ben-Gad et al. |
| 2005/0024849 A1 | 2/2005 | Parker et al. |
| 2005/0052681 A1 | 3/2005 | Kogi |
| 2005/0052723 A1 | 3/2005 | Watanabe et al. |
| 2005/0059184 A1 | 3/2005 | Sniegowski et al. |
| 2005/0062708 A1 | 3/2005 | Yoshihara et al. |
| 2005/0072032 A1 | 4/2005 | McCollum et al. |
| 2005/0073471 A1 | 4/2005 | Selbrede |
| 2005/0088404 A1 | 4/2005 | Heines et al. |
| 2005/0094240 A1 | 5/2005 | Huibers et al. |
| 2005/0094418 A1 | 5/2005 | Parker |
| 2005/0111238 A1 | 5/2005 | Parker |
| 2005/0111241 A1 | 5/2005 | Parker |
| 2005/0116798 A1 | 6/2005 | Bintoro et al. |
| 2005/0122560 A1 | 6/2005 | Sampsell et al. |
| 2005/0122591 A1 | 6/2005 | Parker et al. |
| 2005/0123249 A1 | 6/2005 | Yun et al. |
| 2005/0123349 A1 | 6/2005 | Koch |

(56) References Cited

U.S. PATENT DOCUMENTS

| | | |
|---|---|---|
| 2005/0128370 A1 | 6/2005 | Moon |
| 2005/0134768 A1 | 6/2005 | Sugiura et al. |
| 2005/0134805 A1 | 6/2005 | Conner et al. |
| 2005/0139542 A1 | 6/2005 | Dickensheets et al. |
| 2005/0140636 A1 | 6/2005 | Chung et al. |
| 2005/0141076 A1 | 6/2005 | Bausenwein et al. |
| 2005/0151940 A1 | 7/2005 | Asao |
| 2005/0157376 A1 | 7/2005 | Huibers et al. |
| 2005/0168431 A1 | 8/2005 | Chui |
| 2005/0168789 A1 | 8/2005 | Glent-Madsen |
| 2005/0171408 A1 | 8/2005 | Parker |
| 2005/0172625 A1 | 8/2005 | Starkweather et al. |
| 2005/0179977 A1 | 8/2005 | Chui et al. |
| 2005/0195467 A1 | 9/2005 | Kothari et al. |
| 2005/0195468 A1 | 9/2005 | Sampsell |
| 2005/0206991 A1 | 9/2005 | Chui et al. |
| 2005/0207154 A1 | 9/2005 | Parker |
| 2005/0207178 A1 | 9/2005 | Parker |
| 2005/0212734 A1 | 9/2005 | Kimura |
| 2005/0212738 A1 | 9/2005 | Gally |
| 2005/0213322 A1 | 9/2005 | Parker |
| 2005/0213323 A1 | 9/2005 | Parker |
| 2005/0213349 A1 | 9/2005 | Parker |
| 2005/0219676 A1 | 10/2005 | Kimura et al. |
| 2005/0219679 A1 | 10/2005 | Ishikawa |
| 2005/0219680 A1 | 10/2005 | Ishikawa |
| 2005/0225501 A1 | 10/2005 | Srinivasan et al. |
| 2005/0225519 A1 | 10/2005 | Naugler, Jr. |
| 2005/0225732 A1 | 10/2005 | Conner et al. |
| 2005/0225827 A1 | 10/2005 | Kastalsky |
| 2005/0236928 A1 | 10/2005 | Kurozuka et al. |
| 2005/0242710 A1 | 11/2005 | Yamazaki et al. |
| 2005/0243023 A1 | 11/2005 | Reddy et al. |
| 2005/0244099 A1 | 11/2005 | Pasch et al. |
| 2005/0244949 A1 | 11/2005 | Miles |
| 2005/0245313 A1 | 11/2005 | Yoshino et al. |
| 2005/0249966 A1 | 11/2005 | Tung et al. |
| 2005/0253779 A1 | 11/2005 | Feenstra et al. |
| 2005/0258571 A1 | 11/2005 | Dumond et al. |
| 2005/0259198 A1 | 11/2005 | Lubart et al. |
| 2005/0263866 A1 | 12/2005 | Wan |
| 2005/0265029 A1 | 12/2005 | Epstein et al. |
| 2005/0275072 A1 | 12/2005 | Haluzak et al. |
| 2005/0275930 A1 | 12/2005 | Patel et al. |
| 2005/0285816 A1 | 12/2005 | Glass |
| 2005/0286113 A1 | 12/2005 | Miles |
| 2005/0286114 A1 | 12/2005 | Miles |
| 2006/0001942 A1 | 1/2006 | Chui et al. |
| 2006/0003676 A1 | 1/2006 | Bernard et al. |
| 2006/0004928 A1 | 1/2006 | Hess et al. |
| 2006/0007514 A1 | 1/2006 | Desai |
| 2006/0007701 A1 | 1/2006 | Schoellmann et al. |
| 2006/0012781 A1 | 1/2006 | Fradkin et al. |
| 2006/0023287 A1 | 2/2006 | Przybyla et al. |
| 2006/0028708 A1 | 2/2006 | Miles |
| 2006/0028811 A1 | 2/2006 | Ross, Jr. et al. |
| 2006/0028817 A1 | 2/2006 | Parker |
| 2006/0028840 A1 | 2/2006 | Parker |
| 2006/0028841 A1 | 2/2006 | Parker |
| 2006/0028843 A1 | 2/2006 | Parker |
| 2006/0028844 A1 | 2/2006 | Parker |
| 2006/0033676 A1 | 2/2006 | Faase et al. |
| 2006/0033975 A1 | 2/2006 | Miles |
| 2006/0038766 A1 | 2/2006 | Morita |
| 2006/0038768 A1 | 2/2006 | Sagawa et al. |
| 2006/0044246 A1 | 3/2006 | Mignard |
| 2006/0044298 A1 | 3/2006 | Mignard et al. |
| 2006/0044508 A1 | 3/2006 | Mochizuki |
| 2006/0044928 A1 | 3/2006 | Chui et al. |
| 2006/0061559 A1 | 3/2006 | King |
| 2006/0066504 A1 | 3/2006 | Sampsell et al. |
| 2006/0066540 A1 | 3/2006 | Hewlett et al. |
| 2006/0066560 A1 | 3/2006 | Gally et al. |
| 2006/0066598 A1 | 3/2006 | Floyd |
| 2006/0066934 A1 | 3/2006 | Selbrede |
| 2006/0066937 A1 | 3/2006 | Chui |
| 2006/0077125 A1 | 4/2006 | Floyd |
| 2006/0077153 A1 | 4/2006 | Cummings et al. |
| 2006/0092490 A1 | 5/2006 | McCollum et al. |
| 2006/0104061 A1 | 5/2006 | Lerner et al. |
| 2006/0132383 A1 | 6/2006 | Gally et al. |
| 2006/0152476 A1 | 7/2006 | Van Gorkom et al. |
| 2006/0154078 A1 | 7/2006 | Watanabe et al. |
| 2006/0172745 A1 | 8/2006 | Knowles |
| 2006/0187290 A1 | 8/2006 | Nakashima |
| 2006/0209000 A1 | 9/2006 | Sumiyoshi et al. |
| 2006/0209012 A1 | 9/2006 | Hagood |
| 2006/0215540 A1 | 9/2006 | Krishnamoorthi et al. |
| 2006/0238443 A1 | 10/2006 | Derichs |
| 2006/0250325 A1 | 11/2006 | Hagood et al. |
| 2006/0262060 A1 | 11/2006 | Amundson |
| 2006/0262380 A1 | 11/2006 | Miles |
| 2006/0268386 A1 | 11/2006 | Selbrede et al. |
| 2006/0268568 A1 | 11/2006 | Oku et al. |
| 2006/0270179 A1 | 11/2006 | Yang |
| 2006/0280319 A1 | 12/2006 | Wang et al. |
| 2006/0291034 A1 | 12/2006 | Patry et al. |
| 2006/0291771 A1 | 12/2006 | Braunisch et al. |
| 2006/0291774 A1 | 12/2006 | Schoellmann et al. |
| 2007/0002413 A1 | 1/2007 | Psaltis et al. |
| 2007/0003055 A1 | 1/2007 | Bark et al. |
| 2007/0007889 A1 | 1/2007 | Bongaerts et al. |
| 2007/0024701 A1 | 2/2007 | Prechtl et al. |
| 2007/0031097 A1 | 2/2007 | Heikenfeld et al. |
| 2007/0035808 A1 | 2/2007 | Amundson et al. |
| 2007/0040982 A1 | 2/2007 | Nakano et al. |
| 2007/0047051 A1 | 3/2007 | Selbrede et al. |
| 2007/0047887 A1 | 3/2007 | Selbrede |
| 2007/0052636 A1 | 3/2007 | Kalt et al. |
| 2007/0052660 A1 | 3/2007 | Montbach et al. |
| 2007/0053652 A1 | 3/2007 | Mignard et al. |
| 2007/0091011 A1 | 4/2007 | Selbrede |
| 2007/0103209 A1 | 5/2007 | Lee |
| 2007/0132680 A1 | 6/2007 | Kagawa et al. |
| 2007/0150813 A1 | 6/2007 | Selebrede et al. |
| 2007/0172171 A1 | 7/2007 | Van Ostrand et al. |
| 2007/0190265 A1 | 8/2007 | Aoki et al. |
| 2007/0205969 A1 | 9/2007 | Hagood, IV et al. |
| 2007/0217108 A1 | 9/2007 | Ozawa et al. |
| 2007/0247401 A1 | 10/2007 | Sasagawa et al. |
| 2007/0297747 A1 | 12/2007 | Biernath et al. |
| 2008/0014557 A1 | 1/2008 | Kuhn et al. |
| 2008/0026066 A1 | 1/2008 | Roser |
| 2008/0037104 A1 | 2/2008 | Hagood et al. |
| 2008/0043726 A1 | 2/2008 | Herrero-Veron et al. |
| 2008/0094853 A1 | 4/2008 | Kim et al. |
| 2008/0158635 A1 | 7/2008 | Hagood et al. |
| 2008/0165122 A1 | 7/2008 | Duthaler et al. |
| 2008/0279727 A1 | 11/2008 | Haushalter |
| 2008/0283175 A1 | 11/2008 | Hagood et al. |
| 2008/0297880 A1 | 12/2008 | Steckl et al. |
| 2009/0091561 A1 | 4/2009 | Koyama |
| 2009/0103281 A1 | 4/2009 | Koh |
| 2009/0141335 A1 | 6/2009 | Feenstra et al. |
| 2009/0284824 A1 | 11/2009 | Feenstra et al. |
| 2010/0328608 A1 | 12/2010 | Fujii et al. |
| 2011/0122474 A1 | 5/2011 | Payne et al. |
| 2011/0148948 A1 | 6/2011 | Gandhi et al. |
| 2011/0164067 A1 | 7/2011 | Lewis et al. |
| 2011/0205259 A1 | 8/2011 | Hagood |
| 2011/0255146 A1 | 10/2011 | Brosnihan et al. |
| 2011/0267668 A1 | 11/2011 | Hagood, IV et al. |
| 2012/0133006 A1 | 5/2012 | Hasselbach et al. |
| 2012/0229226 A1 | 9/2012 | Oja et al. |
| 2012/0280971 A1 | 11/2012 | Hagood et al. |
| 2012/0320111 A1 | 12/2012 | Hagood, IV et al. |
| 2012/0320112 A1 | 12/2012 | Hagood, IV et al. |
| 2012/0320113 A1 | 12/2012 | Hagood, IV et al. |
| 2013/0010341 A1 | 1/2013 | Hagood et al. |
| 2013/0010342 A1 | 1/2013 | Hagood, IV et al. |
| 2013/0010344 A1 | 1/2013 | Hagood et al. |
| 2013/0335806 A1 | 12/2013 | Steyn et al. |
| 2013/0342522 A1 | 12/2013 | Hagood et al. |
| 2014/0078154 A1* | 3/2014 | Payne et al. .................. 345/501 |

(56) References Cited

U.S. PATENT DOCUMENTS

| | | | |
|---|---|---|---|
| 2014/0085698 A1 | 3/2014 | Wu et al. | |
| 2014/0145926 A1* | 5/2014 | Wu et al. | 345/156 |
| 2014/0184573 A1* | 7/2014 | Nemchuk et al. | 345/204 |
| 2014/0184621 A1* | 7/2014 | Brosnihan et al. | 345/520 |
| 2014/0267196 A1* | 9/2014 | Villarreal et al. | 345/204 |
| 2014/0267331 A1* | 9/2014 | Villarreal et al. | 345/531 |

FOREIGN PATENT DOCUMENTS

| | | |
|---|---|---|
| CN | 1206218 A | 1/1999 |
| CN | 1309782 A | 8/2001 |
| CN | 1390045 A | 1/2003 |
| CN | 1402033 A | 3/2003 |
| CN | 1476664 A | 2/2004 |
| CN | 1491030 A | 4/2004 |
| CN | 1498408 A | 5/2004 |
| CN | 1541483 A | 10/2004 |
| CN | 1542499 A | 11/2004 |
| CN | 1555472 A | 12/2004 |
| CN | 1573525 A | 2/2005 |
| CN | 1584731 A | 2/2005 |
| CN | 1599522 A | 3/2005 |
| CN | 1623111 A | 6/2005 |
| CN | 1898969 A | 1/2007 |
| DE | 10332647 A1 | 2/2005 |
| EP | 0366847 A2 | 5/1990 |
| EP | 0438614 A1 | 7/1991 |
| EP | 0359450 B1 | 11/1994 |
| EP | 0495273 B1 | 9/1996 |
| EP | 0415625 B1 | 1/1997 |
| EP | 0757958 A1 | 2/1997 |
| EP | 0786679 A2 | 7/1997 |
| EP | 0884525 A2 | 12/1998 |
| EP | 0889458 A2 | 1/1999 |
| EP | 0751340 B1 | 5/2000 |
| EP | 1022598 A2 | 7/2000 |
| EP | 1091342 A2 | 4/2001 |
| EP | 1091343 A2 | 4/2001 |
| EP | 1091842 A1 | 4/2001 |
| EP | 1093142 A2 | 4/2001 |
| EP | 1168051 A1 | 1/2002 |
| EP | 1202096 A2 | 5/2002 |
| EP | 1202244 A1 | 5/2002 |
| EP | 1426190 A1 | 6/2004 |
| EP | 1429310 A2 | 6/2004 |
| EP | 1471495 A2 | 10/2004 |
| EP | 1522883 A1 | 4/2005 |
| EP | 1533853 A2 | 5/2005 |
| EP | 1551002 A2 | 7/2005 |
| EP | 1674893 A1 | 6/2006 |
| EP | 1734502 A1 | 12/2006 |
| EP | 1757958 A1 | 2/2007 |
| EP | 2263968 | 12/2010 |
| EP | 1858796 | 1/2011 |
| EP | 2287110 | 2/2011 |
| EP | 1640770 | 4/2012 |
| EP | 2459777 A1 | 6/2012 |
| FR | 2726135 A1 | 4/1996 |
| GB | 2071896 A | 9/1981 |
| GB | 2343980 A | 5/2000 |
| JP | S56137386 A | 10/1981 |
| JP | 57062028 A | 4/1982 |
| JP | S5774730 A | 5/1982 |
| JP | 57127264 U | 8/1982 |
| JP | S5933077 U | 2/1984 |
| JP | S62275230 A | 11/1987 |
| JP | 3142409 A | 6/1991 |
| JP | 4249203 A | 9/1992 |
| JP | 5045648 A | 2/1993 |
| JP | H06174929 A | 6/1994 |
| JP | 6194649 A | 7/1994 |
| JP | H06202009 A | 7/1994 |
| JP | H06222290 A | 8/1994 |
| JP | H06250593 A | 9/1994 |
| JP | H0836161 A | 2/1996 |
| JP | H0895526 A | 4/1996 |
| JP | 8234158 A | 9/1996 |
| JP | 8334752 A | 12/1996 |
| JP | 9080386 A | 3/1997 |
| JP | 09189869 A | 7/1997 |
| JP | 9198906 A | 7/1997 |
| JP | H09218360 A | 8/1997 |
| JP | H09292576 A | 11/1997 |
| JP | H1054916 A | 2/1998 |
| JP | H1054947 A | 2/1998 |
| JP | 10282474 A | 10/1998 |
| JP | H10282521 A | 10/1998 |
| JP | H10333145 A | 12/1998 |
| JP | 11015393 A | 1/1999 |
| JP | 11024038 A | 1/1999 |
| JP | H1184419 A | 3/1999 |
| JP | H1195693 A | 4/1999 |
| JP | H11126118 A | 5/1999 |
| JP | H11202325 A | 7/1999 |
| JP | 2000028933 A | 1/2000 |
| JP | 2000028938 | 1/2000 |
| JP | 2000057832 A | 2/2000 |
| JP | 2000105547 A | 4/2000 |
| JP | 2000111813 A | 4/2000 |
| JP | 2000121970 A | 4/2000 |
| JP | 2000131627 A | 5/2000 |
| JP | 2000172219 A | 6/2000 |
| JP | 2000214393 A | 8/2000 |
| JP | 2000214394 A | 8/2000 |
| JP | 2000214395 A | 8/2000 |
| JP | 2000214397 A | 8/2000 |
| JP | 2000214831 A | 8/2000 |
| JP | 2000235152 A | 8/2000 |
| JP | 2000259116 A | 9/2000 |
| JP | 2000321566 A | 11/2000 |
| JP | 2001067010 A | 3/2001 |
| JP | 2001075534 A | 3/2001 |
| JP | 2001100121 A | 4/2001 |
| JP | 2001125014 A | 5/2001 |
| JP | 2001154642 A | 6/2001 |
| JP | 2001175216 A | 6/2001 |
| JP | 2001201698 A | 7/2001 |
| JP | 2001201767 A | 7/2001 |
| JP | 2001242826 A | 9/2001 |
| JP | 2001281563 A | 10/2001 |
| JP | 2001318377 A | 11/2001 |
| JP | 2001331142 A | 11/2001 |
| JP | 2001331144 A | 11/2001 |
| JP | 2001337649 A | 12/2001 |
| JP | 2001356281 A | 12/2001 |
| JP | 2001356327 A | 12/2001 |
| JP | 2002040336 A | 2/2002 |
| JP | 2002040337 A | 2/2002 |
| JP | 2002139683 A | 5/2002 |
| JP | 2002140038 A | 5/2002 |
| JP | 2002214543 A | 7/2002 |
| JP | 2002279812 A | 9/2002 |
| JP | 2002528763 A | 9/2002 |
| JP | 2002287718 A | 10/2002 |
| JP | 2002297085 A | 10/2002 |
| JP | 2002318564 A | 10/2002 |
| JP | 2002333619 A | 11/2002 |
| JP | 2002341343 A | 11/2002 |
| JP | 2002351431 A | 12/2002 |
| JP | 2002365650 A | 12/2002 |
| JP | 2003029295 A | 1/2003 |
| JP | 2003036057 A | 2/2003 |
| JP | 2003506755 A | 2/2003 |
| JP | 2003084314 A | 3/2003 |
| JP | 2003086233 A | 3/2003 |
| JP | 2003098984 A | 4/2003 |
| JP | 2003121824 A | 4/2003 |
| JP | 2003162904 A | 6/2003 |
| JP | 2003202519 A | 7/2003 |
| JP | 2003248463 A | 9/2003 |
| JP | 2003344785 A | 12/2003 |
| JP | 2004004216 A | 1/2004 |
| JP | 2004053839 A | 2/2004 |

(56) References Cited

FOREIGN PATENT DOCUMENTS

| | | |
|---|---|---|
| JP | 2004069788 A | 3/2004 |
| JP | 2004117833 A | 4/2004 |
| JP | 2004140800 A | 5/2004 |
| JP | 2004151722 A | 5/2004 |
| JP | 2004163915 A | 6/2004 |
| JP | 2004191736 A | 7/2004 |
| JP | 2004205973 A | 7/2004 |
| JP | 2004212673 A | 7/2004 |
| JP | 2004221051 A | 8/2004 |
| JP | 2004287215 A | 10/2004 |
| JP | 2004287431 A | 10/2004 |
| JP | 2004302270 A | 10/2004 |
| JP | 2004317557 A | 11/2004 |
| JP | 2004317785 A | 11/2004 |
| JP | 2004325909 A | 11/2004 |
| JP | 2004327025 A | 11/2004 |
| JP | 2004534280 A | 11/2004 |
| JP | 2004347982 A | 12/2004 |
| JP | 2005010786 A | 1/2005 |
| JP | 2005043674 A | 2/2005 |
| JP | 2005043726 A | 2/2005 |
| JP | 2005504355 A | 2/2005 |
| JP | 2005512119 A | 4/2005 |
| JP | 2005134896 A | 5/2005 |
| JP | 2005309416 A | 11/2005 |
| JP | 2006098990 A | 4/2006 |
| JP | 2006522360 A | 9/2006 |
| JP | 2007155983 A | 6/2007 |
| JP | 2007517488 A | 6/2007 |
| JP | 2008015081 A | 1/2008 |
| JP | 2008098984 A | 4/2008 |
| JP | 2008233898 A | 10/2008 |
| JP | 2009111813 A | 5/2009 |
| JP | 2010517052 A | 5/2010 |
| JP | 2012128451 A | 7/2012 |
| JP | 2012186782 A | 9/2012 |
| JP | 2012230079 A | 11/2012 |
| JP | 2013061658 A | 4/2013 |
| WO | 9401716 A1 | 1/1994 |
| WO | 9528035 A1 | 10/1995 |
| WO | 9704436 A1 | 2/1997 |
| WO | 9804950 A1 | 2/1998 |
| WO | 9819201 A1 | 5/1998 |
| WO | 9901696 A1 | 1/1999 |
| WO | 0017695 A1 | 3/2000 |
| WO | 0050807 A1 | 8/2000 |
| WO | 0052674 A1 | 9/2000 |
| WO | 0055916 A1 | 9/2000 |
| WO | 0169584 A1 | 9/2001 |
| WO | 0189986 A1 | 11/2001 |
| WO | 0207482 A2 | 1/2002 |
| WO | 03004836 A1 | 1/2003 |
| WO | 03007049 | 1/2003 |
| WO | 03008860 A1 | 1/2003 |
| WO | 03029874 A2 | 4/2003 |
| WO | 03040802 A2 | 5/2003 |
| WO | 03048836 A2 | 6/2003 |
| WO | 03050448 A1 | 6/2003 |
| WO | 03061007 A1 | 7/2003 |
| WO | 03061329 A2 | 7/2003 |
| WO | 03069593 A2 | 8/2003 |
| WO | 03081315 A1 | 10/2003 |
| WO | 03105198 A1 | 12/2003 |
| WO | 2004008629 A1 | 1/2004 |
| WO | 2004019120 A1 | 3/2004 |
| WO | 2004034136 A1 | 4/2004 |
| WO | 2004038496 A1 | 5/2004 |
| WO | 2004086098 A2 | 10/2004 |
| WO | 2004088629 A1 | 10/2004 |
| WO | 2004097506 A2 | 11/2004 |
| WO | 2005001892 A2 | 1/2005 |
| WO | 2005015287 A1 | 2/2005 |
| WO | 2005062908 A2 | 7/2005 |
| WO | 2005073950 | 8/2005 |
| WO | 2005082908 A1 | 9/2005 |
| WO | 2006017129 A2 | 2/2006 |
| WO | 2006023077 A2 | 3/2006 |
| WO | 2006039315 A2 | 4/2006 |
| WO | 2006052755 A2 | 5/2006 |
| WO | 2006091738 A1 | 8/2006 |
| WO | 2006091791 | 8/2006 |
| WO | 2006091860 A2 | 8/2006 |
| WO | 2006091904 | 8/2006 |
| WO | 2007075832 | 7/2007 |
| WO | 2007123173 A1 | 11/2007 |
| WO | 2007145973 | 12/2007 |
| WO | 2008026066 A1 | 3/2008 |
| WO | 2008091339 A2 | 7/2008 |
| WO | 2008092859 A1 | 8/2008 |
| WO | 2009102471 A1 | 8/2009 |
| WO | 2010062647 A2 | 6/2010 |
| WO | 2013032865 A1 | 3/2013 |

OTHER PUBLICATIONS

Boer W.D., "Improvement of Image Quality in AMLCDs", Active Matrix Liquid Crystal Displays: Fundamentals and Applications, 2005, pp. 139-177, XP055089313, U.S.A, ISBN: 978-0-75-067813-1.

International Search Report and Written Opinion—PCT/US2014/021352—ISA/EPO—Aug. 8, 2014.

Uchida T. et al., "Encyclopedia of Flat Panel Displays", Japan, Kogyo Chosakai Publishing Co., Ltd./Yukio Shimura, Dec. 25, 2001, pp. 617 to 619.

Partial International Search Report—PCT/US2014/021352—ISA/EPO—Jun. 5, 2014.

Taiwan Search Report—TW103108824—TIPO—Jan. 12, 2015.

Li, J., et al., "DRIE-Fabricated Curved-Electrode Zipping Actuators with Low Pull-In Voltage," 12th International Conference on Solid State Sensors, Actuators and Microsystems, IEE, 480-483 (2003).

Liang et al, "Observation of electric field gradients near field-emission cathode arrays," Appl Phys. Lett., 66 (9): 1147-1149 (Feb. 27, 1995).

Liu et al, "Scaling Laws of Microactuators and Potential Applications of Electroactive Polymers in MEMS," SPIE, 3669: 345-354 (Mar. 1999).

"Low Temperature Polysilicon TFT Reflective Color LCD" by Techno World.

Maboudian et al., "Stiction reduction processes for surface micromachines," Tribology Letters, 3: 215-221 (1997).

Markandey V. et al., "Video Processing for DLP Display Systems," Texas Instruments Corporation, Mar. 13, 1996, pp. 21-32.

Mastrangelo et al, "Mechanical Stability and Adhesion of Microstructures Under Capillary Forces—Part I: Basic Theory," Journal of Microelectromechanical Systems, 2 (1): 33-43 (Mar. 1993).

Mastrangelo et al, "Mechanical Stability and Adhesion of Microstructures Under Capillary Forces—Part II: Experiments," Journal of Microelectromechanical Systems, 2 (1): 44-55 (Mar. 1993).

McLaughlin, "Progress in Projection and Large-Area Displays," Proceedings of the IEEE, 90 (4): 521-532 (Apr. 2002).

Microchem "Nano SU 8 2000", product brochure for thick polymer, Rev. Feb. 2002.

"MicroLensTm—Re-Inventing LCD Backlighting," Global Lighting Technologies Inc., http://www.glthome.com/tech.htm, 1-2; retrieved on Aug. 3, 2006.

"Microprism Technology for Liminaires," Reflexite Corporation, Technical Publication RLO•181, Rev. 2 (2003).

"Microprism Technology for Luminaires," Reflexite Display Optics (2004).

"Nano TM Su-8 2000 Negative Tone Photoresist Formulations 2002-2025," Micro Che, Rev. 2/02m, (Date:Feb. 2002).

Okumura et al, "Highly-efficient backlight for liquid crystal display having no optical films," Applied Physics Letters, 83 (13): 2515-2517 (Sep. 29, 2003).

"Optical Design Tools for Backlight Displays," Light Tools, Optical Engineering, Publication of ROCOES, 81: 90-101 (Jun. 2003).

(56) References Cited

OTHER PUBLICATIONS

"Optical Design Tools for Backlight Displays," Light Tools, Optical Research Associates, 1-8.
Park, Y.I., et al., "Active Matrix OLED Displays Using Simple Poly-Si TFT Process," Society of Information Display, Digest, pp. 487-89 (2003).
Pasricha S. et al., "Dynamic Backlight Adaptation for Low Power Handheld Devices" IEEE Design and Test v. 21, 2004, pp. 398.
Perregaux, G., et al, "Arrays of Addressable High-Speed Optical Microshutters," CSEM Swiss Center for Electronics and Microtechnology Inc., Microsystems Division, pp. 232-235 (2001).
"Prism Brightness Enhancement Films," 3M Corporation, http://products3.3m.com/catalog/us/en001/electronics_mfg/vikuiti/node_V6G78RBQ5Tbe/root_GST1T4S9TCgv/vroot_S6Q2FD9X0Jge/gvel_GD378DOHGJgl/theme_us_vikuiti_3_0/command_AbcPageHandler/ output_html Retrieved on Aug. 3, 2006.
"Prism Sheet," Mitsubishi Rayon America Inc., http://www.mrany.com/data/HTML/29.htm Retrieved on Aug. 4, 2006.
Qiu et al, "A Curved-Beam Bistable Mechanism," Journal of Microelectromechanical Systems, 13 (2): 137-145 (Apr. 2004).
Qiu et al, "A High-Current Electrothermal Bistable MEMS Relay," Micro Electro Mechanical Systems, MEMS-03 Kyoto, pp. 64-67 (Jan. 19-23, 2003).
Ravnkilde J., et al., "Fabrication of Nickel Microshutter Arrays for Spatial Light Modulation", Mesomechanics, 2002, pp. 161-165. Also on their web site: http://www2.mic.dtu.dk/research/mems/publications/Papers/Dicon_Meso2002.pdf.
Roosendaal et al, "25.2: A Wide Gamut, High Aperture Mobile Spectrum Sequential Liquid Crystal Display," SID 05 Digest, 1116-1119 (2005).
Saeedi, et. al. "Molten-Alloy Driven Self-Assembly for Nano and Micro Scale System Integration" Fluid Dynamics and Materials Processing, vol. 2, No. 4, pp. 221-245 (2006).
Sato, "Research on Flexible Display Systems," Broadcast Technology, 21: 10-15 (Winter, 2005).
Sharp Specification No. LCP—03015 for Mobile Liquid Crystal Display Group, Sharp Corporation, Jun. 13, 2003.
Shikida et al, "Fabrication of an S-shaped Microactuator," Journal of Microelectromechanical Systems, 6 (1): 18-24 (Mar. 1997).
Sony Corporation, "ACX705AKM, 6.92cm Diagonal Reflective Color LCD Module".
Steyn, Lodewyck, "Electroquasistatic Zipper Actuators: A Technology Review", Dec. 2004.
Tagaya et al., "Thin Liquid-Crystal Display Backlight System with Highly Scattering Optical Transmission Polymers," Applied Optics, 40 (34): 6274-6280 (Dec. 2001).
Takatori, et al., "6.3: Field-Sequential Smectic LCD with TFT Pixel Amplifier," SID 01, 2001, Digest, pp. 48-51.
Tan et al "Soldering Technology for Optoelectronics Packaging", 1996 Electronic Components and Technology Conference, pp. 26-36 (1996).
Teijido, J.M., "Conception and Design of Illumination Light Pipes," Thesis No. 1498 for University of Neuchatel, http://www.unige.ch/cyberdocuments/unine/theses2000/TeijidoJM/these_front.htm 1: 1-99 Retrieved on Aug. 3, 2006.
Tien et al, "MEMS Actuators for Silicon Micro-Optical Elements," Proc. of SPIE, 4178: 256-269, (2000).
"Two Proprietary Technologies Supporting Omron Backlight," OMRON Electronics Corporation, OMRON Electronics Components Web, www.omron.co.jp/ecb/products/bklight/english/genri/index.html, retrieved on Aug. 3, 2006.
Underwood, "A review of microdisplay technologies," SID © EID, (Nov. 21 to 23, 2000).
Underwood, "LCoS through the looking glass," SID (2001).
van de Biggelaar, et. al. "Passive and Active Matrix Addressed Polymer Light-emitting Diode Displays", Proc. SPIE vol. 4295, p. 134 (2001).
Vangbo et al, "A lateral symmetrically bistable buckled beam," J. Micromech. Microeng., 8: 29-32 (1998).

Wang et al., "A highly efficient system for automatic face region detection in MPEG video." IEEE Trans. on Circuits and Systems for Video Technology, vol. 7 Issue 4, Aug. 1997, pp. 615-628.
Wang K., et al., "Highly Space-Efficient Electrostatic Zigzag Transmissive Micro-Optic Switches for an Integrated MEMS Optical Display System", Transducers 03 Conference, Jun. 8-12, 2003, vol. 1, pp. 575-575.
Yamada et al, "52.2: Invited Paper: Color Sequential LCD Based on OCB with an LED Backlight," SID 00 Digest, 1180-1183 (2000).
Yasumura et al, "Fluid Damping of an Electrostatic Actuator for Optical Switching Applications," Transducers Research Foundation (2002).
Akimoto O. et al., "15.1: A 0.9-in UXGA/HDTV FLC Microdisplay," Society for Information Display, 2000, pp. 194-197.
Alt P.M., et al., "A Gray-Scale Addressing Technique for Thin-Film-Transistor/Liquid Crystal Displays," IBM J. Res. Develop., 36 (1), Jan. 1992, pp. 11-22.
AZ Displays, Inc., "Complete LCD Solutions," ATM3224C-NC-FTH, pp. 1-15 (Oct. 2, 2003).
Bergquist et al., "Field Sequential Colour Display with Adaptive Gamut", Society for Information Display, Digest of Technical Papers, 2006, pp. 1594-1597.
Birch et al, "31.1: SXGA Resolution FLC Microdisplays," SID 02 Digest, 954-957 (2002).
B.J. Feenstra et. al. "A Reflective Display Based on Electrowetting: Principle and Properties", International Display Research Conference Proceedings 2003, p. 322.
Blackstone, "Making MEMS Reliable," SPIE's OEMagazine, 32-34 (Sep. 2002).
"BLU,"Heesung Precision Ltd., http://www.hspr.co.kr/eng/product/blu.asp Retrieved on Aug. 3, 2006.
Boer W.D., "Active Matrix Liquid Crystal Displays", Elsevier Science & Technology Books, ISBN #0750678135, Aug. 2005.
Boeuf, J.P., "Plasma display panels: physics,recent deveopments and key issues," J. Phys. D: Appl. Phys. 36 (2003) R53-R79 (received Aug. 29, 2002: published Feb. 26, 2003).
Boucinha M., et al., "Air-gap amorphous silicon thin film transistors", Applied Physics Letters, AIP, American Institute of Physics, Melville, NY, US, vol. 73, No. 4, Jul. 27, 1998, pp. 502-504, XP012021821, ISSN: 0003-6951, DOI: 10.1063/1.121914.
Bozler et al, "Arrays of gated field-emitter cones having 0.32 mm tip-to-tip spacing," J. Vec. Sci. Technol. B, 12 (2): 629-632 (Mar./Apr. 1994).
Bryan-Brown, "Ultra Low Power Bistable LCDs," SID 00, 76-79 (2000).
Chino E. et al., "25.1: Invited Paper: Development of Wide-Color-Gamut Mobile Displays with Four-primary-color LCDs," Society for Information Display, 37 (2), 2006, pp. 1221-1224.
Clark N. A., et al., "FLC Microdisplays", Ferroelectrics, 246, 2000, pp. 97-110.
Conde, J.P., et. al., "Amorphous and microcrystalline silicon deposited by hot-wire chemical vapor deposition at low substrate temperatures: application to devices and thin-film microelectromechanical systems," Thin Solid Films 395: 105-111 (2001).
Conde, J.P., et al., "Low-temperature Thin-film Silicon MEMS", in Thin Solid Films 427, p. 181 (2003).
Davis, "Light Emitting Diode Source Modeling for Optical Design," Reflexite Display Optics (Oct. 2004).
Davis, "Microstructured Optics for LED Applications," Reflexite Display Optics (2002).
Doane, et al, "Display Technologies in Russia, Ukraine, and Belarus," World Technology Evaluation Center Panel Report (Dec. 1994) http://www.wtec.org/loyola/displays/toc.htm, retrieved on Nov. 22, 2005.
Doherty D. et al., "Pulse Width Modulation Control of DLP Projectors", TI Technical Journal, Jul.-Sep. 1998, No. 3, pp. 115-121.
"Electronic Display Lighting Tutorials," 3M Corporation,file"//D:/Optical/Vikuiti Tutorial.htm. retrieved on Aug. 10, 2006.
Feenstra J. et al., "Electrowetting Displays", Liquavista BV, http://www.liquavista.com/documents/electrowetting_displays_whitepaper.pdf, Retrieved on Aug. 17, 2006, pp. 1-16.

(56) References Cited

OTHER PUBLICATIONS

Feng, et al, "Novel Integrated Light-Guide Plates for Liquid Crystal Display Backlight," Journal of optics a Pure and applied optics, 2005, 7, 111-117.

Feng, "High Quality Light Guide Plates that Can Control the Illumination Angle Based on Microprism Structures," Applied Physics Letters, 85 (24): 6016-6018 (Dec. 2004).

Flat Panel Display (FPD) Manufacturing Equipment that Cuts Production Costs by Half, Shibaura Mechatronics Corporation, product brochure for panel processing.

Foley, "NE04-21: Microstructured Plastic Optics for Display, Lighting, and Telecommunications Applications," Fresnel Optics (2001).

Funamoto et al, "Diffusive-sheetless Backlight System for Mobile Phone," IDW/AD, 1277-1280 (2005).

Funamoto et. al. "LED Backlight System with Double-Prism Pattern", Journal of the Society for Information Display v. 14, pp. 1045-1051 (2006).

Goddhue et al, "Bright-field analysis of field-emission cones using high-resolution tranmission electron microscopy and the effect of structural properties on current stability," J. Vac. Sci. Technol. B, 12 (2): 693-696 (Mar. Apr. 1994).

Hartman, "4.1: Invited paper: Two-Terminal Devices Technologies for AMLCDs," SID 95 Digest, 7-10 (1995).

Hewlett et al, "DLP CinemaTM projection: A hybrid frame-rate technique for flicker-free performance," Journ of the SID 9/3, 221-226 (2001).

Hornbeck J. "Digital Light Processing TM: A New MEMS-Based Display Technology," Technical Digest of the IEEJ 14th Sensor Symposium, Jun. 4-5 1996, pp. 297-304.

J. Heikenfeld et. al., "Contrast Enhancement in Black Dielectric Electroluminescent Devices", IEEE Transactions on Electron Devices, 49: 8, 1348-52 (2002).

Jepsen et al, "4.11: 0.9" SXGA Liquid Crystal on Silicon Panel with 450 Hz. Field Rate," SID MicroDisplay Corporation, pp. 106-109 (Sep. 2001).

Joaquirn, M., "Polyphenyl Ether Lubricants" Synthetic Lubricants and High-performance Functional Fluids, R. L. Rudnick and R. L. Shubkin, Eds., p. 239, Marcel Dekker, Inc., NY, 1999.

Johnstone et al, "Theoretical limits on the freestanding length of cantilevers produced by surface micromachining technology," J. Micromech. Microeng. 12: 855-861 (Published Oct. 3, 2002).

Jones et al, "29-1: Addressing TVmin Ferroelectric Liquid Crystal Displays," (1998).

Judy, et al, "Self-Adjusting Microstructures(SAMS)," Proceedings of the Workshop on Micro Electro Mechanical Systems, New York, Jan. 30, 1991, vol. Workshop 4, pp. 51-56.

Judy, M. W., "Micromechanisms Using Sidewall Beams," Dissertation, University of California at Berkeley, 1994.

Kalantar et al, "Optical Micro Deflector Based Functional Light-Guide Plate for Backlight Unit," SID 00 Digest, 1029-1031 (2000).

Kalantar, K., et al., "Backlight Unit with Double Surface Light Emission Using a Single Micro-structured Light-guide Plate," p. 1182, Society for Information Display Digest (2004).

Kalantar, "Modulation of viewing angle on an LCD surface through backlight optics," Journal of the SID, 11 (4): 647-652 (2003).

Kim, C.W., et al., "Manufacturing Technologies for the Next Generation a-Si TFT-LCD," Proceedings of the Intl. Display Mfg. Cnf. Seoul, Korea (2000).

Koden et al., "Ferroelectric Liquid Crystal Display," (Sep. 17, 1997).

Kuang et al., "Dynamic characteristics of shaped micro-actuators solved using the differential quadrature method," Journal of Micromechanics and Microengineering, 14: 647-655, (2004).

Kunzman A. et al., "10.3 White Enhancement for Color Sequential DLP", Society for Information Display, Digest of Technical Papers, 1998.

Lee, et al., "40.1: Distingusihed Contributed Paper: Integrated Amorphous Silicon Color Sensor on LCD Panel for LED Backlight Feedback Control System", Society for Information Display, Digest of Technical Papers, 2005, pp. 1376-1379.

Lee et al, "P-25: A LCOS Microdisplay Driver with Frame Buffering Pixels," SID 02 Digest, 292-295 (2002).

Legtenberg, et al., "Electrostatic Curved Electrode Actuators," Journal of Microelectromechanical Systems, 6 (3): 257-265 (Sep. 1997).

\* cited by examiner

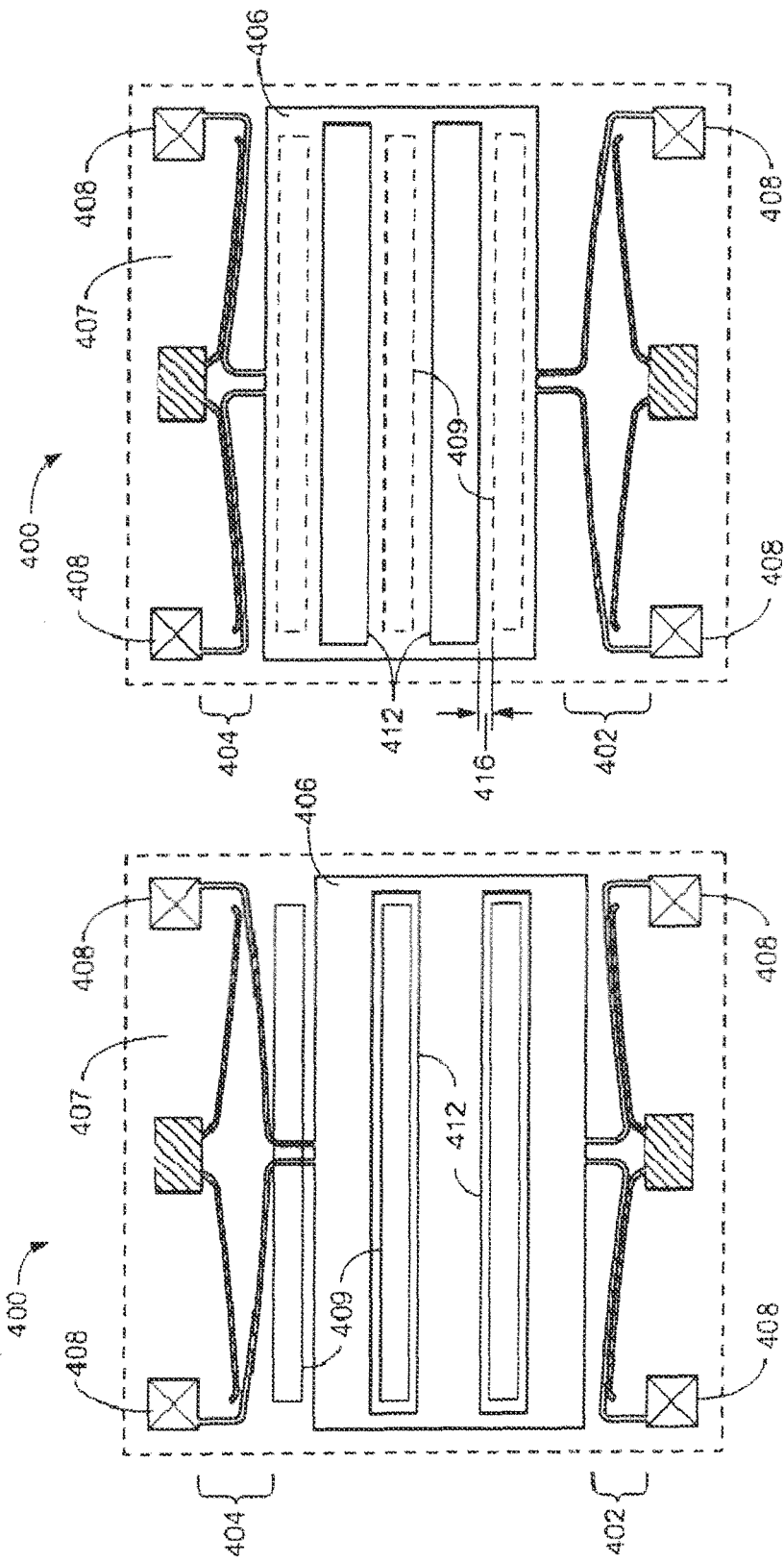

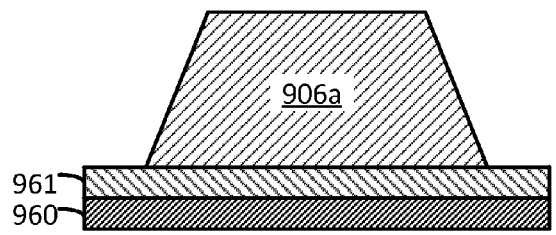 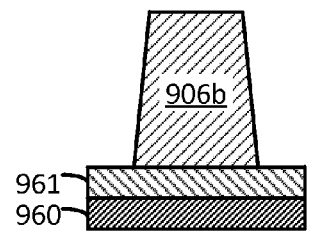
FIGURE 9B  FIGURE 9C
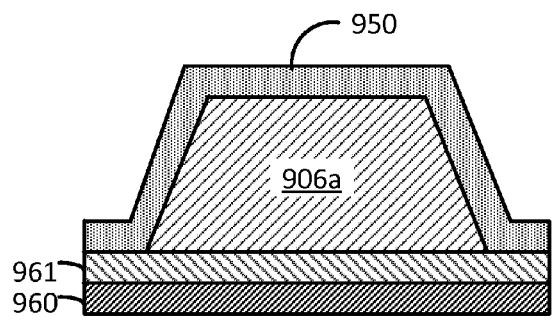 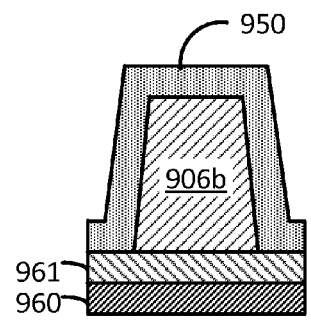
FIGURE 9D  FIGURE 9E
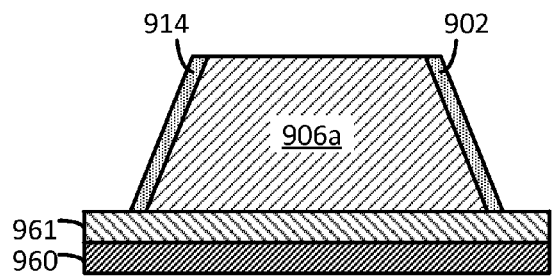 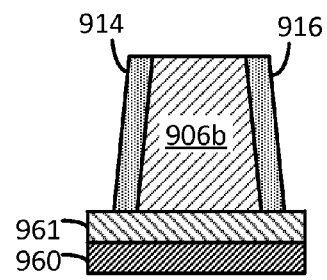
FIGURE 9F  FIGURE 9G

DISPLAY APPARATUS WITH NARROW GAP ELECTROSTATIC ACTUATORS

TECHNICAL FIELD

This disclosure relates to the field of imaging displays, and in particular, to imaging displays employing electrostatic display elements actuators.

DESCRIPTION OF THE RELATED TECHNOLOGY

Certain electromechanical systems (EMS) electrostatic actuators include opposing beams supported over a substrate. A voltage needed to actuate such actuators is dependent in part on the minimum distance between the beams. For example, the voltage needed to actuate the actuator decreases with the decrease in the minimum distance between the opposing beams. In some implementations of such actuators, the voltage needed to actuate the actuators is reduced as a result of inherent stresses building up in the beam materials during their deposition, resulting in the tip of at least one of the beams naturally and spontaneously bending towards the other beam, reducing the minimum distance between them.

Some manufacturing processes, however, do not result in the beams building up sufficient internal stress to yield this bending. As a result, additional voltage may be needed to actuate such actuators, resulting in a more power-hungry and slower display.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having a substrate and an electromechanical systems (EMS) electrostatic actuator coupled to the substrate. The electrostatic actuator can include a load beam electrode coupled to a light modulator. The electrostatic actuator can also include a drive beam electrode having a first portion positioned adjacent to the load beam, a second portion positioned behind the first portion with respect to the load beam, and an end portion connecting the first portion to the second portion, where the thickness of the second portion varies along its length.

In some implementations, the second portion of the drive beam electrode includes a first generally U-shaped segment, where the thickness of the drive beam electrode along the first generally U-shaped segment is different than the thickness of the beam adjacent to the first generally U-shaped segment. In some of these implementations, the second portion of the drive beam electrode includes a second generally U-shaped segment and where the thickness of the drive beam electrode along the first and the second generally U-shaped segments is different than the thickness of the remainder of the second portion. In some implementations, the first U-shaped segment is adjacent to the second U-shaped segment.

In some implementations, the first portion of the drive beam electrode includes a third generally U-shaped segment, smaller than the first U-shaped segment of the second portion. In some implementations, a segment of the second portion of the drive beam electrode has an angle with respect to the substrate that is shallower than an angle formed by a remainder of the second portion of the drive beam electrode with respect to the substrate. In some implementations, the segment of the second portion of the drive beam electrode having the shallower angle with respect to the substrate is thinner than the remainder of the second portion of the substrate. In some implementations, the first portion, the end portion, and the second portion of the drive beam form a loop.

In some implementations, the apparatus further includes a display, a processor that is configured to communicate with the display and to process image data, and a memory device that is configured to communicate with the processor. In some implementations, the apparatus can further include a driver circuit configured to send at least one signal to the display, and a controller configured to send at least a portion of the image data to the driver circuit. In some implementations, the apparatus can further include an image source module configured to send the image data to the processor, where the image source module includes at least one of a receiver, transceiver, and transmitter. In some implementations, the apparatus further includes an input device configured to receive input data and to communicate the input data to the processor.

Another innovative aspect of the subject matter described in this disclosure can be implemented in a display element having a substrate and an electromechanical systems (EMS) electrostatic actuator coupled to the substrate. The electrostatic actuator includes a load beam electrode coupled to a light modulator, and a drive beam electrode coupled to the substrate. The drive beam electrode includes a first portion positioned adjacent to the load beam electrode, a second portion positioned behind the first portion with respect to the load beam electrode, an end portion connecting the first portion to the second portion. The beam electrode also includes a shelf structure separate from an anchor supporting the drive beam over the substrate, having a first planar surface that is substantially parallel to the substrate and coupled to the second portion of the drive beam.

In some implementations, the first planar surface is positioned on a side of the second portion of the drive beam that is substantially normal to the substrate. In some other implementations, the first planar surface in positioned on an edge of the second portion of the drive beam that faces away from the substrate. In some implementations, the shelf structure includes a second planar surface that is substantially parallel to the substrate and coupled to the second portion of the drive beam. In some implementations, the first planar surface and the second planar surface are positioned on opposite ends of a side of the second portion that is substantially normal in relation to the substrate. In some implementations, the shelf structure is physically separated from the first portion of the drive beam. In some implementations, the first portion, the end portion, and the second portion of the drive beam form a loop.

Another innovative aspect of the subject matter described in this disclosure can be implemented in a method including forming a mold over a substrate, forming a light modulator over a surface of the mold, forming a load beam coupled to the light modulator on a first sidewall of the mold, forming a first portion of a drive beam on a second sidewall of the mold facing the first sidewall, and forming a second portion of the drive beam on a third sidewall facing away from the first sidewall, such that a thickness of the second portion varies along a length of the second portion.

In some implementations, the third sidewall includes a U-shaped portion, and forming the second portion further includes forming a generally U-shaped segment in the second portion along the U-shaped portion of the third sidewall such that a thickness of the second portion along the U-shaped segment is different from a thickness of the second portion adjacent to the generally U-shaped segment.

In some implementations, forming the mold further includes forming a portion of the third sidewall at an angle with respect to the substrate, the angle being shallower than that formed by the second sidewall. In some such implementations, a segment of the second portion formed over the portion of the third sidewall having the shallower angle is thinner than the remainder of the second portion.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCDs), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIG. 4A and FIG. 4B show example views of a dual actuator shutter assembly.

FIGS. 9A-9H show various views of an example shutter assembly having a second tip-gap adjustment feature.

Like reference numbers and designations in the various drawings indicate like elements.

DETAILED DESCRIPTION

Figure 1A:
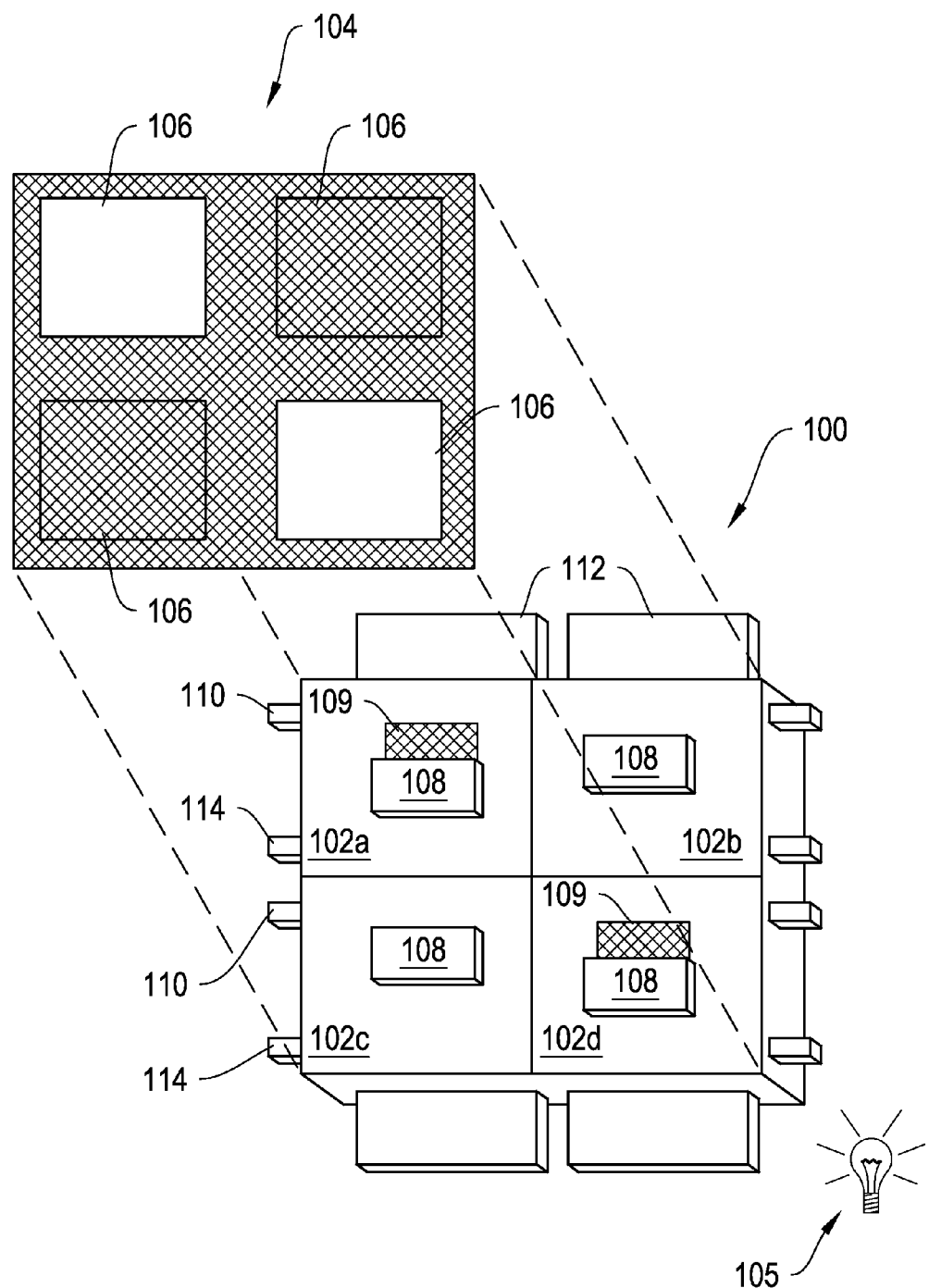
FIG. 1A shows an example schematic diagram of a direct-view MEMS-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The minimum separation distance between two opposing beam electrodes of an electromechanical systems (EMS) electrostatic actuator can be reduced by introducing mechanical stress on one of the beams, causing it to bend towards its opposing beam. In some implementations, one of the beam electrodes is formed in the shape of an elongated loop. That is, a first portion extends away from an anchor, and after a distance, curves back such that a second portion extends back towards and couples to the anchor. By introducing a stress or stress gradient on the second portion (i.e., the portion further from the opposing beam), the beam can be made to bend towards the opposing beam.

In some implementations, this stress or stress gradient can be introduced by forming the beam such that a thickness of the second portion varies along its length. In some implementations, the variation of the thickness of the second portion of the beam is achieved by forming the second portion on sidewalls of a mold built on a substrate. Some sidewalls of the mold are configured to have an angle with the substrate that is shallower than the angle formed by the remaining sidewalls of the mold. This results in a part of the second portion that is formed on these shallow angled sidewalls to be thinner than the rest of the second portion. Due to this variation in the thickness, the second portion can develop a certain amount of stress or stress gradient. As a result, when the beam is released from the mold, this stress or stress gradient causes the beam to bend towards the opposing beam.

In some other implementations, the second portion of the beam includes one or more generally U-shaped beam regions. The beam material along these generally U-shaped beam regions is thinner than the beam material adjacent to these U-shaped beam regions. This results in a stress or stress gradient that can lead to the expansion of the U-shaped beam regions. The expansion of the U-shaped beam regions results in the bending of the end of beam towards the opposing beam.

In some other implementations, the stress or stress gradient is introduced by coupling a part of the second portion of the beam to another surface that is under mechanical stress. For example, in some manufacturing processes, material that is deposited on a surface that is parallel to an underlying substrate may develop mechanical stress or stress gradient within the plane of the surface. This stress or stress gradient can cause the surface to expand in a direction that is parallel to the substrate. By coupling the surface to the second portion of the beam, the expansion of the surface can cause the beam to bend towards the opposing beam.

Particular implementations of the subject matter described in this disclosure can be implemented to realize one or more of the following potential advantages. By introducing a mechanical stress or stress gradient in a portion of a drive beam electrode of an actuator, a tip-gap between the drive beam electrode and an opposing load beam electrode can be reduced. This reduction in the tip-gap allows a reduction in an actuation voltage needed to actuate a shutter assembly that includes the actuator. In some implementations, the reduction in the actuation voltage can be up to about 50%. The reduction in actuation voltage allows a reduction in the power needed to operate the shutter assembly.

FIG. 1A shows a schematic diagram of a direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (such as interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
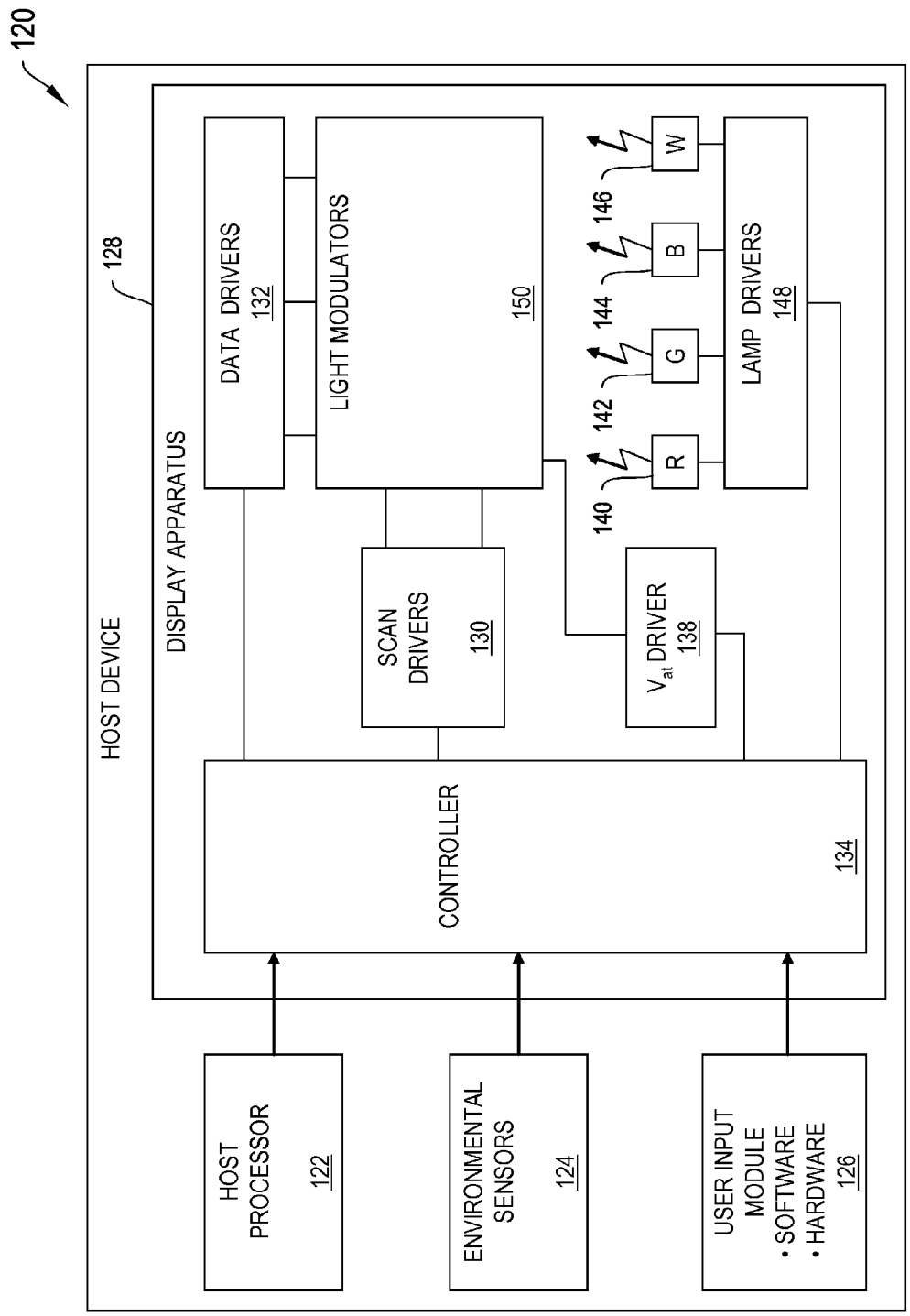
FIG. 1B shows an example block diagram of a host device.

FIG. 1B shows an example of a block diagram of a host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in sequences, which in some implementations may be predetermined, grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (such as scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
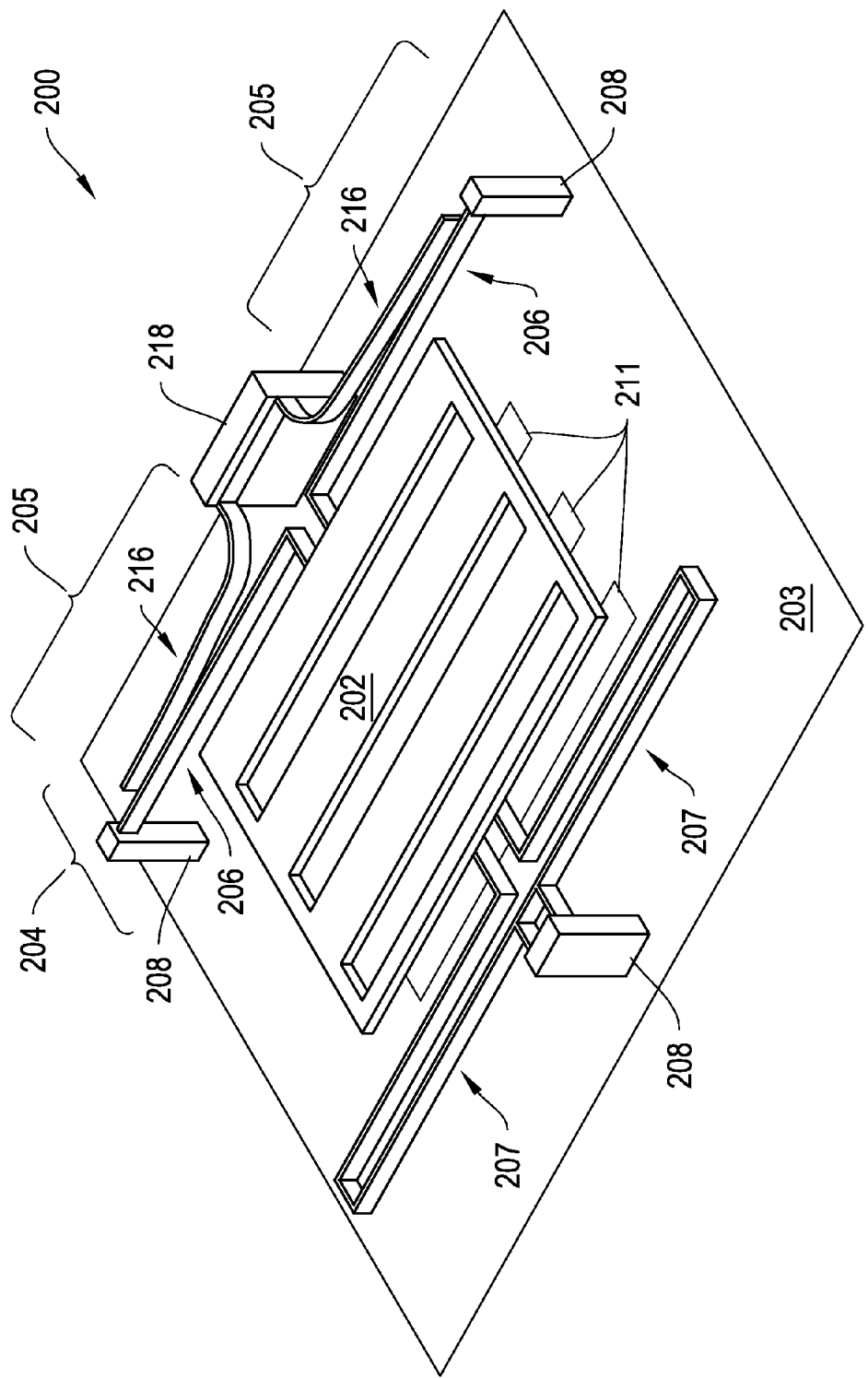
FIG. 2 shows an example perspective view of an illustrative shutter-based light modulator.

FIG. 2 shows an example perspective view of an illustrative shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a substrate 203 in a plane of motion which is substantially parallel to the substrate 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the substrate 203. The substrate 203 includes one or more aperture holes 211 for admitting the passage of light. The load anchors 208 physically connect the compliant load beams 206 and the shutter 202 to the substrate 203 and electrically connect the load beams 206 to a bias voltage, in some instances, ground.

If the substrate 203 is opaque, such as silicon, then aperture holes 211 are formed in the substrate 203 by etching an array of holes through the substrate 203. If the substrate 203 is transparent, such as glass or plastic, then the aperture holes 211 are formed in a layer of light-blocking material deposited on the substrate 203. The aperture holes 211 can be generally circular, elliptical, polygonal, serpentine, or irregular in shape.

Each actuator 204 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive beam anchor 218. The compliant load beams 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
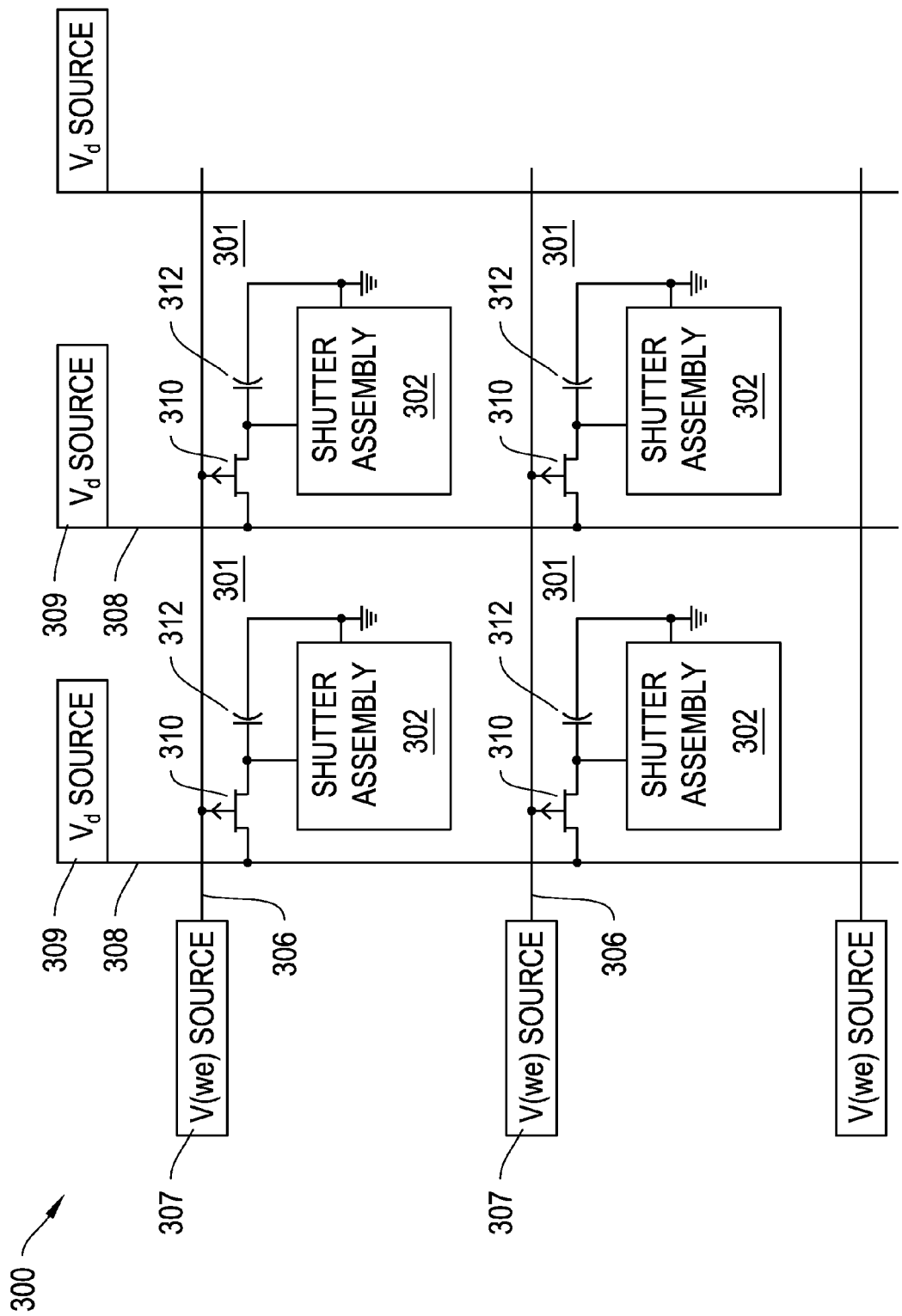
FIG. 3A shows an example schematic diagram of a control matrix.
Figure 3B:
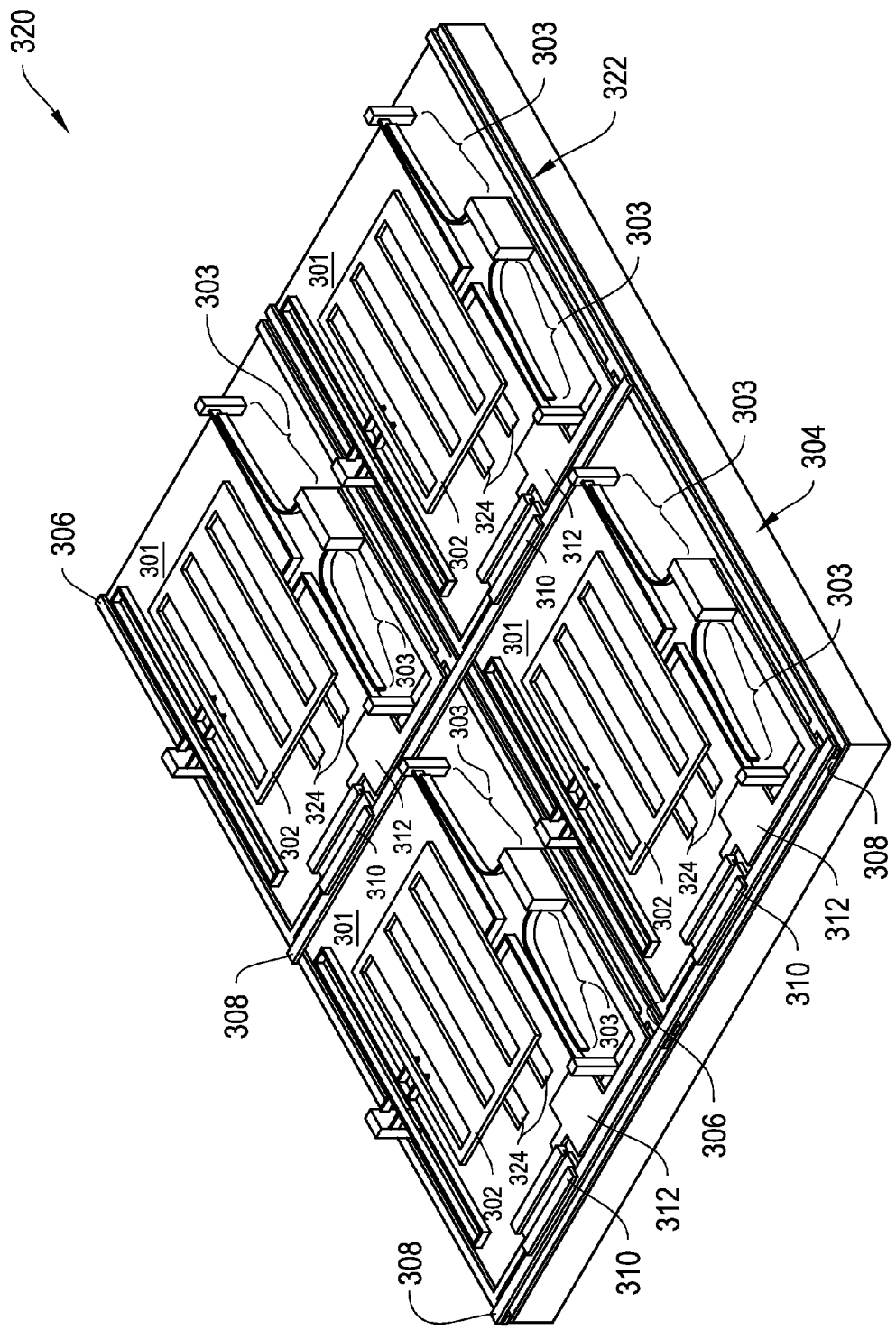
FIG. 3B shows an example perspective view of an array of shutter-based light modulators connected to the control matrix of FIG. 3A.

FIG. 3A shows an example schematic diagram of a control matrix 300. The control matrix 300 is suitable for controlling the light modulators incorporated into the MEMS-based display apparatus 100 of FIG. 1A. FIG. 3B shows an example perspective view of an array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("Vd source") to the pixels 301 in a corresponding column of pixels. In the control matrix 300, the Vd source 309 provides the majority of the energy to be used for actuation of the shutter assemblies 302. Thus, the data voltage source, Vd source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying Vwe to each scan-line interconnect 306 in turn. For a write-enabled row, the application of Vwe to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply Vwe to a row. Therefore, the voltage Vwe does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (such as open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

FIGS. 4A and 4B show example views of a dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows an overlap 416, which can be predefined, between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage Vm.

Figure 5:
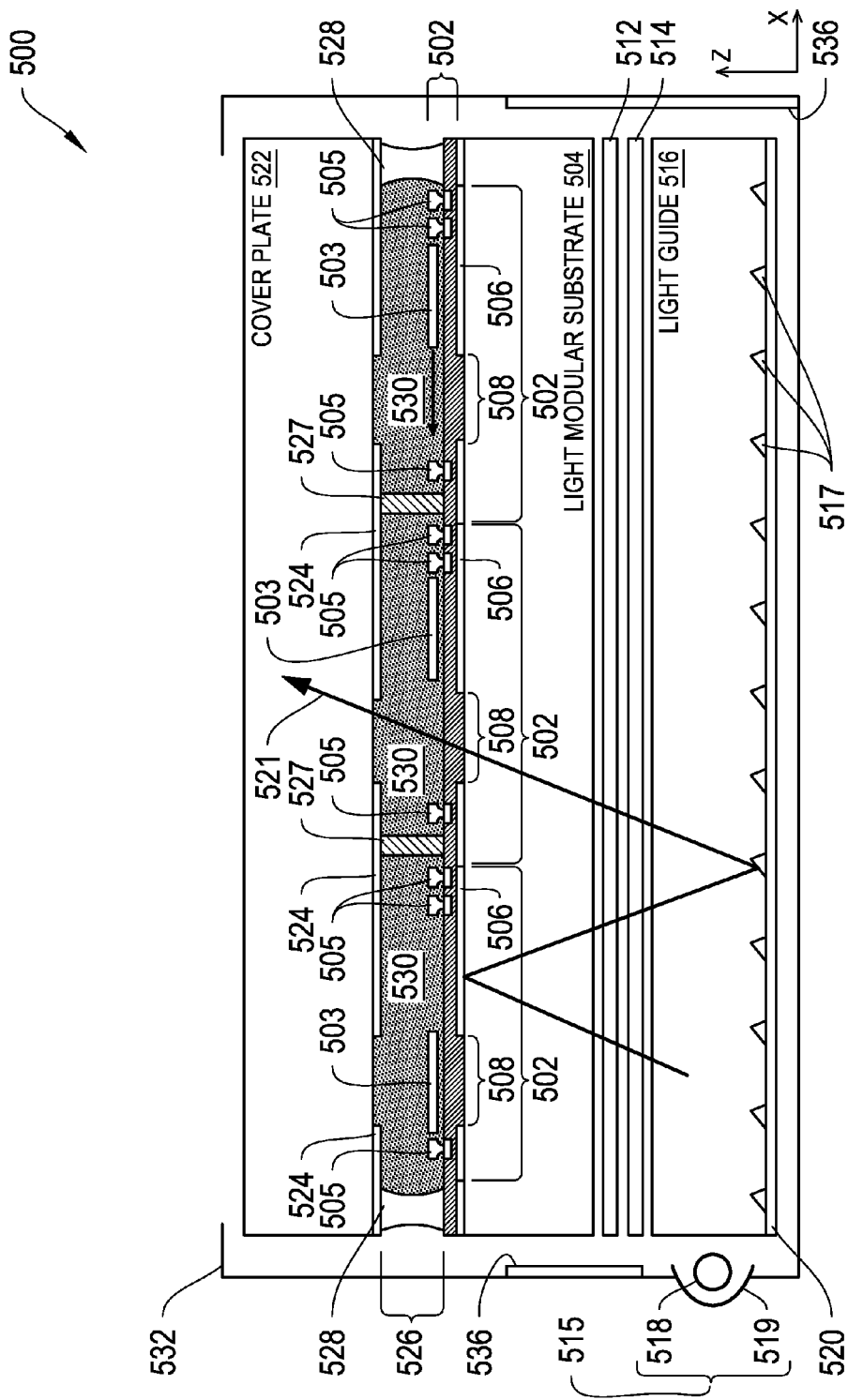
FIG. 5 shows an example cross sectional view of a display apparatus incorporating shutter-based light modulators.

FIG. 5 shows an example cross sectional view of a display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer or reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective film 506 can be a fine-grained metal film without inclusions formed in thin film fashion by a number of vapor deposition techniques including sputtering, evaporation, ion plating, laser ablation, or chemical vapor deposition (CVD). In some other implementations, the reflective film 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the reflective film 506 can be made of a light absorbing material, and in alternate implementations the surfaces of shutter 503 can be coated with either a light absorbing or a light reflecting material. In some other implementations, the reflective film 506 can be deposited directly on the surface of the light guide 516. In some implementations, the reflective film 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a distance away, which in some implementations may be predetermined, from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about 10$^4$ V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (such as with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, where the MEMS based light modulators are formed on a front surface of the substrate 504, i.e., the surface that faces toward the viewer. The shutter assemblies 502 are built directly on top of the reflective film 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective film 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
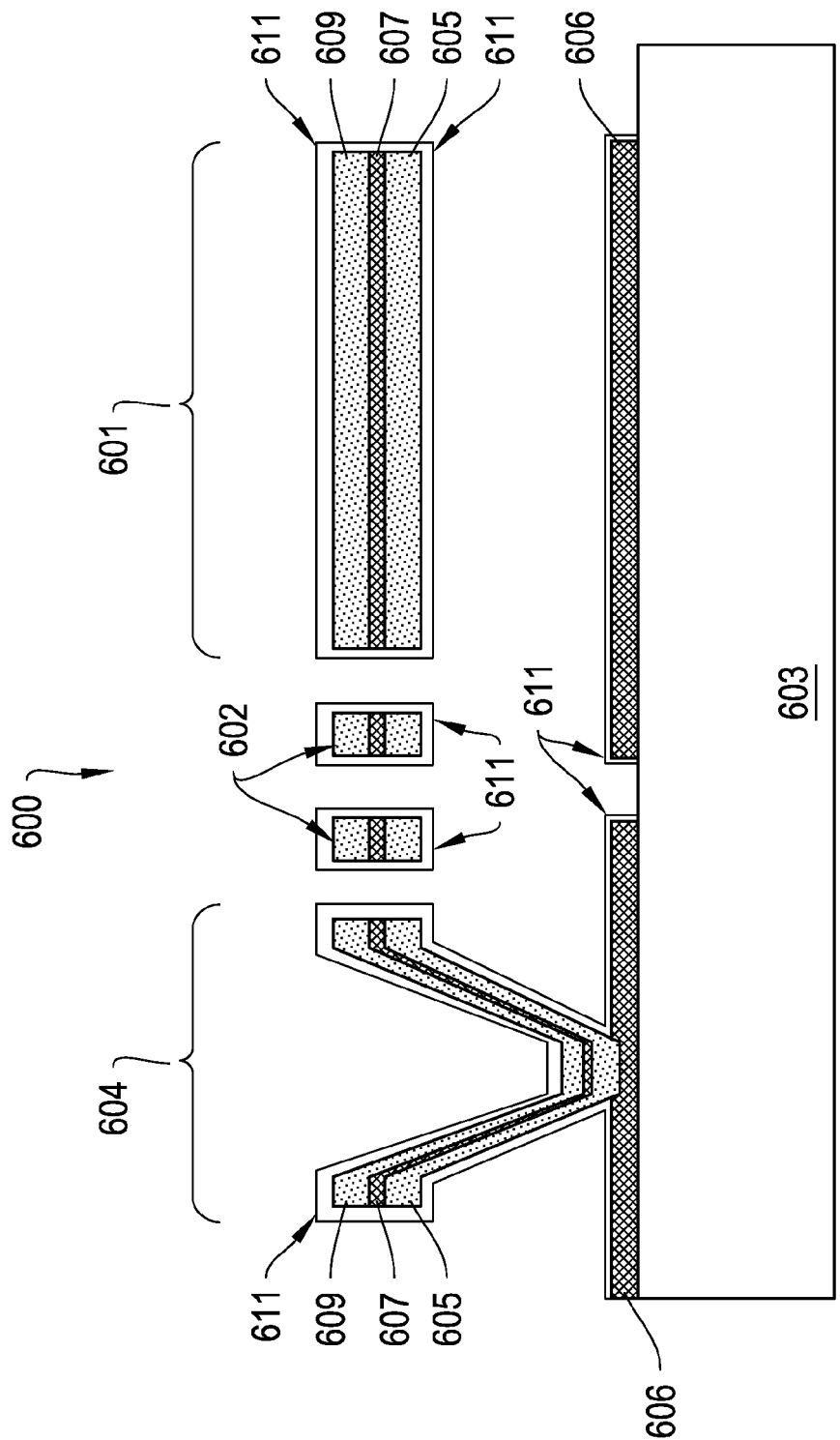
FIGS. 6A-6E show cross sectional views of stages of construction of an example composite shutter assembly.

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner. Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as $Al_2O_3$, chromium (III) oxide ($Cr_2O_3$), titanium oxide ($TiO_2$), hafnium oxide ($HfO_2$), vanadium oxide ($V_2O_5$), niobium oxide ($Nb_2O_5$), $Ta_2O_5$, $SiO_2$, or $Si_3N_4$, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
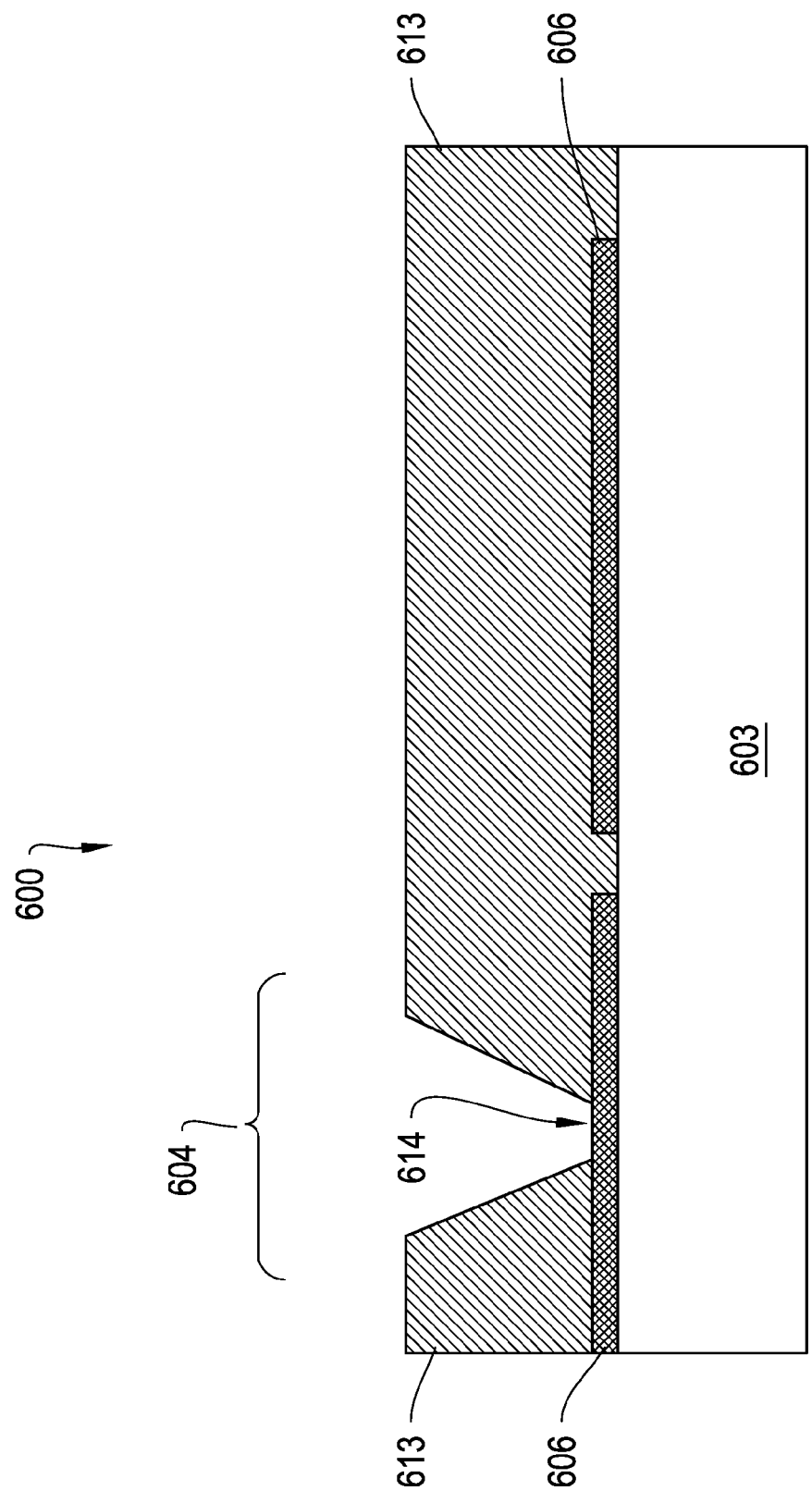

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of $SiO_2$ or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
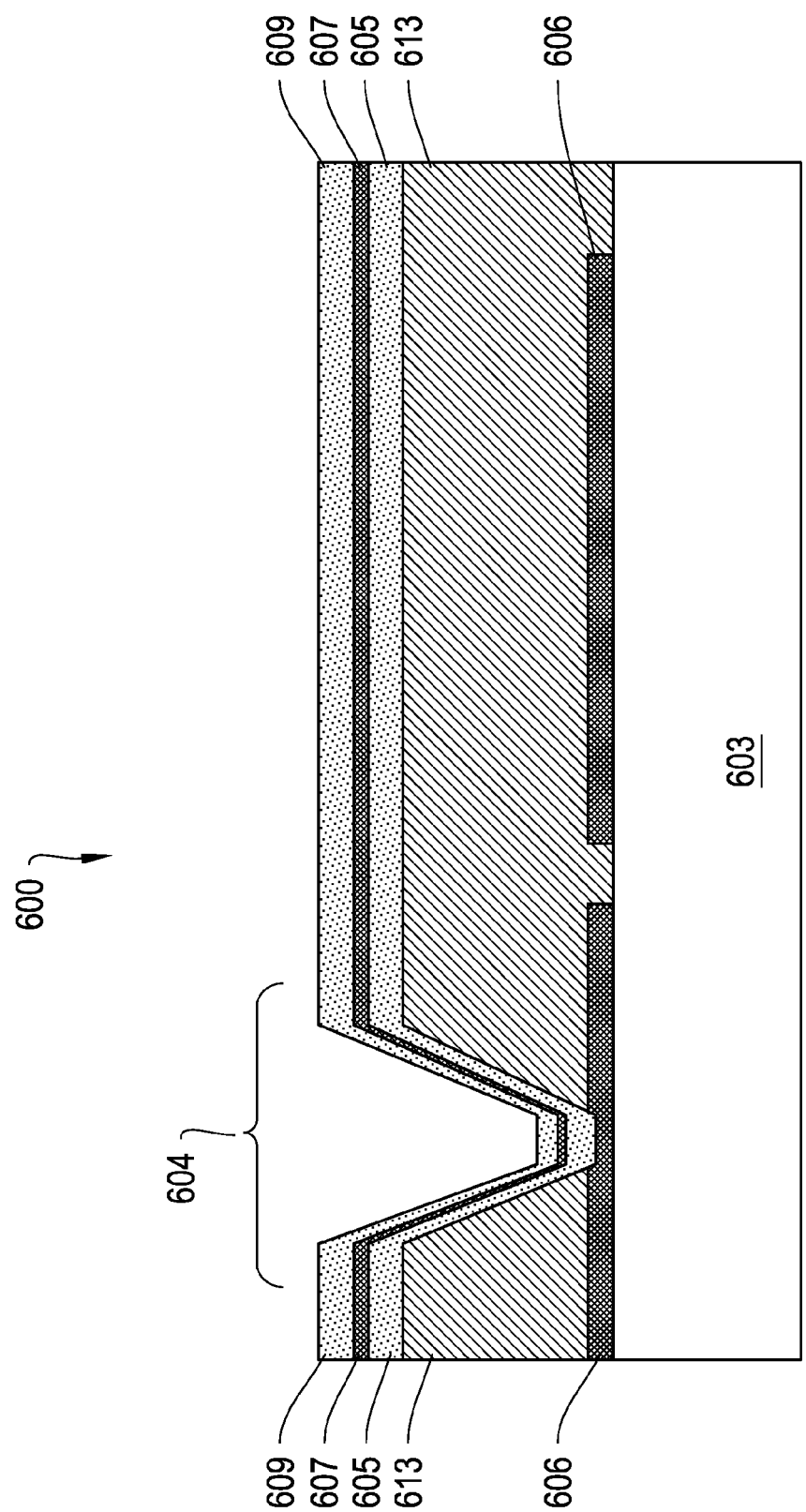

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas ($PH_3$) is used as a dopant so that the a-Si can be grown with resistivities below about 1 ohm-cm. In alternate implementations, a similar PECVD technique can be used for the deposition of $Si_3N_4$, silicon-rich $Si_3N_4$, or $SiO_2$ materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
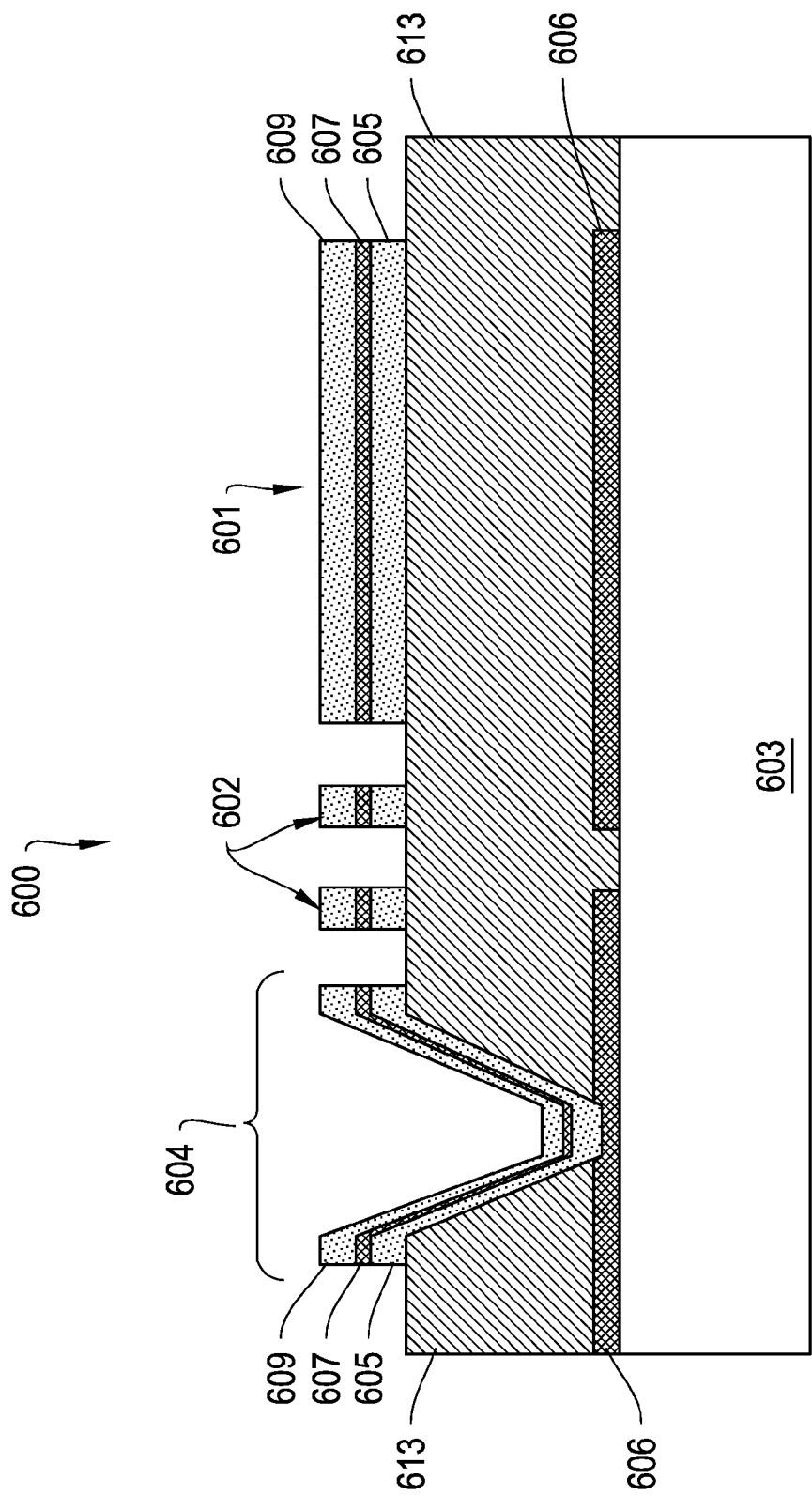

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, $Si_3N_4$, and $SiO_2$ can then be etched in fluorine-based plasma chemistries. $SiO_2$ mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

Figure 6E:
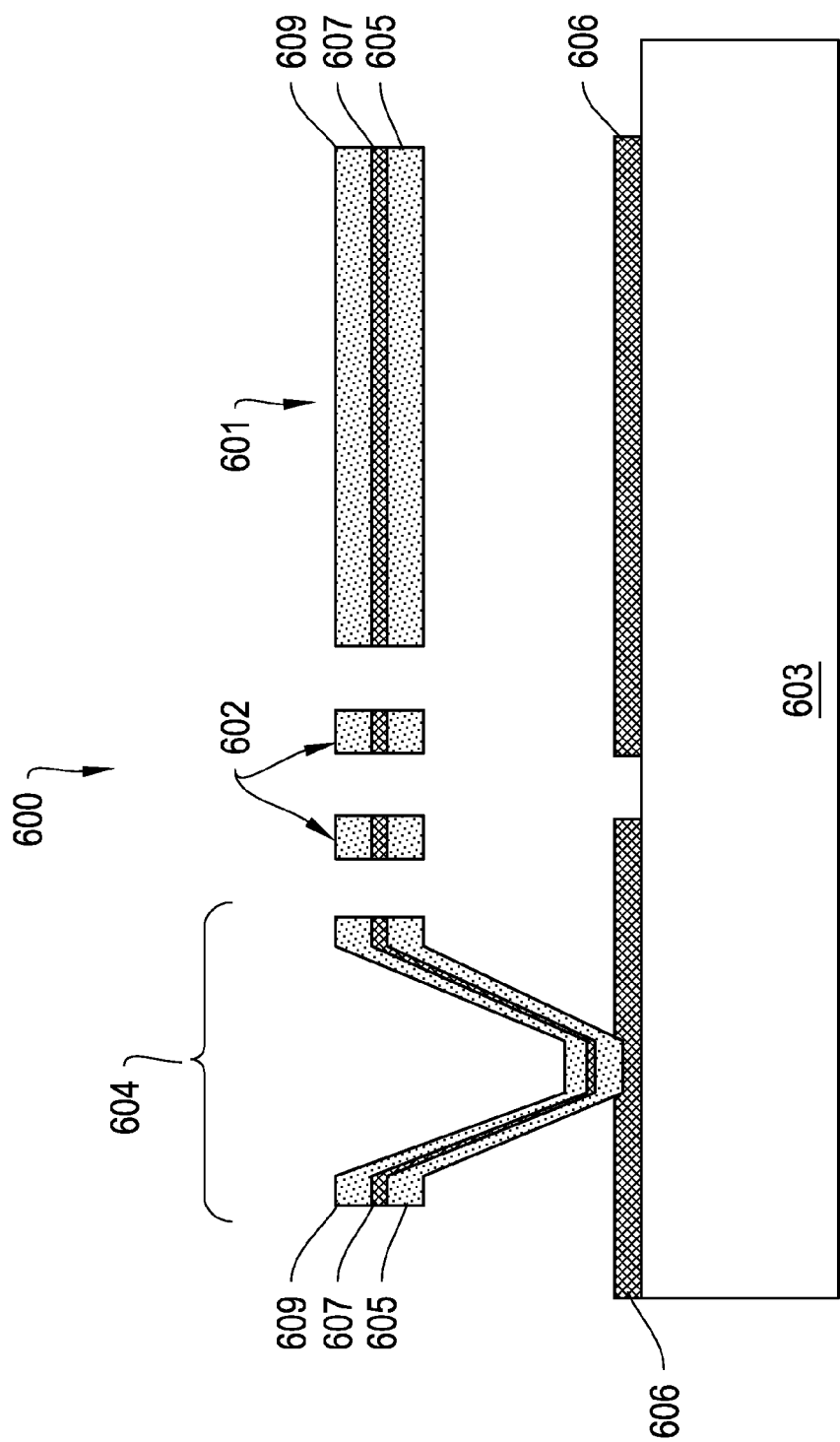

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as $SiO_2$) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, $Al_2O_3$ is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

Figure 7A:
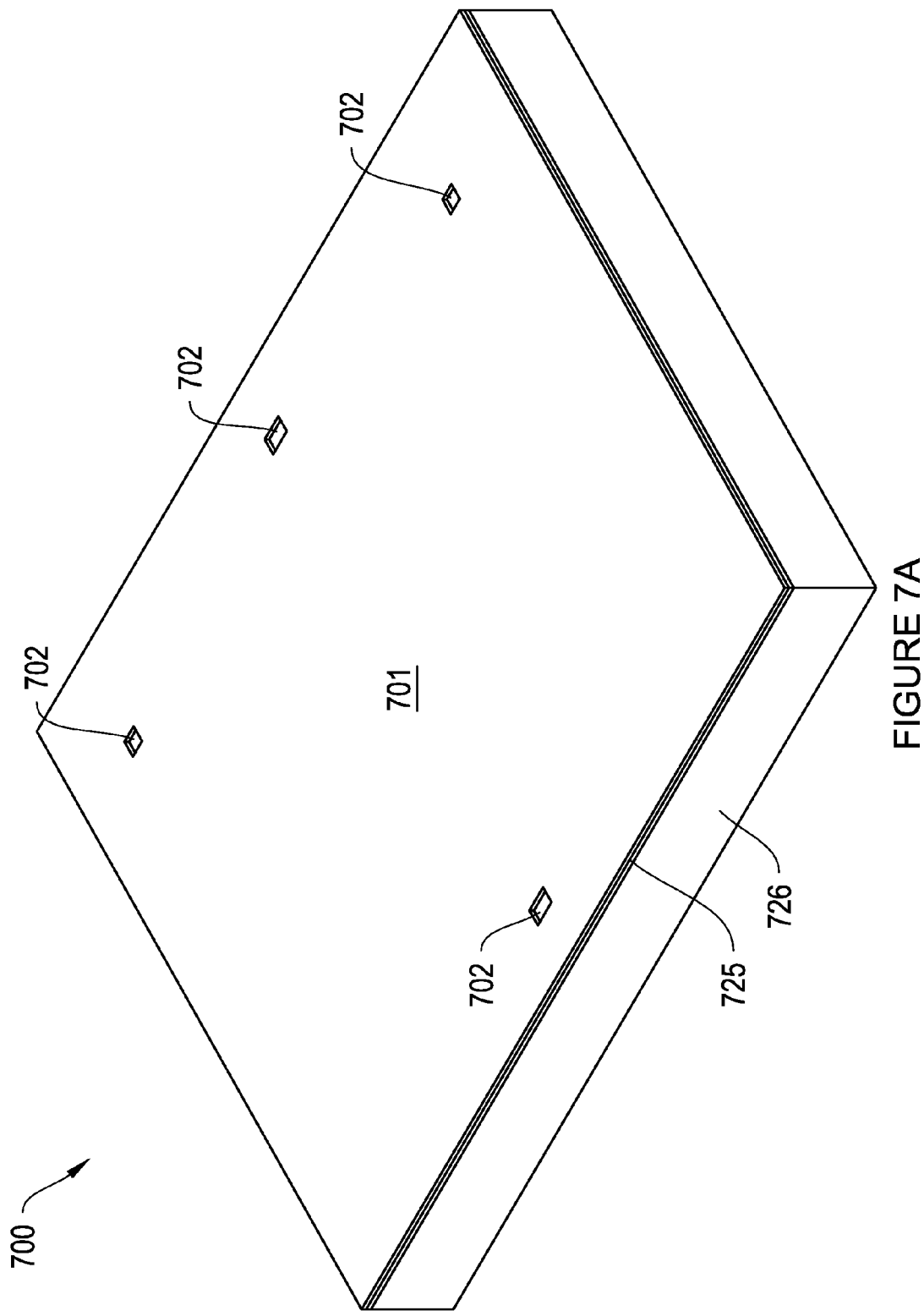
FIGS. 7A-7D show isomeric views of stages of construction of an example shutter assembly with narrow sidewall beams.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
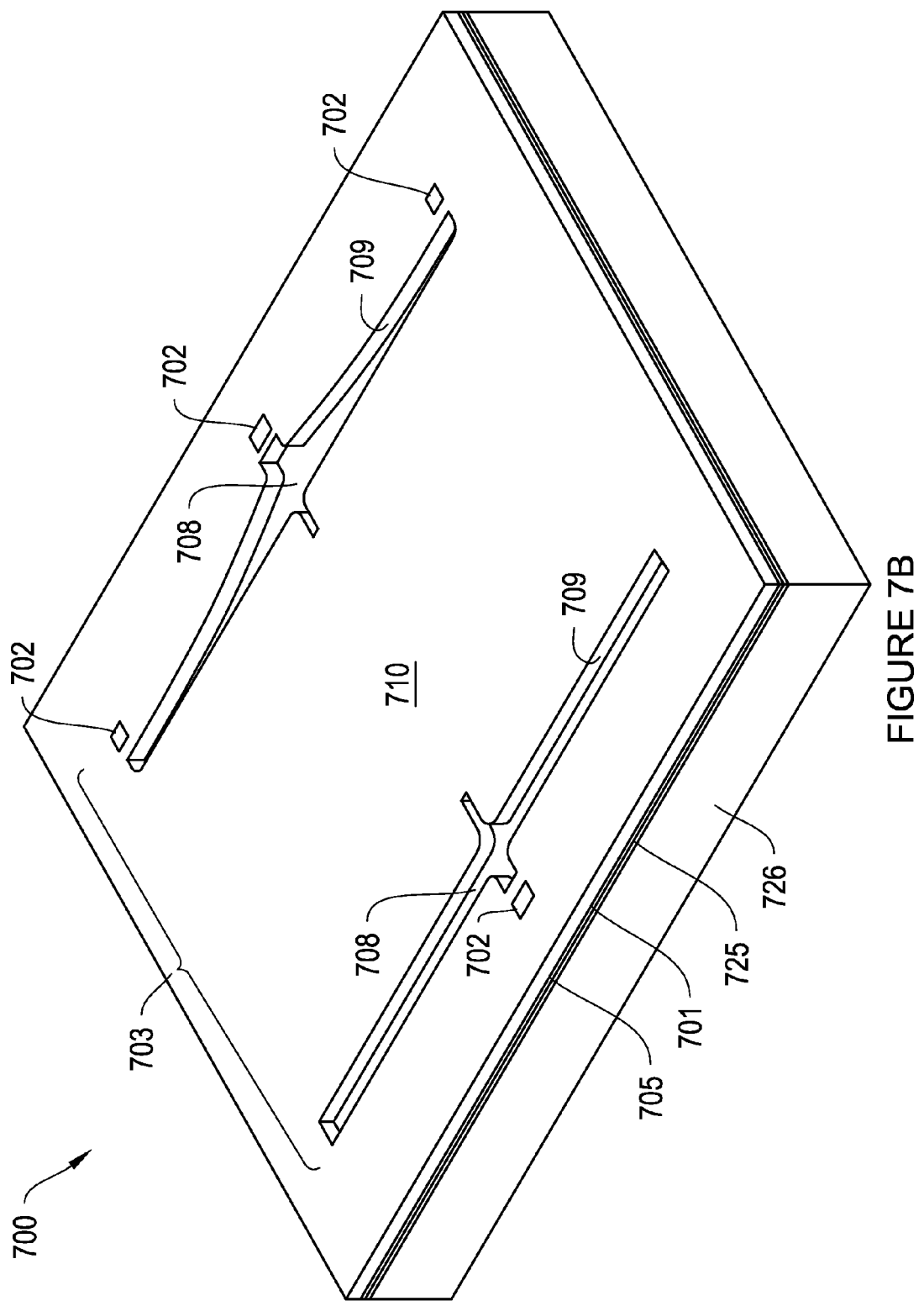

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
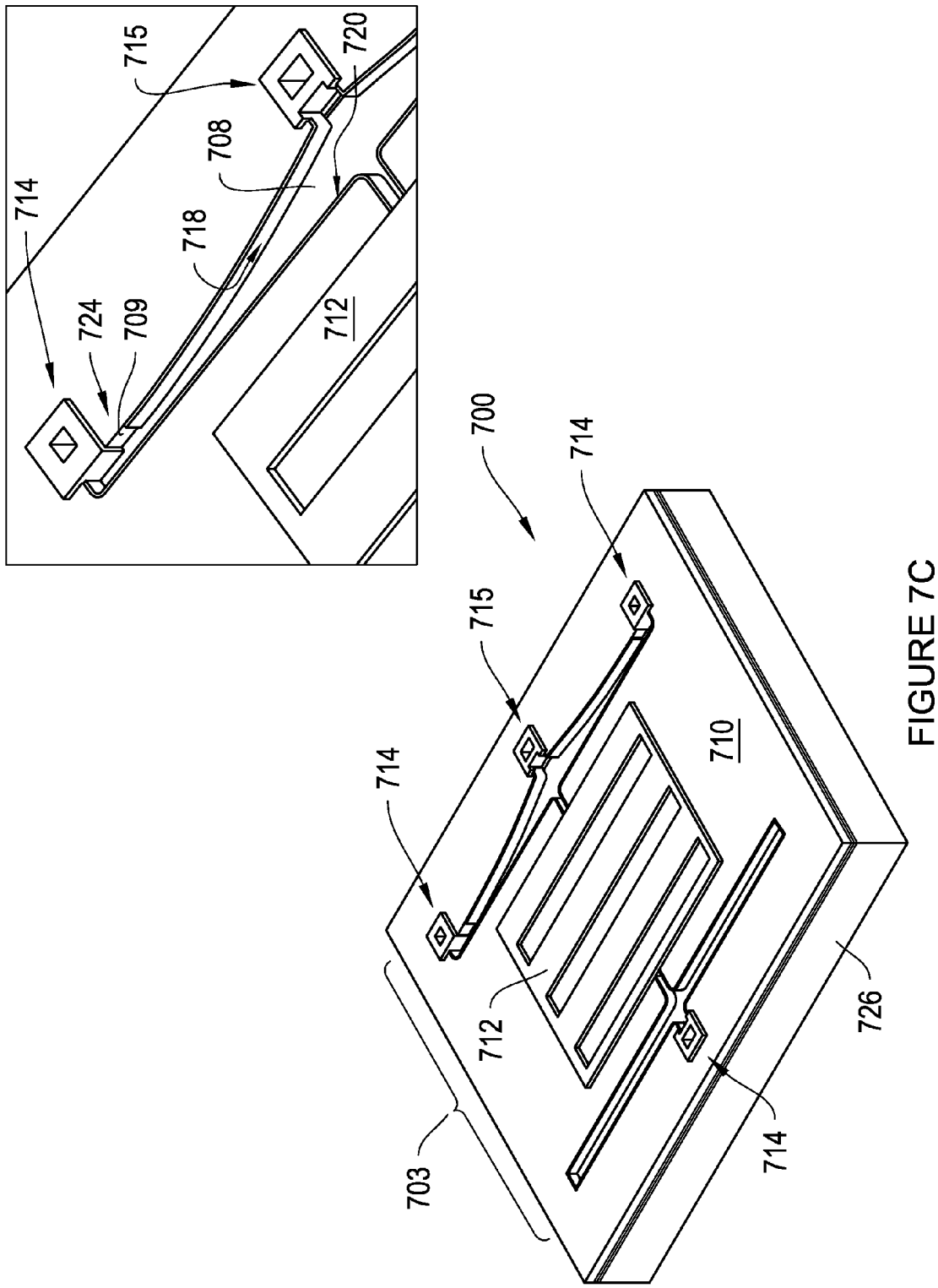

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity of the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane ($CHF_3$), perfluorobutene ($C_4F_8$), or chloroform ($CHCl_3$) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

Figure 7D:
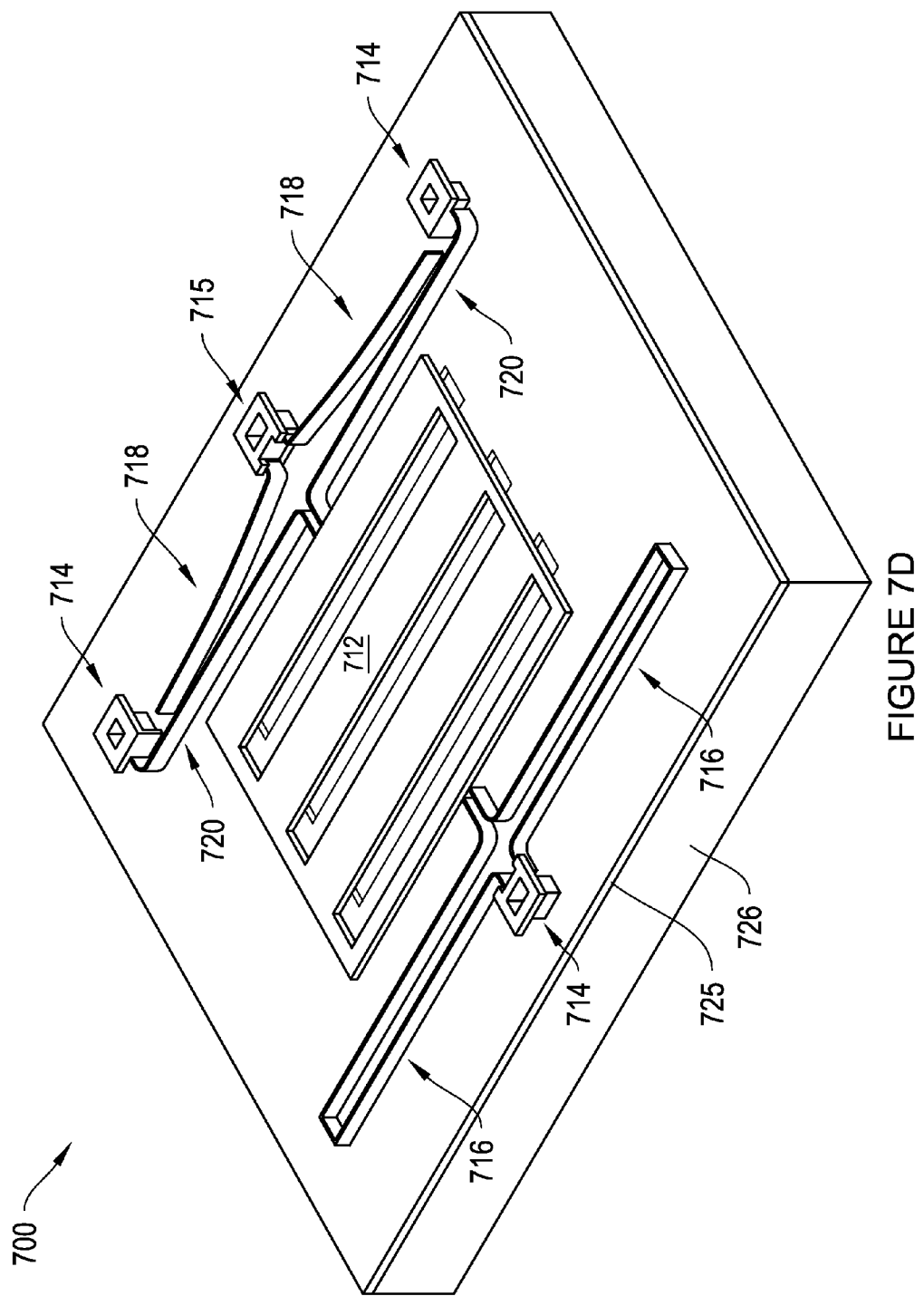

The process of forming the sidewall beams 716, 718 and 720 includes the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting the anchors 714 to the shutter 712, and also provides a passive restoring force and to counter the forces applied by the actuator formed from the compliant beams 718 and 720. The anchors 714 connect to an aperture layer 725. The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isometric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

Figure 8A:
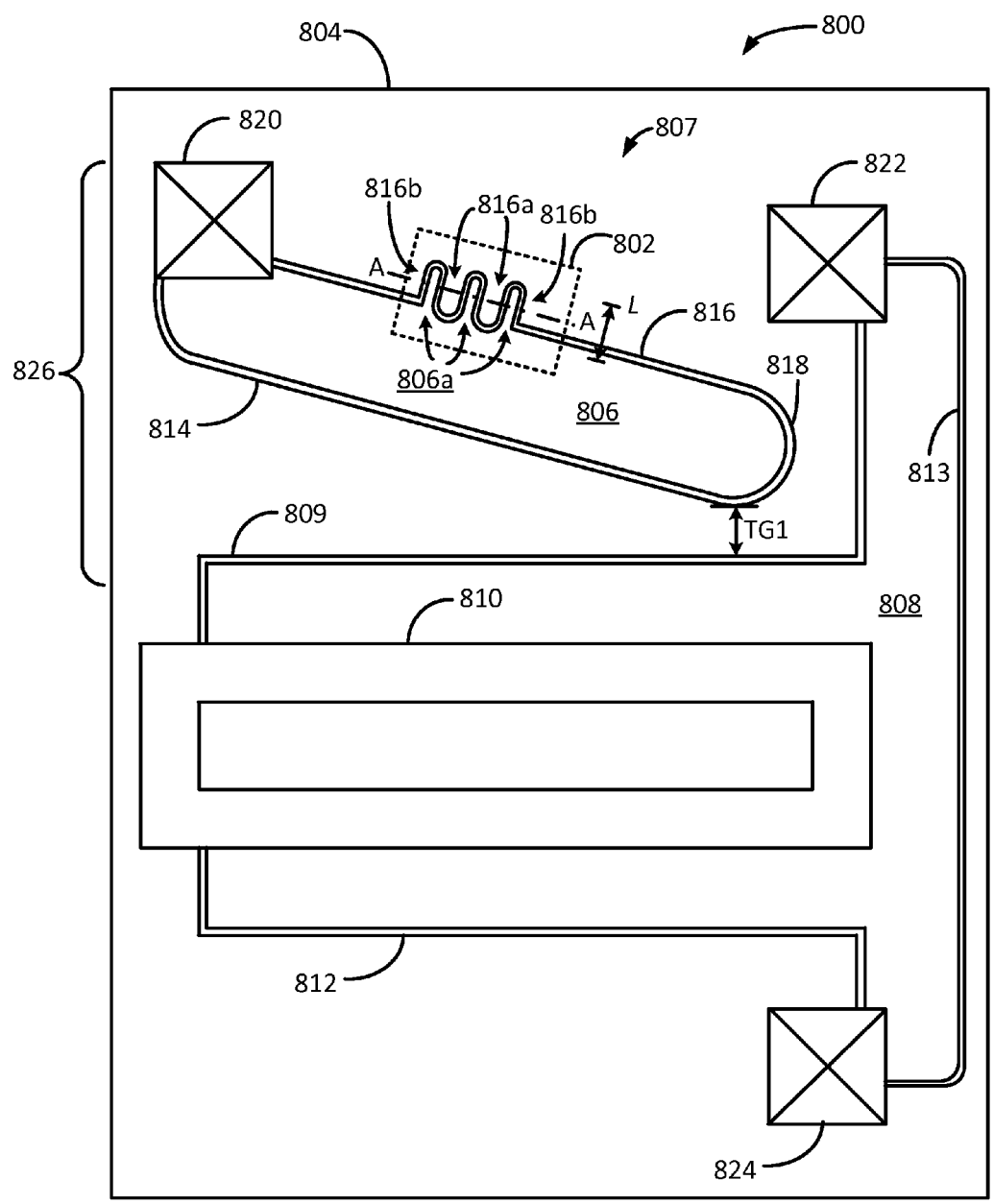
FIGS. 8A-8C show various views of an example shutter assembly having a first tip-gap adjustment feature.
Figure 8B:
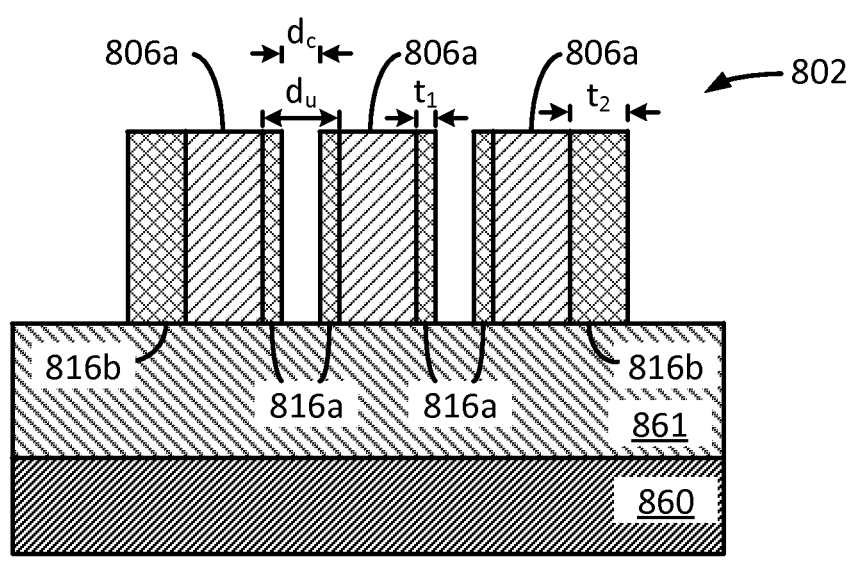
Figure 8C:
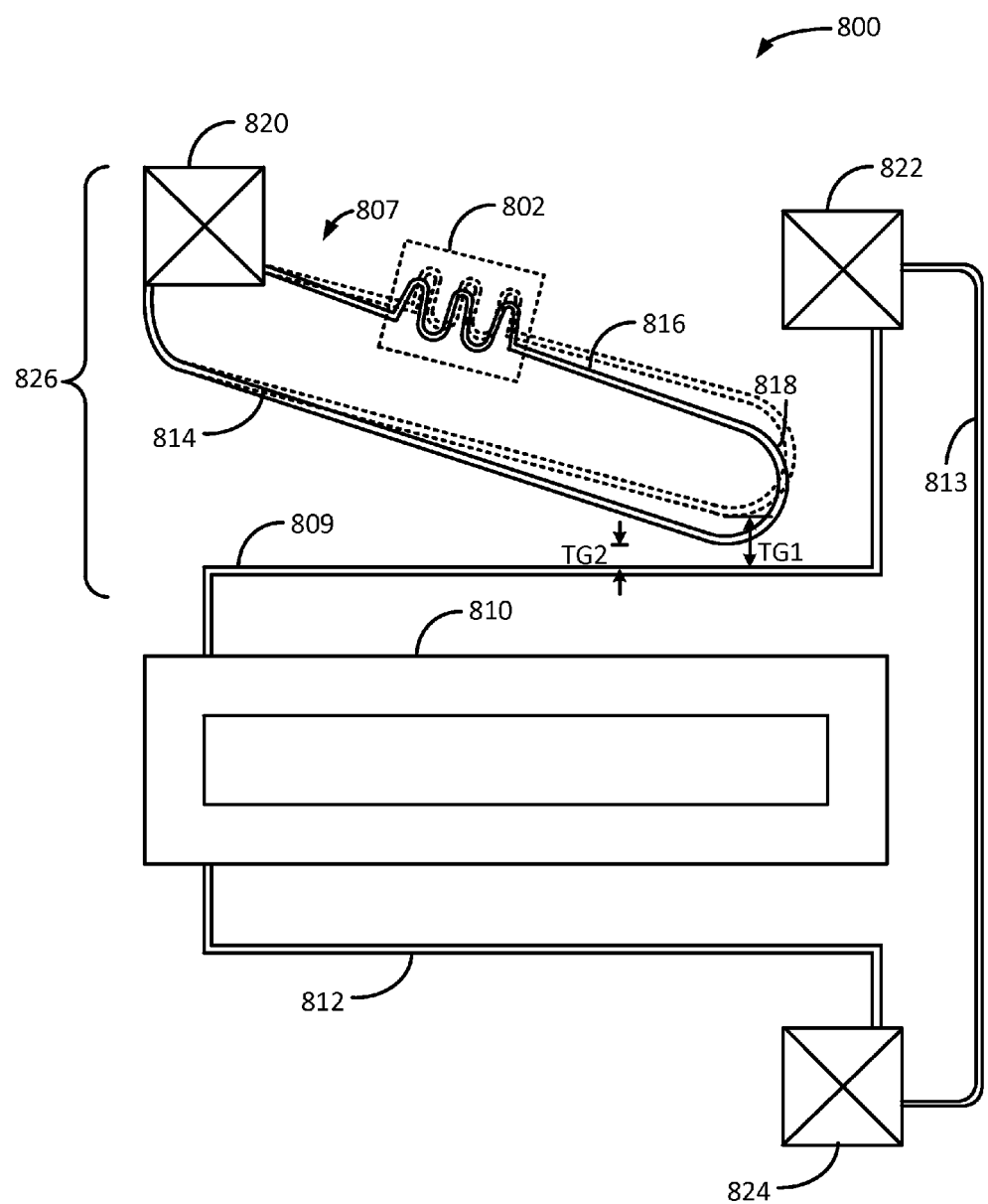

FIGS. 8A-8C show various views of an example shutter assembly 800 having a first tip-gap adjustment feature (TGAF). In particular, FIG. 8A shows a top view of the shutter assembly 800, FIG. 8B shows a cross-sectional view of the first TGAF, and FIG. 8C shows a top view of the shutter assembly 800 after release, illustrating a reduction in tip-gap as a result of the TGAF.

FIG. 8A shows the shutter assembly 800 having the first TGAF 802. Specifically, FIG. 8A shows the shutter assembly 800 at a stage of manufacture that precedes release of the shutter assembly 800, but that is after the stage in which the shutter assembly 800 has been patterned. The shutter assembly 800 is supported by a sacrificial mold 804. The sacrificial mold 804 can be similar to the second sacrificial mold 703 discussed in relation to FIG. 7B above. As such, the sacrificial mold 804 can also include two or more sacrificial material layers similar to the first sacrificial layer 701 and the second sacrificial material 705 also shown in FIG. 7B. The sacrificial mold 804 is patterned to form raised mold mesas that have substantially vertical sidewalls, which are utilized for forming narrow drive and load beams.

The sacrificial mold 804 includes raised portions, referred to as a first mold mesa 806 and a second mold mesa 808. An elongated, looped drive beam 807 is formed on the sidewalls of the first mold mesa 806, while the load beam 809, the shutter 810 and the spring beam 812 are formed on the sidewalls and the top surface of the second mold mesa 808. A peripheral beam 813 is also provided to enclose the second mold mesa 808 between the load beam 809, the spring beam 812 and the peripheral beam 813. One end of the peripheral beam 813 is coupled to the load anchor 822 while the other end is coupled to the spring anchor 824.

The looped drive beam 807, which is formed on the sidewalls of the first mold mesa 806, includes a first portion 814, a second portion 816 and connecting portion 818 that connects the first portion 814 to the second portion 816. The first portion 814 extends away from a drive anchor 820 adjacent to the load beam 809. The second portion 816, which is positioned behind the first portion 814 with respect to the load beam 809, also extends away from the drive anchor 820. The connecting portion 818 is a curved portion that connects the first portion 814 and the second portion 816 to complete the looped drive beam 807.

The load beam 809, which is formed on the sidewall of the second mold mesa 808, extends away from a load anchor 822 and connects to the shutter 810. The load beam 809 is situated in close proximity to the looped drive beam 807. The other end of the shutter 810 is connected to the spring beam 812, which extends away from a spring anchor 824.

The looped drive beam 807 entirely encloses the boundary of space formed by the first mold mesa 806. Similarly, the incorporation of the peripheral beam 813 allows the combination of the load beam 809, the spring beam 812 and the peripheral beam 813 to together, entirely enclose the boundary of space formed by the second mold mesa 808. This is in contrast with the drive beam 718 shown in FIG. 7C, which does not entirely enclose any portion of the mold 703. Instead, to achieve the desired operation, the drive beam 718 requires separation from the anchor 714 at the termination region 724, all shown in FIG. 7C. The separation is typically achieved by an additional photolithography process, which can be costly. But the shutter assembly 800 of FIG. 8A does not require any such separation of the looped drive beam 807 to perform its desired operation. Thus, by building the shutter assembly 800 in a manner such that features of the shutter assembly 800 entirely enclose boundaries of spaces formed by the mold 804, additional costly photolithography processes are avoided.

The looped drive beam 807 and the load beam 809 form an actuator 826, which when actuated, during normal operation of the shutter assembly 800, results in electrostatic forces that pull the load beam 809 towards the looped drive beam 807. This causes the shutter 810 to move substantially parallel to a substrate, and towards the looped drive beam 807. When the actuator 826 is relaxed, the spring beam 812 pulls the shutter 810 back in the opposite direction.

In some implementations, the shutter assembly 800 can include a second actuator in addition to the actuator 826 shown in FIG. 8A. In such implementations, the second actuator, instead of the spring beam 812, can be utilized to pull the shutter 810 in a direction opposing the direction in which the first actuator 826 pulls the shutter 810. The second actuator can be similar to the actuator 826, in that the second actuator can also include a looped drive beam and a load beam coupled to the shutter 810 on the opposite side to which the load beam 809 is coupled to the shutter. Furthermore, the looped drive beam of the second actuator can also include a TGAF similar to the TGAF 802 shown on the looped drive beam 807. The looped drive beam of the second actuator can be formed on a mold mesa similar to the mold mesa 806 over which the looped derive beam 807 is formed, while the load beam of the second actuator can be formed on the sidewalls of the first mold mesa 808. Appropriate actuation and relaxation of the second actuator in conjunction with the actuation and relaxation of the actuator 826 can be used to move the shutter 810 in a desired position.

The actuator 826 is actuated by applying an actuation voltage across the looped drive beam 807 and the load beam 809. The magnitude of the actuation voltage needed to effectively operate the shutter assembly 800 is a function, in part, of the distance between the tip of the looped drive beam 807 and the load beam 809, also known as the tip-gap. Particularly, the actuation voltage needed decreases with a decrease in the tip-gap. As shown in FIG. 8A, the tip-gap between the looped drive beam 807 and the load beam 808 is indicated by the first tip-gap TG1.

The second portion 816 of the looped drive beam 807 includes the first TGAF 802, which is utilized in reducing the first tip-gap TG1. The first TGAF 802 includes multiple U-shaped beam regions that are formed on the sidewalls of multiple projections 806a extending out from the first mold mesa 806. More particularly, the TGAF 802 includes generally U-shaped beam regions 816a formed within narrow channels located between the projections 806a and outer beam regions 816b formed on the outside of the outermost projections 806a. Some exemplary dimensions of the TGAF 802 and the narrow channels between the projections 806a and outer beam regions 816b are provided below in the discussion of FIG. 8B.

FIG. 8B shows a cross-sectional view along axis A-A of the first TGAF 802 shown in FIG. 8A. The cross-sectional view shows a substrate 860 over which a first sacrificial layer 861 is deposited. The substrate 860 and the first sacrificial layer 861 can be similar to the substrate 726 and the first sacrificial layer 701 discussed above in relation to FIGS. 7A and 7B. FIG. 8B also shows cross-sections of the projections 806a of the first mold mesa 806, the U-shaped beam regions 816a, and the outer beam regions 816b of the second portion 816 of the looped drive beam 807. As mentioned above, the U-shaped beam regions 816a are formed on the sidewalls of the projections 806a within the narrow channels between the projections 806a while the outer beam regions 816b are formed on the outside of the outermost projections 806a, as shown in FIG. 8A.

Gaps $d_u$ between opposing walls of adjacent projections 806a are relatively narrow, resulting in deep, narrow channels between the projections 806a. With such geometry, when the beam material is deposited on the sidewalls of the projections 806a, fewer deposition ions of the deposition material reach and coat the sidewalls of the projections 806a within these deep narrow channels. As result, the thickness $t_1$ of the U-shaped beam regions 816a within these channels is less than the thickness $t_2$ of the outer beam regions 816b formed outside of the channels and over the remainder of second portion 816 of the looped drive beam 807.

The thinner U-shaped beam regions 816a, because of their geometry and variations in thickness develop a certain amount of stress or a stress gradient. When the shutter assembly 800 is released, that is, when the sacrificial mold 804 is removed, this stress or stress gradient causes the generally U-shaped beam regions 816a to widen. FIG. 8C shows the shutter assembly 800 after being released from the sacrificial mold 804. The stress in the first TGAF 802 causes the first TGAF 802 to widen. As a result of this widening, the looped drive beam 807 bends closer towards the load beam 809 resulting in a reduction in the tip-gap to TG2. For comparison, the original position of the looped drive beam 807 prior to release is shown in broken lines.

In some implementations, the reduction in the tip-gap is about 0.1 to 2 microns, or about 50% of the tip-gap without a TGAF. The reduction in the tip-gap results in a reduction in the actuation voltage needed by the actuator 826 for operating the shutter assembly 800. For example, the reduction of tip gap from 3 microns to 2 microns could result in a reduction in the actuation voltage from about 25V to about 15V (or a reduction of up to about 50%)

In some implementations, the channel width (indicated in FIG. 8B by $d_c$) between the U-shaped beam regions 816a of the first TGAF 802 can be around 3 to 6 microns. As photolithography processes improve, these the channel widths may reduce further. In some implementations, a length of the U-shaped beam regions 816a within a plane that is parallel to the substrate, and indicated by L in FIG. 8A, can be around 4 to 8 microns.

In some implementations, the U-shaped beam regions 816a of the first TGAF 802 may not be adjacent to each other as shown in FIG. 8A. Instead, the U-shaped beam regions 816a may be distributed over the length of the second portion 816 of the looped drive beam 807. In some implementations, this can be achieved by forming narrow channels into the body of the first mold mesa 806 instead of between projections extending out from the first mold mesa 806. The beam material deposited on the sidewalls of the first mold mesa 806 within these narrow channels form U-shaped beam regions that are thinner than the remainder of the second portion 816 of the looped drive beam 807. In such implementations, the combined action of the distributed U-shaped beam regions can cause the looped drive beam 807 to bend towards the load beam 809. In such implementations, the thicknesses of the second portion 816 along the U-shaped beam regions would be less than the thickness of the remainder of the second portion 816 of the looped drive beam 807.

Figure 8D:
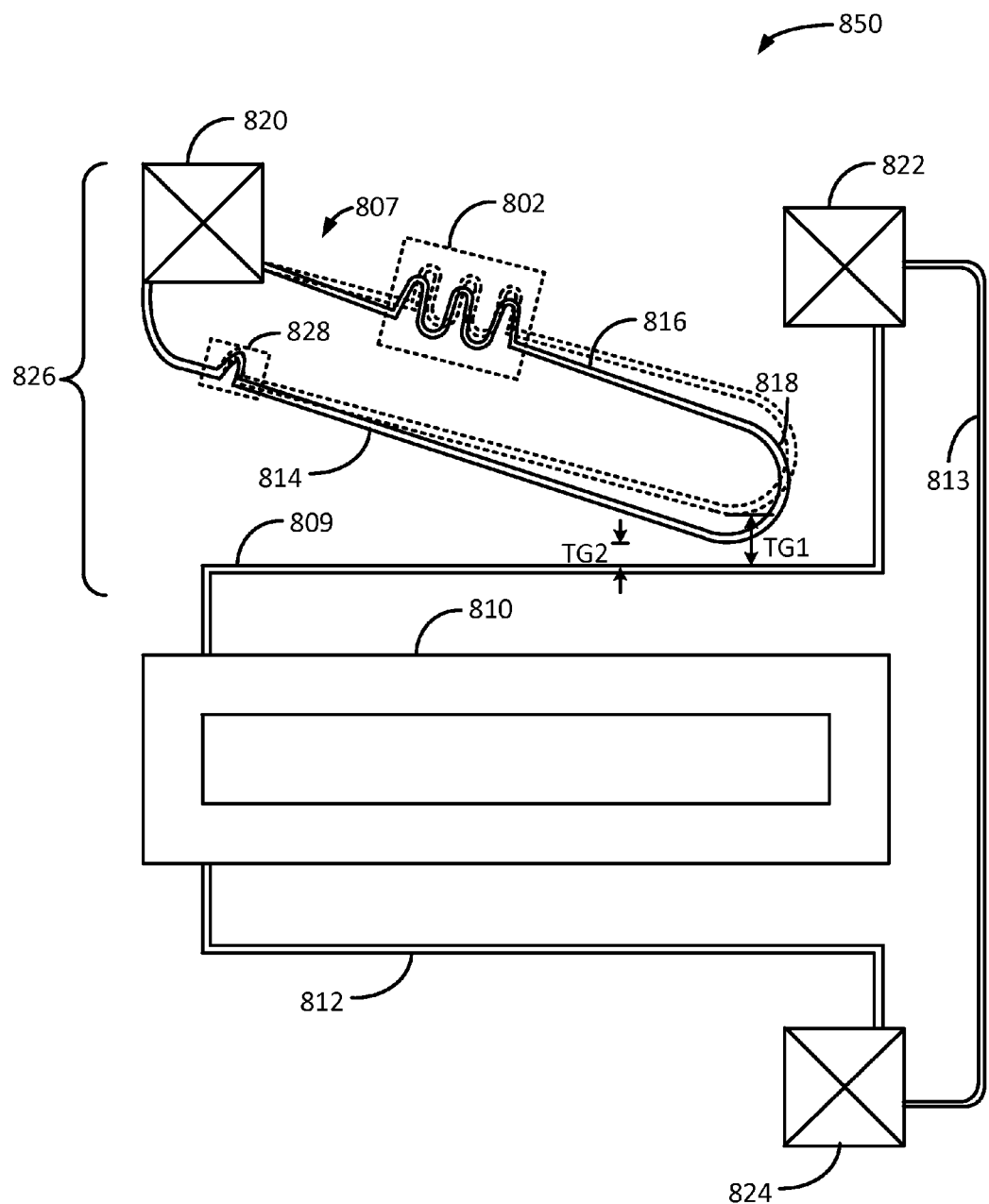
FIG. 8D shows a top view of another example shutter assembly including the first tip gap adjustment feature.

FIG. 8D shows a top view of another example shutter assembly 850 including the first TGAF 802. The shutter assembly 850 includes a generally U-shaped segment 828 within the first portion 814 of the looped drive beam 807 in addition to the first TGAF 802 incorporated into the second portion 816 of the looped drive beam 807. In some implementations, the U-shaped segment 828 can have relatively smaller dimensions than that of a single U-shaped beam region 816a of the first TGAF 802. As discussed above, the widening of the first TGAF 802 causes the looped drive beam 807 to bend towards the load beam 809. The bending of the looped drive beam 807 also causes the first portion 814 to bend towards the load beam 809. The U-shaped segment 828 allows the first portion 814 to more easily bend at the U-shaped segment 828. As such, the U-shaped segment 828 can act as a hinge along which the first portion 814 can bend. Thus, by allowing the first portion 814 to bend more readily, the U-shaped segment 828 reduces the stiffness of the first portion 814. This reduced stiffness in the first portion 814 can allow the looped drive beam 807 to bend even further towards the load beam 809, thus, further reducing the tip gap TG2. In some implementations, the first portion 814 may include more than one U-shaped segment 828.

Figure 9A:
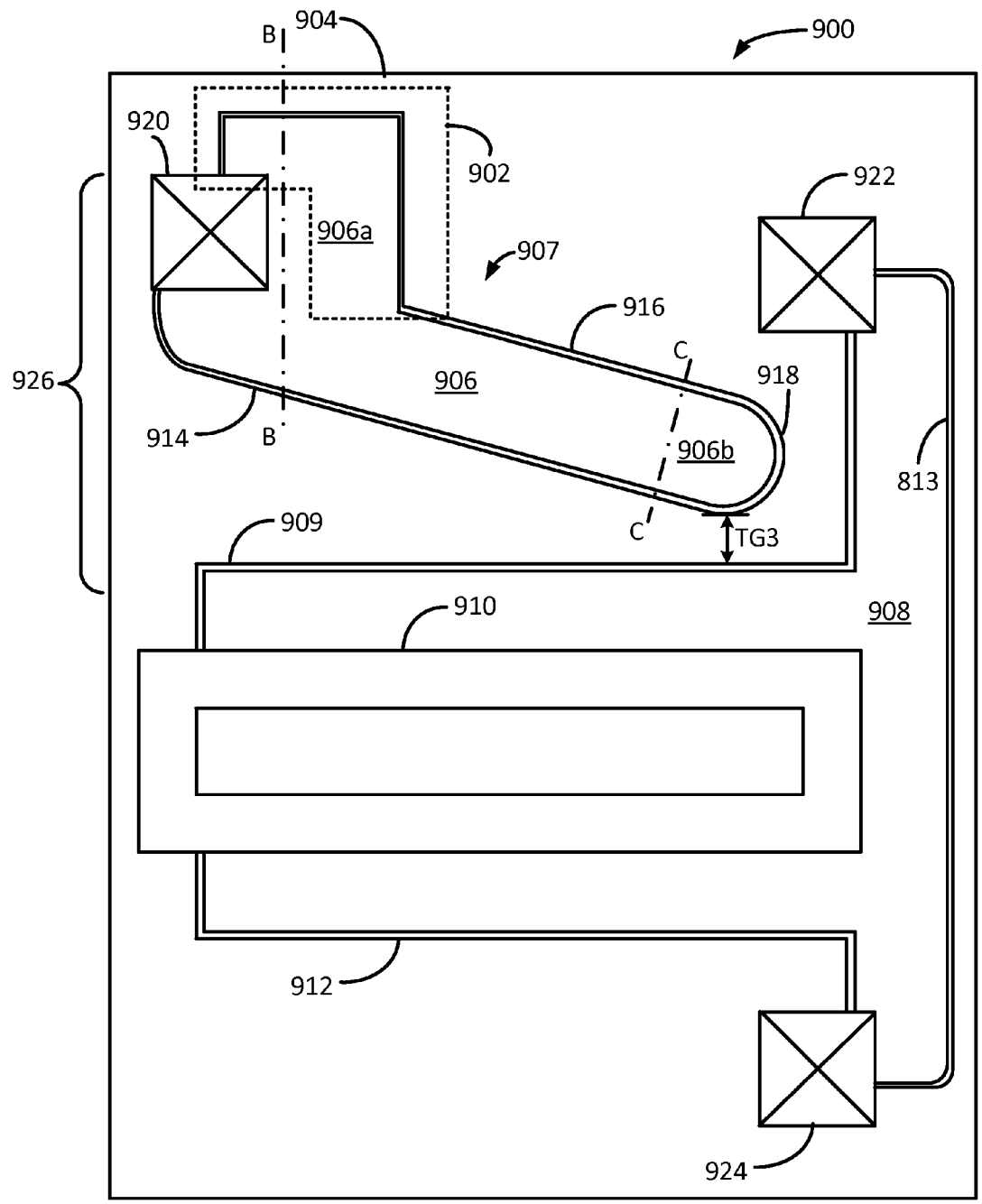
Figure 9H:
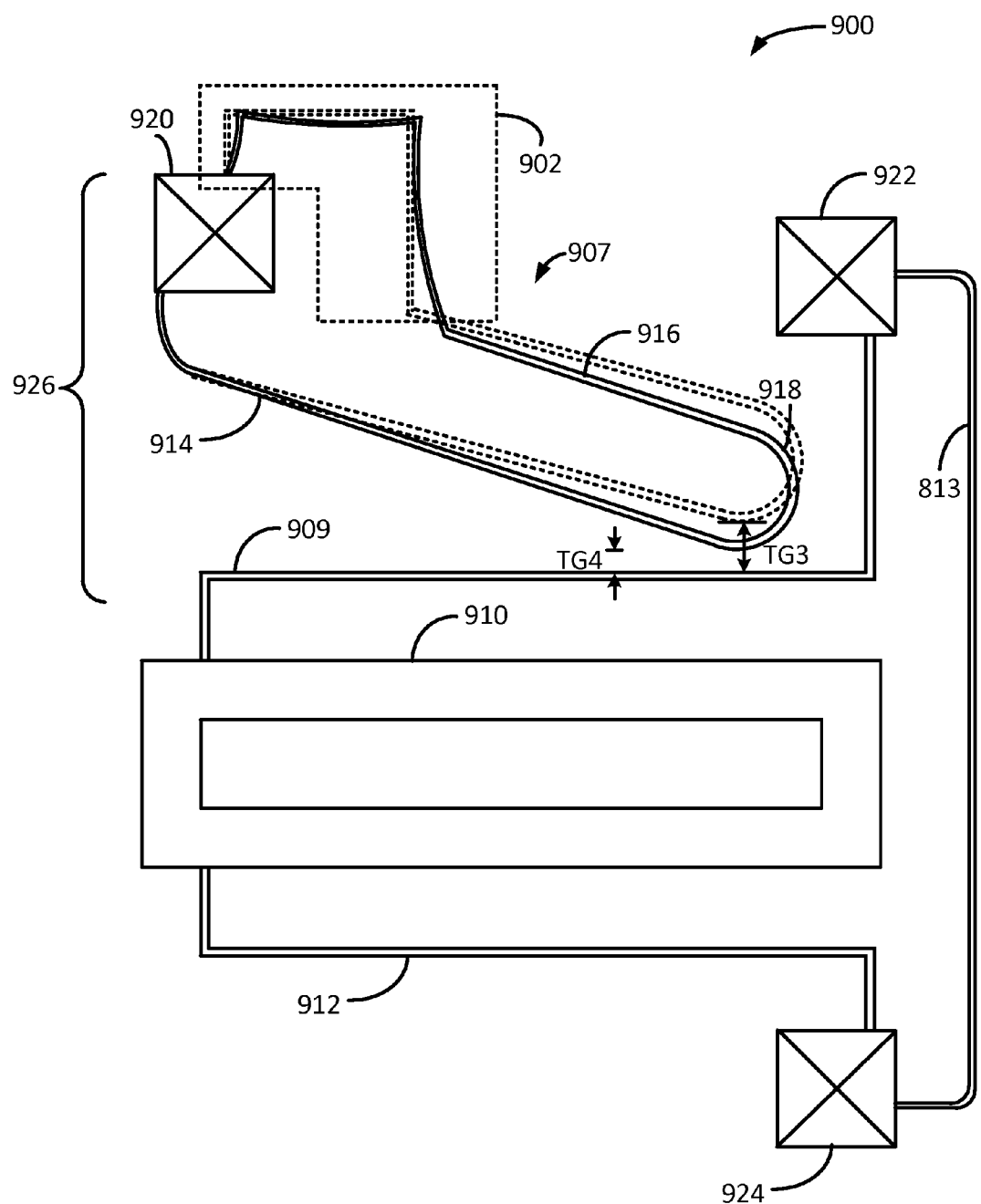

FIGS. 9A-9H show various views of an example shutter assembly 900 having a second tip-gap adjustment feature (TGAF) 902. In particular, FIG. 9A shows a top view of the shutter assembly 900, FIGS. 9B-9G show cross-sectional views of a mold 904 and the shutter assembly 900, and FIG. 9H shows a top view of the shutter assembly 900 after release, illustrating a reduction in tip-gap due to the TGAF 902.

Similar to FIG. 8A, FIG. 9A shows the shutter assembly 900 at a stage of manufacture that precedes the release of the shutter assembly 900 from a sacrificial mold 904. The shutter assembly 900 includes an actuator 926, which includes a looped drive beam 907 and a load beam 909. The looped drive beam 907 is coupled to a drive anchor 920 and surrounds a first mold mesa 906. The looped drive beam 907 includes a first portion 914, a second portion 916 and a connecting portion 918. The load beam 909 has one end coupled to a load anchor 922 and the other end coupled to a shutter 910. The looped drive beam 907 and the load beam 909 have a tip-gap denoted by TG3.

The mold 904 also includes a second mold mesa 908 having sidewalls over which the load beam 909, a spring beam 912 and a peripheral beam 913 are formed. The spring beam 912 has one end coupled to the shutter 910 and the other end coupled to the spring anchor 924. The shutter 910 is formed on the top surface of the second mold mesa 908. The peripheral beam 913 has one end coupled to the load anchor 922 and the other end coupled to the spring anchor 924. Similar to the shutter assembly 800 shown in FIG. 8A, the shutter assembly 900 entirely surrounds the mold mesas over which the shutter assembly 900 is built. For example, the looped drive beam 907 entirely surrounds the first mold mesa 906, and the combination of the load beam 909, the spring beam 912, and the peripheral beam 913 entirely surround the second mold mesa 908, reducing the number of photolithography steps needed to build the shutter assembly 900.

The looped drive beam 907 includes a second TGAF. In particular, the second portion 916 of the looped drive beam 907 includes a shallow-angled segment 902 between the second portion 916 and the drive anchor 920. The shallow-angled segment 902 partially surrounds a portion 906a (hereinafter referred to as "the proximal mesa portion 906a") of the first mold mesa 906 that is proximal to the anchor 920. The shallow-angled segment 902 is configured to be thinner than at least a part of the second portion 916. This variation in thickness between the shallow-angled segment 902 and the remainder of the second portion 916 results in a stress or stress gradient within the looped drive beam 907 such that, after release, the tip of the looped drive beam 907 bends towards the load beam 909, reducing the tip-gap TG3.

In some implementations, the thinner shallow-angled segment 902 is a result of disproportionate etching of the beam material forming the shallow-angled segment 902 in comparison to the etching of the beam material forming the remainder of the second portion 916 of the looped drive beam 907. The shallow-angled segment 902 is formed on the sidewalls of the proximal mesa portion 906a. This proximal mesa portion 906a is relatively larger in area than a distal mesa portion 906b of the first mold mesa 906. In some implementations, some portions of the mold mesa contract during the process of curing the mold, prior to the deposition of the beam material. The extent to which a portion contracts is a function, in part, of the area of the portion. For example, portions with larger area may contract more than portions with relatively smaller area. Thus, during the curing process of the first mold mesa 906, the proximal mesa portion 906a, which has a larger area than the distal mesa portion 906b, contracts more than the distal mesa portion 906b. Furthermore, because the first mold mesa 906 is coupled to an underlying mold layer (a first sacrificial layer 961 shown in FIGS. 9B-9D), the ability of the mold material at the bottom of the first mold mesa 906 to contract is constrained. Thus, the proximal mesa portion 906a contracts more at its top surface than at its bottom surface. This results in sidewalls of the proximal mesa portion 906a having a shallower angle with respect to the substrate than the sidewalls of the distal mesa portion 906b.

FIGS. 9B-9G show cross sectional views of the first mold mesa 906 along the axis B-B and C-C (shown in FIG. 9A). In particular, FIGS. 9B, 9D and 9F show cross sectional views of the proximal mesa portion 906a and FIGS. 9C, 9E and 9G show cross sectional views of the distal mesa portion 906b. FIGS. 9B and 9C show cross-sectional views of the proximal mesa portion 906a and the distal mesa portion 906b, respectively, after the mold 904 has been patterned and cured. The first mold mesa 906, including the distal mesa portion 906b and the proximal mesa portion 906a are formed over a first sacrificial layer 961 and a substrate 960. The first sacrificial layer 961 can be similar to the first sacrificial layer 861 discussed above in relation to shutter assembly 800 of FIG. 8B. As discussed above, the proximal mesa portion 906a forms a shallower angle with respect to the substrate than the distal mesa portion 906b. This is shown in FIGS. 9B and 9C, where the sidewalls of the proximal mesa portion 906a form a shallower angle with respect to the substrate as compared to the angle formed by the sidewalls of the distal mesa portion 906b. Subsequently, as shown in FIGS. 9D and 9E, a beam material 950 is deposited over the entire first mold mesa 906 using methods such as CVD, or PECVD. As a result, the beam material 950 is deposited over the sidewalls of both the proximal mesa portion 906a and the distal mesa portion 906b. After the deposition of the beam material 950, the beam material 950 is patterned to form the looped drive beam 907. Typically, an anisotropic etching process is used to pattern the beam material 950. Example anisotropic etching processes are discussed above in relation to FIG. 7C. The anisotropic etching process etches the beam material 950 in a direction that is substantially normal to the substrate. As the beam material 950 along the sidewall of the proximal mesa portion 906a is at a shallower angle with respect to the substrate (as shown in FIG. 9D) than that of the beam material 950 along the sidewall of the distal mesa portion 906b (as shown in FIG. 9E), the beam material along the proximal mesa portion 906a would be etched to a larger extent. As a result, as shown in FIGS. 9F and 9G, the thicknesses of the shallow-angled segment 902 and the first portion 914 formed on the proximal mesa portion 906a are less than the thicknesses of the first portion 914 and the second portion 916 formed over the distal mesa portion 906b.

FIG. 9H shows the shutter assembly 900 after being released from the mold 904. In particular, FIG. 9H shows how the shallow-angled segment 902 of the looped drive beam 907 causes the looped drive beam 907 to bend closer to the load beam 909. This results in a tip-gap of TG4, which is less than the tip-gap TG3 shown in FIG. 9A. This reduction in the tip-gap provides a reduction in the actuation voltage needed to actuate the actuator 926.

In some implementations, the proximal mesa portion 906a can have curved or rounded corners as opposed to the relatively square corners shown in FIG. 9A. This will result in a curved or rounded shallow-angle segment in the second portion 916 of the looped drive beam 907.

In some implementations, the shutter assembly 900 can also include a generally U-shaped segment on the first portion 914 of the looped drive beam 907 similar to the U-shaped segment 828 on the first portion 814 of the looped drive beam 807 of the shutter assembly 800 shown in FIG. 8D. The U-shaped segment on the first portion 914 can reduce the stiffness of the first portion 914 and allow the looped drive beam 907 to bend even further towards the load beam 909, and reduce the tip-gap even further.

In some implementations, the spring beam 912 of the shutter assembly 900 may be replaced by a second actuator, opposing the actuator 926. In such implementations, shutter 910 can be operated to move between open and closed positions based on the combined action of the actuator 926 and the opposing second actuator. The second actuator can also include a looped drive beam and a load beam attached to the shutter 910. The looped drive beam of the second actuator can be formed on a mold mesa similar to the first mold mesa 906 over which the looped drive beam 907 is formed. Furthermore, the looped drive beam of the second actuator may also include a TGAF similar to the second TGAF 902 shown in FIG. 9A.

Figure 10A:
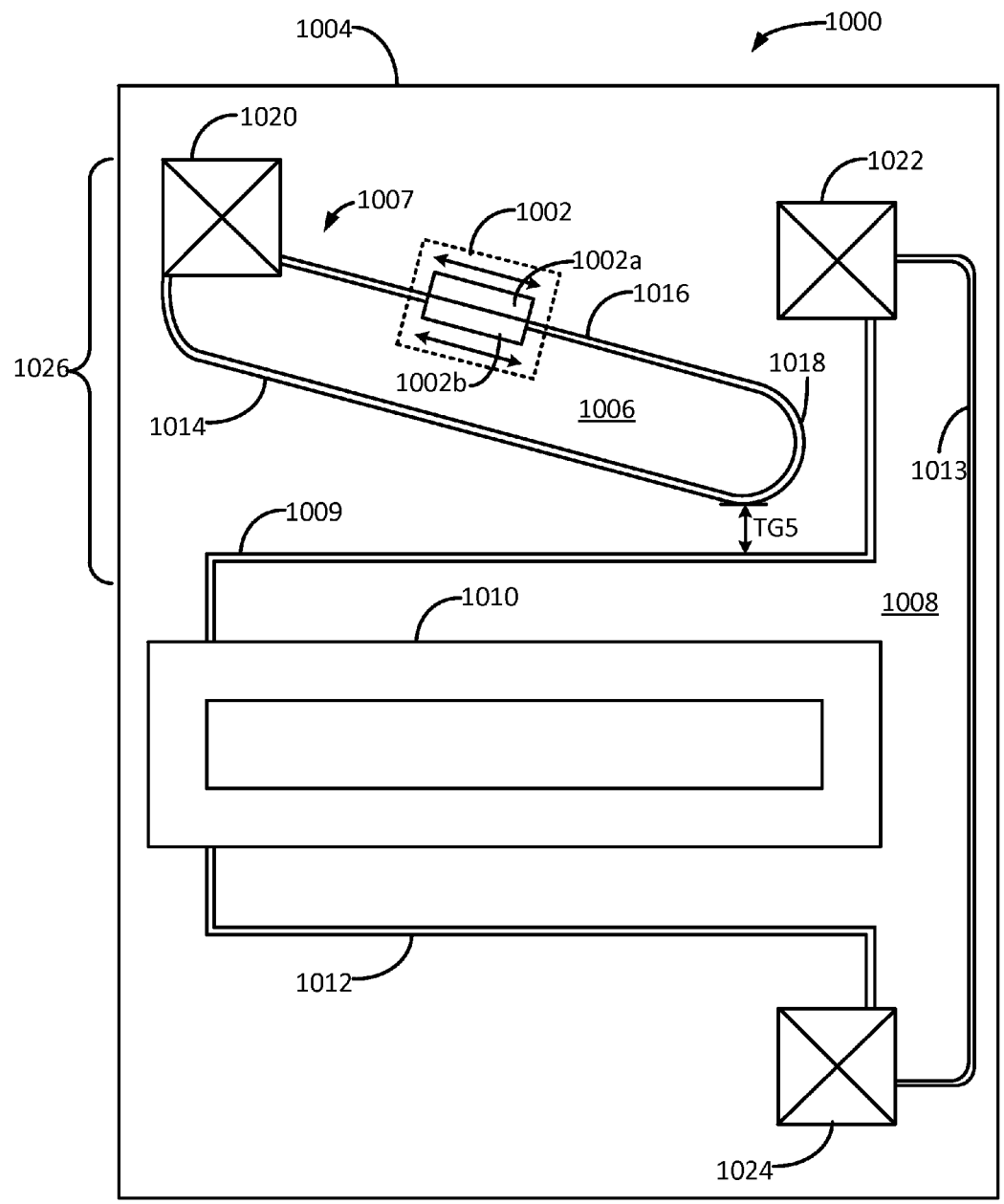
FIGS. 10A-10C show various views of an example shutter assembly having a third tip-gap adjustment feature.
Figure 10B:
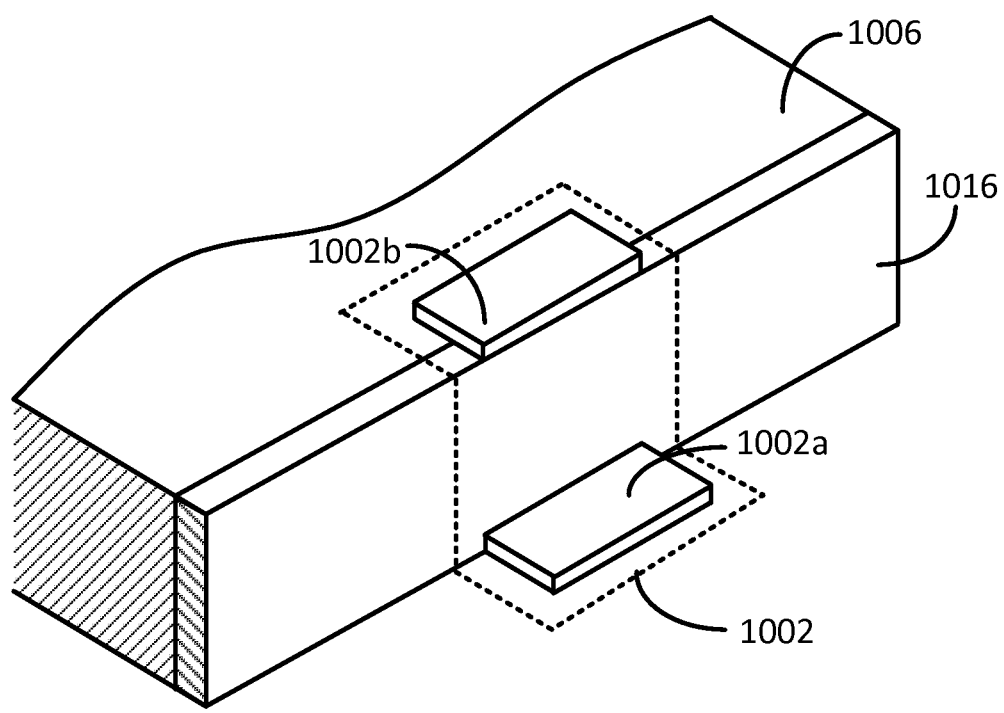
Figure 10C:
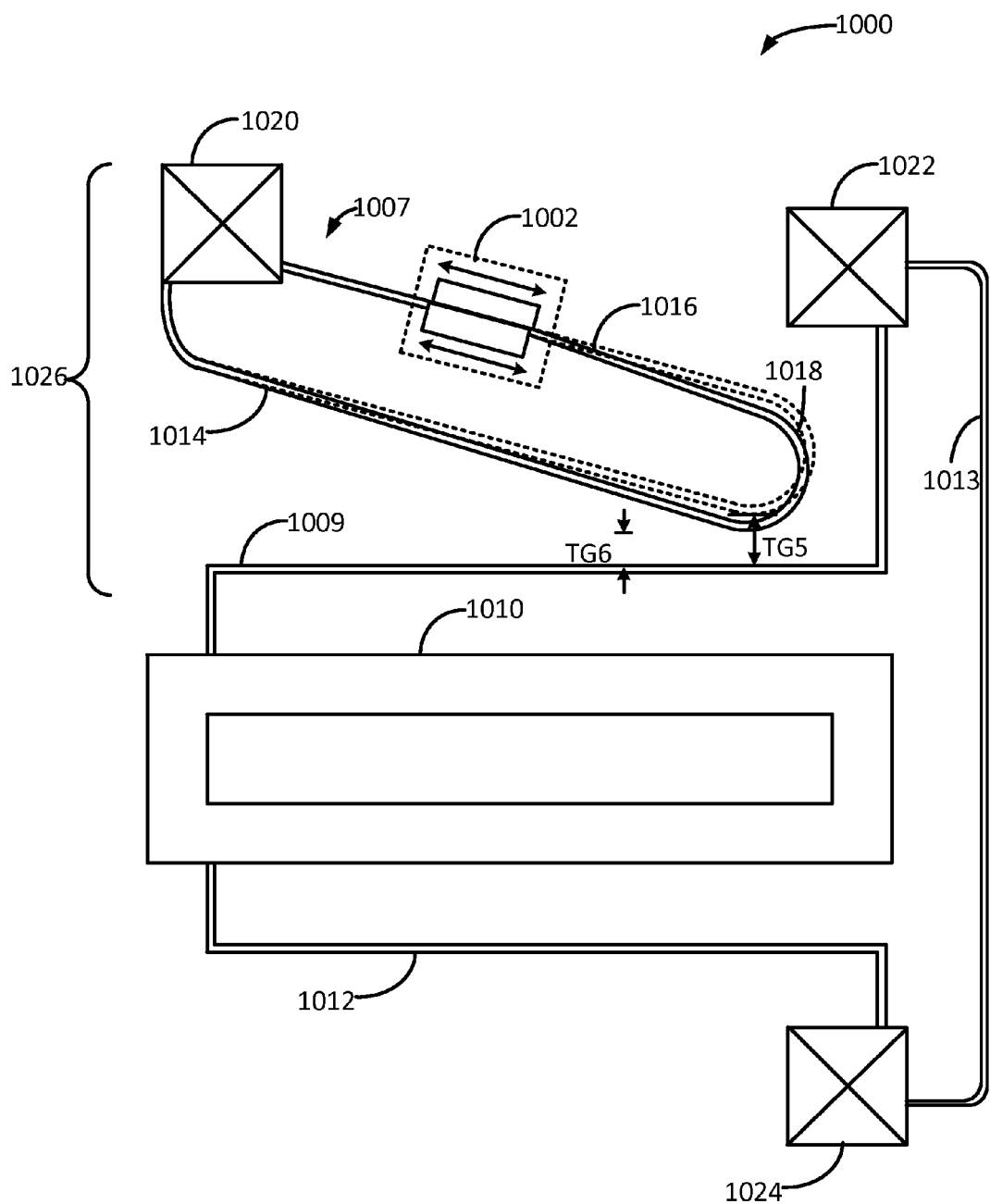

FIGS. 10A-10C show various views of an example shutter assembly 1000 having a third tip-gap adjustment feature (TGAF) 1002. In particular, FIG. 10A shows a top view of the shutter assembly 1000, FIG. 10B shows an isometric view of the third TGAF 1002, and FIG. 10C shows a top view of the shutter assembly 1000 after release, indicating a reduction in the tip-gap as a result of the third TGAF 1002.

The shutter assembly 1000 of FIG. 10A is similar to the shutter assemblies 800 and 900 shown in FIGS. 8A and 9A in that the shutter assembly 1000 is also formed using a sidewall beam process using a mold, such as the mold 1004. FIG. 10A shows the shutter assembly 1000 at a stage of manufacture that precedes the release of the shutter assembly 1000. That is, FIG. 10A shows a stage after the shutter or beam material has been patterned over the mold 1004. The shutter assembly 1000 includes an actuator 1026, which in turn includes a looped drive beam 1007 and a load beam 1009. The looped drive beam 1007 is coupled to a drive anchor 1020 and surrounds a first mold mesa 1006. The looped drive beam 1007 includes a first portion 1014, a second portion 1016 and a connecting portion 1018. The load beam 1009 has one end coupled to a load anchor 1022 and the other end coupled to a shutter 1010. The looped drive beam 1007 and the load beam 1009 have a tip-gap denoted by TG5.

The mold 1004 also includes a second mold mesa 1008 having sidewalls over which the load beam 1009, a spring beam 1012 and a peripheral beam 1013 are formed. The spring beam 1012 has one end coupled to the shutter 1010 and the other end coupled to the spring anchor 1024. The shutter 1010 is formed on the top surface of the second mold mesa 1008. The peripheral beam 1013 has one end coupled to the load anchor 1022 and the other end coupled to the spring anchor 1024. The peripheral beam 1013 serves the same purpose as the peripheral beams 813 and 913 shown in FIGS. 8A and 9A, respectively. In particular, the incorporation of the peripheral beam 1013 allows the shutter assembly to entirely enclose the second mold mesa 1008, thereby avoiding any need for separation of actuator components by using additional costly photolithography processes.

The looped drive beam 1007 includes the third TGAF 1002. In particular, the second portion 1016 of the looped drive beam 1007 includes a shelf structure 1002. The shelf structure includes a first shelf element 1002a and a second shelf element 1002b. As discussed below, the shelf elements 1002a and 1002b may have some amount of stress or stress gradient. In some implementations, the stress can be in the range of about +/−100 MPa to about +/−200 MPa. In some implementations, the stress gradient can be about +/−400 MPa/micron. This stress or stress gradient contributes to a bending of the looped drive beam 1007 towards the load beam 1008. This bending causes the tip-gap between the looped drive beam 1007 and the load beam 1008 to decrease, which in turn results in a decrease in the actuation voltage needed to operate the shutter assembly 1000.

FIG. 10B shows an isometric view of the shelf structure 1002. The second section 1016 of the looped derive beam 1007 is formed on a sidewall of the first mold section 1006. Both the first shelf element 1002a and the second shelf element 1002b are substantially flat structures that are substantially horizontal or parallel to the substrate on which the shutter assembly 1000 is built. The first shelf element 1002a is located at the base of the vertical surface of the second section 1016, while the second shelf element 1002b is located at the top of the vertical surface of the second section 1016. The shelf structure 1002 can be formed during patterning of the shutter and beam material deposited over the mold 904.

In some manufacturing processes, material that is deposited on a surface that is substantially parallel to an underlying substrate may develop mechanical stress or a stress gradient within the plane of the surface. Thus, the first and second shelf elements 1002a and 1002b, which are substantially parallel to the substrate on which the shutter assembly 1002 is built, can develop a stress or a stress gradient during their deposition. This stress or stress gradient may cause, upon release of the shutter assembly 1000, an expansion of the shelf elements 1002a and 1002b in a direction that is parallel to the substrate. This expansion of the shelf elements 1002a and 1002b may cause bending in the looped drive beam 1007, forcing the tip 1018 closer to the load beam 1009.

FIG. 10C shows a top view of the shutter assembly 1000 of FIG. 10A after the shutter assembly has been released. That is, the mold 1004 including the first mold mesa 1006 and the second mold mesa 1008 is removed. After the shutter assembly 1000 is released, the stress or stress gradients in the shelf structure 1002 can bend the looped drive beam 1007 towards the load beam 1009. Due to the bending of the looped drive beam 1007, the tip-gap is reduced, as indicated by TG6. As seen in FIG. 10C, TG6 is less than TG5—the tip-gap that a looped drive beam would have without any tip-gap adjustment.

In some implementations, the second portion 1016 of the looped drive beam 1007 can include only one, instead of two, shelf elements. In some other implementations, the second portion 1016 of the looped drive beam 1007 can include more than two shelf elements. In some implementations, the second portion 1016 of the looped drive beam 1007 can include more than one shelf structures 1002, each having one or more shelf elements.

In some implementations, the shutter assembly 1000 can also include a generally U-shaped segment on the first portion 1014 of the looped drive beam 1007 similar to the U-shaped segment 828 on the first portion 814 of the looped drive beam 807 of the shutter assembly 800 shown in FIG. 8D. The U-shaped segment on the first portion 1014 can reduce the stiffness of the first portion 1014 and allow the looped drive beam 1007 to bend even further towards the load beam 1009, and reduce the tip-gap TG6 even further.

In some implementations, the spring beam 1012 of the shutter assembly 1000 may be replaced by a second actuator, opposing the actuator 1026. In such implementations, shutter 1010 can be operated to move between an open and closed position based on the combined action of the actuator 1026 and the opposing second actuator. The second actuator can also include a looped drive beam and a load beam attached to the shutter 1010. The looped drive beam of the second actuator can be formed on a mold mesa similar to the first mold mesa 1006 over which the looped drive beam 1007 is formed. Furthermore, the looped drive beam of the second actuator may also include a TGAF similar to the third TGAF 1002 shown in FIG. 10A.

In some implementations, a drive beam of a shutter assembly may include a combination of two or more of the first TGAF 802 (as shown in FIG. 8A), the second TGAF 902 (as shown in FIG. 9A), the third TGAF 1002 (as shown in FIG. 10A) and the U-shaped segment 828 (as shown in FIG. 8D).

Figure 11:
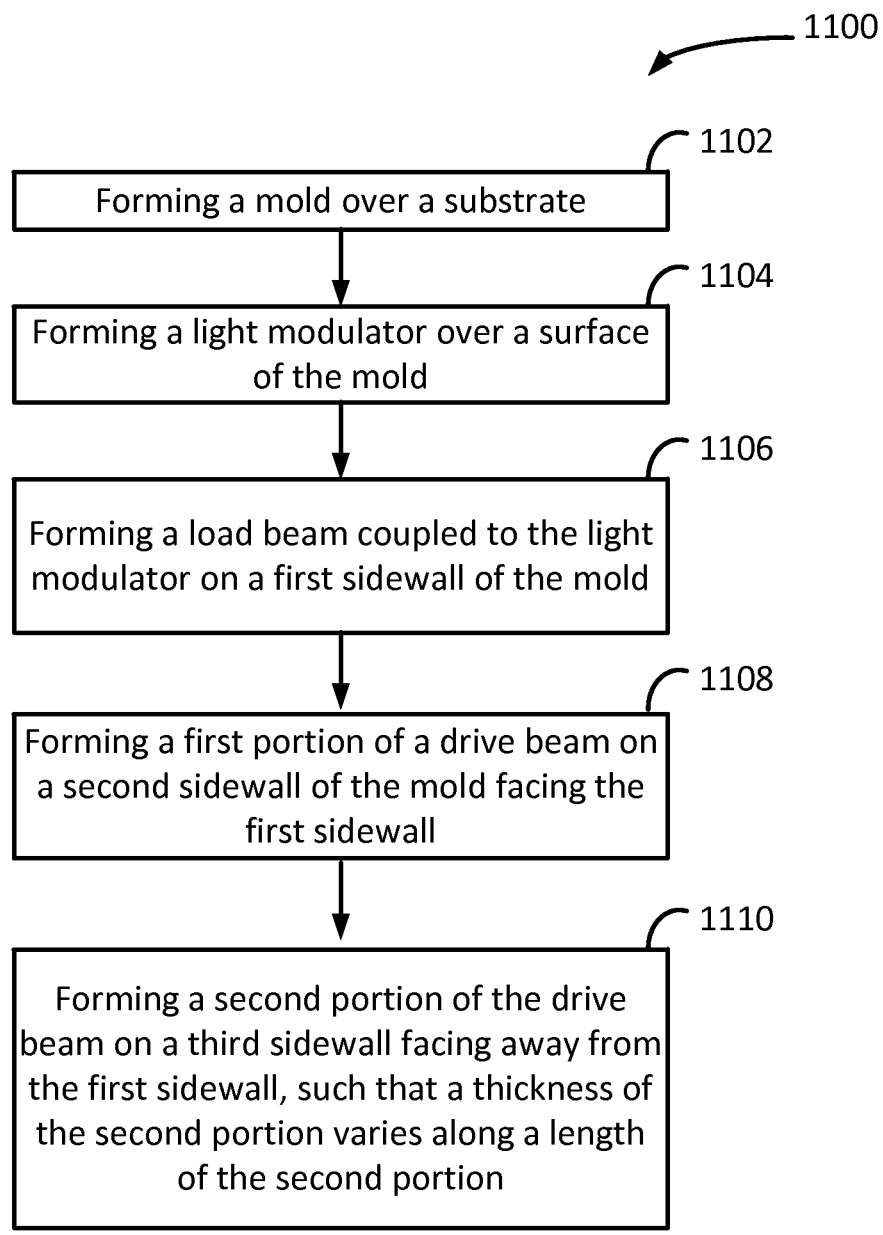
FIG. 11 shows a flow diagram of an example process for forming a shutter assembly with tip-gap adjustment feature.

FIG. 11 shows a flow diagram of an example process 1100 for forming a shutter assembly with tip-gap adjustment feature. In particular, the process 1100 includes forming a mold over a substrate (stage 1102), forming a light modulator over a surface of the mold (stage 1104), forming a load beam coupled to the light modulator on a first sidewall of the mold (stage 1106), forming a first portion of a looped drive beam on a second sidewall of the mold facing the first sidewall (stage 1108), and forming a second portion of the drive beam on a third sidewall facing away from the first sidewall such that a thickness of the second portion varies along a length of the second portion (stage 1110).

The process 1100 begins with forming a mold on a substrate (stage 1102). Forming a mold on the substrate includes depositing and patterning a sacrificial material over the substrate. One example of this process stage (stage 1102) is discussed above with respect to FIGS. 8A and 8B, in which layers of sacrificial material are deposited over a substrate 860. The layers of sacrificial material are then patterned to form the first mold mesa 806 and the second mold mesa 808. Another example of this process stage (stage 1102) is discussed above in relation to FIGS. 9A and 9B, in which layers of sacrificial layers are deposited over a substrate 960. The layers of sacrificial material are then patterned to form the first mold mesa 906 and the second mold mesa 908.

The process 1100 also includes forming a light modulator over the mold (stage 1104). An example of a light modulator formed over a mold is shown in FIG. 8A, in which the shutter 810 is formed over the top surface of the second mold mesa 808. The process 1100 also includes forming a load beam coupled to the light modulator on a first sidewall of the mold (stage 1106). This, for example, is also shown in FIG. 8A, discussed above. More particularly, FIG. 8A shows the load beam 809 formed on a sidewall of the second mold mesa 808. The load beam is also coupled to the shutter 810. Another example, of the light modulator formed over the mold and of a load beam formed on a first sidewall (stages 1104 and 1106) is discussed above in relation to FIG. 9A. As shown in FIG. 9A, the shutter 910 and the load beam 909 are formed over the top surface and the sidewalls, respectively, of the second mold mesa 908. FIG. 9A also shows that the load beam 909 is coupled to the shutter 910.

Furthermore, the process 1100 includes forming a first portion of a drive beam on a second sidewall of the mold facing the first sidewall (stage 1108). Examples of this process stage (stage 1108) are shown in FIGS. 8A and 9A. In FIG. 8A, the first portion 814 of the looped drive beam 807 is formed on a sidewall of the first mold mesa 806. The sidewall on which the first portion 814 is formed faces the sidewall on which the load beam 809 is formed. Similarly, FIG. 9A shows the first portion 914 of the looped drive beam 907 formed on a sidewall of the first mold mesa 906 that faces the sidewall on which the load beam 909 is formed.

Finally, the process 1100 includes forming a second portion of the drive beam on a third sidewall facing away from the first sidewall such that a thickness of the second portion varies along a length of the second portion (stage 1110). An example of this processing stage (stage 1110) is shown in FIG. 8A.

More particularly, FIG. 8A shows the second portion 816 of the looped drive beam 807 formed on a sidewall of the first mold mesa 806 that faces away from the sidewall on the second mold mesa 808 on which the load beam 809 is formed. Furthermore, the second portion 816 of the looped drive beam 807 includes a first TGAF 802, in which the thickness of the looped drive beam 807 is less than the thickness of the remainder of the second portion 816 of the looped drive beam 807. As discussed above in relation to FIG. 8A, the TGAF 802 includes U-shaped beam regions 816a formed over sidewalls of a number of projections 806a extending out from the first mold mesa 806, having narrow channels between them. The U-shaped beam regions 816a formed within these narrow channels are thinner than the remainder of the second portion 816 of the looped drive beam 807, as shown in FIG. 8B. Another example of this processing stage (stage 1110) is shown in FIG. 9A, in which the second portion 916 of the looped drive beam 907 is formed on a sidewall of the first mold mesa 906 that faces away from the sidewall on the second mold mesa 908 on which the load beam 909 is formed. Furthermore, the second portion 916 of the looped drive beam 907 includes the shallow-angled segment 902, which is thinner than the remainder of the second portion 916. As discussed above in relation to FIG. 9A, the shallow-angled segment 902 is formed over the proximal mesa portion 906a of the first mold mesa 906. When the sidewalls of the proximal mesa portion 906a are cured, before the deposition of the beam material, these sidewalls can form a shallower angle with respect to the substrate than the sidewalls of the distal mesa portion 906b, as shown in FIGS. 9B and 9C. Anisotropically etching beam material deposited on these shallower angled sidewalls results in a thinner shallow-angled segment 902, as shown in FIG. 9F.

Figure 12A:
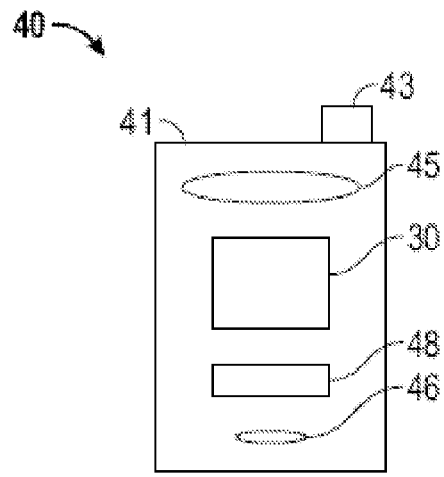
FIGS. 12A and 12B show example system block diagrams illustrating a display device that includes a set of display elements.
Figure 12B:
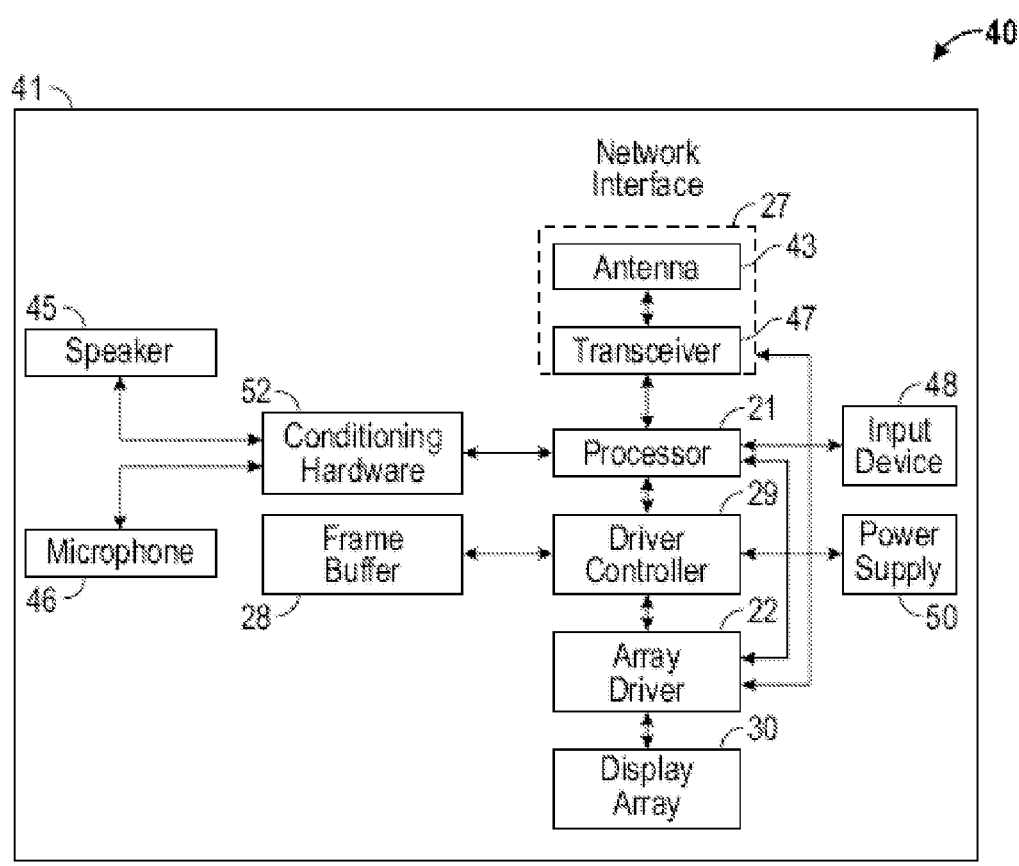

FIGS. 12A and 12B are system block diagrams illustrating a display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 12A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 12A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HS-DPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. A display apparatus, comprising:
a substrate;
an electromechanical systems (EMS) electrostatic actuator mechanically coupled to the substrate and configured to move a light modulator in a direction parallel to a surface of the substrate, the actuator comprising:
a load beam electrode having a first end mechanically coupled to the light modulator and a second end mechanically coupled to a load beam anchor, the load beam anchor mechanically coupled to the substrate; and
a drive beam electrode having:
a first portion positioned adjacent to the load beam, a first end of the first portion mechanically coupled to a drive beam anchor, the drive beam anchor mechanically coupled to the substrate;
a second portion positioned behind the first portion with respect to the load beam, a first end of the second portion mechanically coupled to the drive beam anchor; and
an end portion connecting a second end of the first portion to a second end of the second portion, wherein the second portion has a plurality of U-shaped segments defining a plurality of channels, wherein beam regions within the plurality of channels have a thickness, measured in a direction parallel to the surface of the substrate, that is less than the thickness of outer beam regions formed outside of the channels, and wherein the channels have a width between 3 and 6 microns.

2. The apparatus of claim 1, wherein the first portion of the drive beam electrode includes a second generally U-shaped segment, having relatively smaller dimensions than a first U-shaped segment of the plurality of U-shaped segments.

3. The apparatus of claim 1, wherein the first portion, the end portion, and the second portion of the drive beam form a loop.

4. The apparatus of claim 1, further comprising:
a display;
a processor that is configured to communicate with the display, the processor being configured to process image data; and
a memory device that is configured to communicate with the processor.

5. The apparatus of claim 4, further comprising:
a driver circuit configured to send at least one signal to the display; and
a controller configured to send at least a portion of the image data to the driver circuit.

6. The apparatus of claim 4, further comprising:
an image source module configured to send the image data to the processor, wherein the image source module comprises at least one of a receiver, transceiver, and transmitter.

7. The apparatus of claim 4, further comprising:
an input device configured to receive input data and to communicate the input data to the processor.

8. A display element, comprising:
a substrate;
an electromechanical systems (EMS) electrostatic actuator coupled to the substrate comprising:
a load beam electrode coupled to a light modulator; and
a drive beam electrode coupled to the substrate having:
a first portion positioned adjacent to the load beam electrode,
a second portion positioned behind the first portion with respect to the load beam electrode,
an end portion connecting the first portion to the second portion, and
a shelf structure separate from an anchor supporting the drive beam over the substrate, the shelf structure positioned along and mechanically coupled to the second portion of the drive beam and having a first planar surface that is substantially parallel to the substrate.

9. The display element of claim 8, wherein the first planar surface is positioned on a side of the second portion of the drive beam that is substantially normal to the substrate.

10. The display element of claim 8, wherein the first planar surface in positioned on an edge of the second portion of the drive beam that faces away from the substrate.

11. The display element of claim 8, wherein the shelf structure includes a second planar surface that is substantially parallel to the substrate and coupled to the second portion of the drive beam, the second planar surface positioned along and mechanically coupled to the second portion of the drive beam.

12. The display element of claim 11, wherein the first planar surface and the second planar surface are positioned on opposite ends of a side of the second portion that is substantially normal in relation to the substrate.

13. The display element of claim 8, wherein the shelf structure is physically separated from the first portion of the drive beam.

14. The display element of claim 8, wherein the first portion, the end portion, and the second portion of the drive beam form a loop.

\* \* \* \* \*